(12) United States Patent
Rafferty et al.

(10) Patent No.: US 9,171,794 B2
(45) Date of Patent: Oct. 27, 2015

(54) EMBEDDING THIN CHIPS IN POLYMER

(71) Applicant: MC10, Inc., Cambridge, MA (US)

(72) Inventors: Conor Rafferty, Newton, MA (US); Mitul Dalal, Grafton, MA (US)

(73) Assignee: MC10, Inc., Lexington, MA (US)

( * ) Notice: Subject to any disclaimer, the term of this patent is extended or adjusted under 35 U.S.C. 154(b) by 0 days.

(21) Appl. No.: 13/844,638

(22) Filed: Mar. 15, 2013

(65) Prior Publication Data
US 2014/0110859 A1    Apr. 24, 2014

Related U.S. Application Data

(60) Provisional application No. 61/711,629, filed on Oct. 9, 2012.

(51) Int. Cl.
*H01L 23/02* (2006.01)
*H01L 23/498* (2006.01)
(Continued)

(52) U.S. Cl.
CPC ............ *H01L 23/4985* (2013.01); *H01L 21/56* (2013.01); *H01L 23/16* (2013.01); *H01L 23/3121* (2013.01); *H01L 23/49822* (2013.01); *H01L 23/49827* (2013.01); *H01L 23/5389* (2013.01); *H01L 24/03* (2013.01); *H05K 1/189* (2013.01); *H01L 21/6836* (2013.01); *H01L 24/05* (2013.01); *H01L 24/29* (2013.01); *H01L 2221/68327* (2013.01); *H01L 2221/68381* (2013.01); *H01L 2224/02379* (2013.01);
(Continued)

(58) Field of Classification Search
CPC ...................... H01L 23/4985; H01L 23/49861; H01L 21/56; H01L 24/24; H01L 23/49822; H01L 23/49827; H01L 23/3121; H01L 2221/68381; H01L 2224/2919; H01L 2224/32225; H01L 2924/07802; H01L 2924/00; H01L 2924/0014; H05K 1/189
USPC ................... 257/678, 713, 774, 792, E23.065, 257/E23.177, 668, 723; 438/118, 27, 29, 438/106, 107, 113, 127
See application file for complete search history.

(56) References Cited

U.S. PATENT DOCUMENTS

| 3,716,861 A | 2/1973 | Root |
| 3,805,427 A | 4/1974 | Epstein |

(Continued)

FOREIGN PATENT DOCUMENTS

| CN | 1222758 | 7/1999 |
| CN | 1454045 | 11/2003 |

(Continued)

OTHER PUBLICATIONS

Abbaschian et al. (Dec. 2005) "High Pressure-High Temperature Growth of Diamond Crystals Using Split Sphere Apparatus," *Diamond Relat. Mater.* 14(11-12):1916-1919.

(Continued)

*Primary Examiner* — Yosef Gebreyesus
(74) *Attorney, Agent, or Firm* — Nixon Peabody LLP

(57) ABSTRACT

Systems and methods are provided for the embedding of thin chips. A well region is generated in a substrate that includes a conductive material disposed on a flexible polymer. The standoff well region can be generated by pattern the conductive material, where the thin chip is embedded in the standoff well region. A cavity can be generated in the polymer layer to form a polymer well region, where the thin chip is embedded in the polymer well region.

56 Claims, 12 Drawing Sheets

(51) Int. Cl.
*H01L 23/538* (2006.01)
*H01L 23/31* (2006.01)
*H01L 23/16* (2006.01)
*H01L 21/56* (2006.01)
*H01L 23/00* (2006.01)
*H01L 21/683* (2006.01)
*H05K 1/02* (2006.01)
*H05K 1/18* (2006.01)

(52) U.S. Cl.
CPC . *H01L2224/036* (2013.01); *H01L 2224/03436* (2013.01); *H01L 2224/0401* (2013.01); *H01L 2224/04105* (2013.01); *H01L 2224/05144* (2013.01); *H01L 2224/05155* (2013.01); *H01L 2224/05166* (2013.01); *H01L 2224/05171* (2013.01); *H01L 2224/05184* (2013.01); *H01L 2224/05548* (2013.01); *H01L 2224/293* (2013.01); *H01L 2224/2919* (2013.01); *H01L 2224/2929* (2013.01); *H01L 2224/32225* (2013.01); *H01L 2224/82039* (2013.01); *H01L 2924/07802* (2013.01); *H05K 1/0283* (2013.01); *H05K 1/185* (2013.01); *H05K 2203/1469* (2013.01)

(56) References Cited

U.S. PATENT DOCUMENTS

| | | | |
|---|---|---|---|
| 3,949,410 | A | 4/1976 | Bassous |
| 4,058,418 | A | 11/1977 | Lindmayer |
| 4,392,451 | A | 7/1983 | Mickelsen et al. |
| 4,416,288 | A | 11/1983 | Freeman |
| 4,471,003 | A | 9/1984 | Cann |
| 4,487,162 | A | 12/1984 | Cann |
| 4,658,153 | A | 4/1987 | Brosh et al. |
| 4,663,828 | A | 5/1987 | Hanak |
| 4,761,335 | A | 8/1988 | Aurichio et al. |
| 4,766,670 | A | 8/1988 | Gazdik et al. |
| 4,784,720 | A | 11/1988 | Douglas |
| 4,855,017 | A | 8/1989 | Douglas |
| 4,918,811 | A * | 4/1990 | Eichelberger et al. ......... 438/107 |
| 5,041,973 | A | 8/1991 | Lebron et al. |
| 5,086,785 | A | 2/1992 | Gentile et al. |
| 5,108,819 | A | 4/1992 | Heller et al. |
| 5,118,400 | A | 6/1992 | Wollam |
| 5,147,519 | A | 9/1992 | Legge |
| 5,178,957 | A | 1/1993 | Kolpe et al. |
| 5,204,144 | A | 4/1993 | Cann et al. |
| 5,250,903 | A | 10/1993 | Limuti |
| 5,306,917 | A | 4/1994 | Black et al. |
| 5,313,094 | A | 5/1994 | Beyer et al. |
| 5,331,966 | A | 7/1994 | Bennett et al. |
| 5,360,987 | A | 11/1994 | Shibib |
| 5,403,700 | A | 4/1995 | Heller et al. |
| 5,427,096 | A | 6/1995 | Bogusiewizet al. |
| 5,434,751 | A | 7/1995 | Cole, Jr. et al. |
| 5,439,575 | A | 8/1995 | Thornton et al. |
| 5,455,178 | A | 10/1995 | Fattnger |
| 5,469,845 | A | 11/1995 | Delonzor et al. |
| 5,477,088 | A | 12/1995 | Rockett et al. |
| 5,501,893 | A | 3/1996 | Laermer et al. |
| 5,525,815 | A | 6/1996 | Einset |
| 5,539,935 | A | 7/1996 | Rush, III |
| 5,545,291 | A | 8/1996 | Smith et al. |
| 5,549,108 | A | 8/1996 | Edwards et al. |
| 5,560,974 | A | 10/1996 | Langley |
| 5,567,975 | A | 10/1996 | Walsh et al. |
| 5,625,471 | A | 4/1997 | Smith |
| 5,648,148 | A | 7/1997 | Simpson |
| 5,687,737 | A | 11/1997 | Branham et al. |
| 5,691,245 | A | 11/1997 | Bakhit et al. |
| 5,746,207 | A | 5/1998 | McLaughlin |
| 5,753,529 | A | 5/1998 | Chang et al. |
| 5,757,081 | A | 5/1998 | Chang et al. |
| 5,767,578 | A | 6/1998 | Chang et al. |
| 5,772,905 | A | 6/1998 | Chou |
| 5,783,856 | A | 7/1998 | Smith et al. |
| 4,763,275 | A | 8/1998 | Carlin |
| 5,790,151 | A | 8/1998 | Mills |
| 5,811,790 | A | 9/1998 | Endo et al. |
| 5,817,008 | A | 10/1998 | Rafert et al. |
| 5,817,242 | A | 10/1998 | Biebuyck et al. |
| 5,824,186 | A | 10/1998 | Smith et al. |
| 5,837,546 | A | 11/1998 | Allen |
| 5,860,974 | A | 1/1999 | Abele |
| 5,871,443 | A | 2/1999 | Edwards et al. |
| 5,904,545 | A | 5/1999 | Smith et al. |
| 5,907,189 | A | 5/1999 | Mertol |
| 5,907,477 | A | 5/1999 | Tuttle et al. |
| 5,915,180 | A | 6/1999 | Hara et al. |
| 5,917,534 | A | 6/1999 | Rajeswaran |
| 5,919,155 | A | 7/1999 | Lattin |
| 5,928,001 | A | 7/1999 | Gillette et al. |
| 5,955,781 | A | 9/1999 | Joshi et al. |
| 5,968,839 | A | 10/1999 | Blatt |
| 5,976,683 | A | 11/1999 | Liehrr et al. |
| 5,978,972 | A | 11/1999 | Stewart et al. |
| 5,979,972 | A | 11/1999 | Stewart |
| 5,998,291 | A | 12/1999 | Bakhit et al. |
| 6,009,632 | A | 1/2000 | Douglas |
| 6,024,702 | A | 2/2000 | Iverson |
| 6,057,212 | A | 5/2000 | Cha et al. |
| 6,063,046 | A | 5/2000 | Allum |
| 6,080,608 | A | 6/2000 | Nowak |
| 6,097,984 | A | 8/2000 | Douglas |
| 6,121,110 | A | 9/2000 | Hong |
| 6,148,127 | A | 11/2000 | Adams et al. |
| 6,150,602 | A | 11/2000 | Campbell |
| 6,165,391 | A | 12/2000 | Vedamuttu |
| 6,165,885 | A | 12/2000 | Gaynes et al. |
| 6,171,730 | B1 | 1/2001 | Kuroda et al. |
| 6,181,551 | B1 | 1/2001 | Herman |
| 6,225,149 | B1 | 5/2001 | Gan et al. |
| 6,236,883 | B1 | 5/2001 | Ciaccio et al. |
| 6,239,980 | B1 * | 5/2001 | Fillion et al. .................. 361/760 |
| 6,265,326 | B1 | 7/2001 | Ueno |
| 6,274,508 | B1 | 8/2001 | Jacobsen et al. |
| 6,276,775 | B1 | 8/2001 | Schuilte |
| 6,277,712 | B1 | 8/2001 | Kang et al. |
| 6,281,038 | B1 | 8/2001 | Jacobsen et al. |
| 6,282,960 | B1 | 9/2001 | Samuels et al. |
| 6,284,418 | B1 | 9/2001 | Trantolo |
| 6,291,896 | B1 | 9/2001 | Smith |
| 6,301,500 | B1 | 10/2001 | Van Herk |
| 6,309,351 | B1 | 10/2001 | Kurnik |
| 6,316,278 | B1 | 11/2001 | Jacobsen et al. |
| 6,316,283 | B1 | 11/2001 | Saurer |
| 6,317,175 | B1 | 11/2001 | Salerno et al. |
| 6,322,895 | B1 | 11/2001 | Canham |
| 6,322,963 | B1 | 11/2001 | Bauer |
| 6,334,960 | B1 | 1/2002 | Willson et al. |
| 6,344,616 | B1 | 2/2002 | Yokokawa |
| 6,360,615 | B1 | 3/2002 | Smela |
| 6,380,729 | B1 | 4/2002 | Smith |
| 6,403,397 | B1 | 6/2002 | Katz |
| 6,403,944 | B1 | 6/2002 | MacKenzie |
| 6,413,790 | B1 | 7/2002 | Duthaler et al. |
| 6,414,783 | B2 | 7/2002 | Zavracky et al. |
| 6,417,025 | B1 | 7/2002 | Gengel |
| 6,420,266 | B1 | 7/2002 | Smith et al. |
| 6,433,401 | B1 | 8/2002 | Clark et al. |
| 6,451,191 | B1 | 9/2002 | Bentsen et al. |
| 6,459,418 | B1 | 10/2002 | Comiskey et al. |
| 6,468,638 | B2 | 10/2002 | Jacobsen et al. |
| 6,479,395 | B1 | 11/2002 | Smith et al. |
| 6,504,105 | B1 | 1/2003 | Acocella et al. |
| 6,517,995 | B1 | 2/2003 | Jacobson et al. |
| 6,518,168 | B1 | 2/2003 | Clem et al. |
| 6,527,964 | B1 | 3/2003 | Smith et al. |
| 6,555,408 | B1 | 4/2003 | Jacobsen et al. |
| 6,566,744 | B2 | 5/2003 | Gengel |
| 6,567,158 | B1 | 5/2003 | Falciai et al. |
| 6,580,151 | B2 | 6/2003 | Vandeputte et al. |

(56) References Cited

U.S. PATENT DOCUMENTS

| | | | |
|---|---|---|---|
| 6,586,338 B2 | 7/2003 | Smith et al. |
| 6,590,346 B1 | 7/2003 | Hadley et al. |
| 6,606,079 B1 | 8/2003 | Smith |
| 6,606,247 B2 | 8/2003 | Credelle et al. |
| 6,608,370 B1 | 8/2003 | Chen et al. |
| 6,613,979 B1 | 9/2003 | Miller et al. |
| 6,623,579 B1 | 9/2003 | Smith et al. |
| 6,639,578 B1 | 10/2003 | Comiskey et al. |
| 6,655,286 B2 | 12/2003 | Rogers |
| 6,657,289 B1 | 12/2003 | Craig et al. |
| 6,661,037 B2 | 12/2003 | Pan et al. |
| 6,665,044 B1 | 12/2003 | Jacobsen et al. |
| 6,665,187 B1* | 12/2003 | Alcoe et al. | 361/719 |
| 6,666,821 B2 | 12/2003 | Keimel |
| 6,667,548 B2 | 12/2003 | O'Connor et al. |
| 6,683,663 B1 | 1/2004 | Hadley et al. |
| 6,693,384 B1 | 2/2004 | Vicentini et al. |
| 6,706,402 B2 | 3/2004 | Rueckes et al. |
| 6,720,469 B1 | 4/2004 | Curtis et al. |
| 6,723,576 B2 | 4/2004 | Nozawa et al. |
| 6,730,990 B2 | 5/2004 | Kondo et al. |
| 6,731,353 B1 | 5/2004 | Credelle et al. |
| 6,743,982 B2 | 6/2004 | Biegelsen et al. |
| 6,762,510 B2 | 7/2004 | Fock et al. |
| 6,780,696 B1 | 8/2004 | Schatz |
| 6,784,450 B2 | 8/2004 | Pan et al. |
| 6,784,844 B1 | 8/2004 | Boakes et al. |
| 6,787,052 B1 | 9/2004 | Vaganov |
| 6,805,809 B2 | 10/2004 | Nuzzo et al. |
| 6,814,898 B1 | 11/2004 | Deeman et al. |
| 6,816,380 B2 | 11/2004 | Credelle et al. |
| 6,826,509 B2 | 11/2004 | Crisco, III et al. |
| 6,836,744 B1 | 12/2004 | Asphahani et al. |
| 6,844,673 B1 | 1/2005 | Bernkopf |
| 6,848,162 B2 | 2/2005 | Arneson et al. |
| 6,850,312 B2 | 2/2005 | Jacobsen et al. |
| 6,856,830 B2 | 2/2005 | He |
| 6,861,757 B2* | 3/2005 | Shimoto et al. | 257/773 |
| 6,863,219 B1 | 3/2005 | Jacobsen et al. |
| 6,864,435 B2 | 3/2005 | Hermanns et al. |
| 6,864,570 B2 | 3/2005 | Smith |
| 6,872,645 B2 | 3/2005 | Duan et al. |
| 6,878,871 B2 | 4/2005 | Scher et al. |
| 6,881,979 B2 | 4/2005 | Starikov et al. |
| 6,885,030 B2 | 4/2005 | Onozuka et al. |
| 6,887,450 B2 | 5/2005 | Chen et al. |
| 6,900,094 B2 | 5/2005 | Hammond et al. |
| 6,917,061 B2 | 7/2005 | Pan et al. |
| 6,936,181 B2 | 8/2005 | Bulthaup et al. |
| 6,938,783 B2* | 9/2005 | Chung | 211/41.18 |
| 6,949,199 B1 | 9/2005 | Gauzner et al. |
| 6,949,206 B2 | 9/2005 | Whitford |
| 6,950,220 B2 | 9/2005 | Abramson et al. |
| 6,965,160 B2* | 11/2005 | Cobbley et al. | 257/686 |
| 6,967,362 B2 | 11/2005 | Nam et al. |
| 6,984,934 B2 | 1/2006 | Moller et al. |
| 6,987,314 B1* | 1/2006 | Yoshida et al. | 257/698 |
| 6,989,285 B2 | 1/2006 | Ball |
| 7,029,951 B2 | 4/2006 | Chen et al. |
| 7,033,961 B1 | 4/2006 | Smart et al. |
| 7,054,784 B2 | 5/2006 | Flentov et al. |
| 7,067,903 B2 | 6/2006 | Tachibana et al. |
| 7,081,642 B2 | 7/2006 | Onozuka et al. |
| 7,116,318 B2 | 10/2006 | Amundson et al. |
| 7,132,313 B2 | 11/2006 | O'Connor et al. |
| 7,148,512 B2 | 12/2006 | Leu et al. |
| 7,158,277 B2 | 1/2007 | Berggren et al. |
| 7,169,546 B2 | 1/2007 | Suzuki et al. |
| 7,169,669 B2 | 1/2007 | Blakers et al. |
| 7,170,164 B2 | 1/2007 | Chen et al. |
| 7,186,624 B2 | 3/2007 | Welser et al. |
| 7,190,051 B2 | 3/2007 | Mech et al. |
| 7,195,733 B2 | 3/2007 | Rogers et al. |
| 7,223,609 B2 | 5/2007 | Anvar et al. |
| 7,223,632 B2 | 5/2007 | Onozuka et al. |
| 7,252,664 B2 | 8/2007 | Nasab et al. |
| 7,253,442 B2 | 8/2007 | Huang et al. |
| 7,255,919 B2 | 8/2007 | Sakata et al. |
| 7,265,298 B2 | 9/2007 | Maghribi |
| 7,291,146 B2 | 11/2007 | Steinke et al. |
| 7,291,540 B2 | 11/2007 | Mech et al. |
| 7,293,353 B2 | 11/2007 | Matsuda |
| 7,302,751 B2 | 12/2007 | Hamburgen |
| 7,337,012 B2 | 2/2008 | Maghribi |
| 7,374,968 B2 | 5/2008 | Kornilovich et al. |
| 7,425,523 B2 | 9/2008 | Ikemizu et al. |
| 7,487,587 B2 | 2/2009 | Vanfleteren |
| 7,491,892 B2 | 2/2009 | Wagner |
| 7,509,835 B2 | 3/2009 | Beck |
| 7,521,292 B2* | 4/2009 | Rogers et al. | 438/118 |
| 7,525,304 B1 | 4/2009 | Feng et al. |
| 7,526,389 B2 | 4/2009 | Greenwald et al. |
| 7,557,367 B2 | 7/2009 | Rodgers |
| 7,593,086 B2 | 9/2009 | Jeong et al. |
| 7,618,260 B2 | 11/2009 | Daniel et al. |
| 7,622,367 B1 | 11/2009 | Nuzzo |
| 7,629,691 B2 | 12/2009 | Roush et al. |
| 7,633,761 B2 | 12/2009 | Kim |
| 7,635,755 B2 | 12/2009 | Kaplan et al. |
| 7,651,891 B1* | 1/2010 | Nguyen | 438/127 |
| 7,674,882 B2 | 3/2010 | Kaplan et al. |
| 7,700,402 B2 | 4/2010 | Wild et al. |
| 7,704,684 B2 | 4/2010 | Rogers et al. |
| 7,705,280 B2 | 4/2010 | Nuzzo et al. |
| 7,709,961 B2 | 5/2010 | Greenberg et al. |
| 7,727,199 B2 | 6/2010 | Fernandes et al. |
| 7,727,575 B2 | 6/2010 | Kaplan et al. |
| 7,742,795 B2 | 6/2010 | Stone et al. |
| 7,759,167 B2 | 7/2010 | Vanfleteren |
| 7,769,472 B2 | 8/2010 | Gerber |
| 7,799,699 B2 | 9/2010 | Nuzzo et al. |
| 7,838,964 B2 | 11/2010 | Carobolante et al. |
| 7,842,780 B2 | 11/2010 | Kaplan et al. |
| 7,857,781 B2 | 12/2010 | Noda et al. |
| 7,871,661 B2 | 1/2011 | Maghribi et al. |
| 7,884,540 B2 | 2/2011 | Sung et al. |
| 7,909,971 B2 | 3/2011 | Nuzzo et al. |
| 7,932,123 B2 | 4/2011 | Rogers et al. |
| 7,935,056 B2 | 5/2011 | Zbdelick |
| 7,943,491 B2 | 5/2011 | Nuzzo et al. |
| 7,960,246 B2 | 6/2011 | Flamand |
| 7,972,875 B2 | 7/2011 | Rogers et al. |
| 7,982,296 B2 | 7/2011 | Nuzzo |
| 8,039,847 B2 | 10/2011 | Nuzzo et al. |
| 8,097,926 B2 | 1/2012 | De Graff |
| 8,107,248 B2 | 1/2012 | Shin et al. |
| 8,198,621 B2 | 6/2012 | Rogers |
| 8,207,473 B2 | 6/2012 | Axisa |
| 8,217,381 B2 | 7/2012 | Rodgers |
| 8,252,191 B2 | 8/2012 | Heejoon et al. |
| 8,337,656 B2* | 12/2012 | Nishio et al. | 156/247 |
| 8,367,035 B2 | 2/2013 | Rogers et al. |
| 8,372,726 B2 | 2/2013 | De Graff |
| 8,389,862 B2 | 3/2013 | Arora |
| 8,394,706 B2 | 3/2013 | Nuzzo et al. |
| 8,431,828 B2 | 4/2013 | Vanfleteren |
| 8,440,546 B2 | 5/2013 | Nuzzo |
| 8,520,399 B2* | 8/2013 | Daniel | 361/760 |
| 8,536,667 B2 | 9/2013 | De Graff |
| 8,552,299 B2 | 10/2013 | Rodgers |
| 8,664,699 B2 | 3/2014 | Nuzzo |
| 8,679,888 B2 | 3/2014 | Rodgers |
| 8,729,524 B2 | 5/2014 | Rodgers |
| 8,754,396 B2 | 6/2014 | Rogers |
| 8,865,489 B2 | 10/2014 | Rodgers |
| 8,886,334 B2 | 11/2014 | Ghaffari |
| 8,905,772 B2 | 12/2014 | Rodgers |
| 9,012,784 B2 | 4/2015 | Arora |
| 2001/0003043 A1 | 6/2001 | Metspalu et al. |
| 2001/0012918 A1 | 8/2001 | Swanson |
| 2001/0021867 A1 | 9/2001 | Kordis |
| 2002/0021445 A1 | 2/2002 | Boxhevolnyi et al. |
| 2002/0026127 A1 | 2/2002 | Balbierz et al. |
| 2002/0082515 A1 | 6/2002 | Campbell et al. |

(56) References Cited

U.S. PATENT DOCUMENTS

| | | |
|---|---|---|
| 2002/0094701 A1 | 7/2002 | Biegelsen et al. |
| 2002/0095087 A1 | 7/2002 | Mourad et al. |
| 2002/0110766 A1 | 8/2002 | Tsai et al. |
| 2002/0113739 A1 | 8/2002 | Howard |
| 2002/0151934 A1 | 10/2002 | Levine |
| 2003/0006527 A1 | 1/2003 | Rabolt et al. |
| 2003/0017848 A1 | 1/2003 | Engstrom et al. |
| 2003/0032892 A1 | 2/2003 | Erlach et al. |
| 2003/0045025 A1* | 3/2003 | Coyle et al. ............... 438/106 |
| 2003/0082889 A1 | 5/2003 | Maruyama et al. |
| 2003/0087476 A1 | 5/2003 | Oohata et al. |
| 2003/0138704 A1 | 7/2003 | Mei et al. |
| 2003/0149456 A1 | 8/2003 | Rottenberg et al. |
| 2003/0171691 A1 | 9/2003 | Casscells et al. |
| 2003/0178316 A1 | 9/2003 | Jacobs et al. |
| 2003/0214408 A1 | 11/2003 | Grajales |
| 2003/0222282 A1 | 12/2003 | Fjelstad et al. |
| 2003/0227116 A1 | 12/2003 | Halik et al. |
| 2004/0005723 A1 | 1/2004 | Empedocles et al. |
| 2004/0006264 A1 | 1/2004 | Mojarradi et al. |
| 2004/0026684 A1 | 2/2004 | Empedocles et al. |
| 2004/0061543 A1 | 4/2004 | Nam et al. |
| 2004/0079464 A1 | 4/2004 | Kumakura |
| 2004/0081384 A1 | 4/2004 | Datesman et al. |
| 2004/0092806 A1 | 5/2004 | Sagon |
| 2004/0095658 A1 | 5/2004 | Buretea et al. |
| 2004/0106334 A1 | 6/2004 | Suzuki et al. |
| 2004/0112964 A1 | 6/2004 | Empedocles et al. |
| 2004/0135094 A1 | 7/2004 | Niigaki et al. |
| 2004/0136866 A1 | 7/2004 | Pontis et al. |
| 2004/0138558 A1 | 7/2004 | Dunki-Jacobs et al. |
| 2004/0146560 A1 | 7/2004 | Whiteford et al. |
| 2004/0149921 A1 | 8/2004 | Smyk |
| 2004/0155290 A1 | 8/2004 | Mech et al. |
| 2004/0171969 A1 | 9/2004 | Socci |
| 2004/0178390 A1 | 9/2004 | Whiteford |
| 2004/0178466 A1 | 9/2004 | Merrill et al. |
| 2004/0192062 A1 | 9/2004 | Mikelson |
| 2004/0192082 A1 | 9/2004 | Wagner et al. |
| 2004/0200734 A1 | 10/2004 | Co |
| 2004/0206448 A1 | 10/2004 | Dubrow |
| 2004/0211458 A1 | 10/2004 | Gui et al. |
| 2004/0211459 A1 | 10/2004 | Suenaga et al. |
| 2004/0229830 A1 | 11/2004 | Tachibana et al. |
| 2004/0239650 A1 | 12/2004 | Mackey |
| 2004/0243204 A1 | 12/2004 | Maghribi |
| 2004/0250950 A1 | 12/2004 | Dubrow |
| 2004/0252559 A1 | 12/2004 | Gupta |
| 2005/0020094 A1 | 1/2005 | Forbes et al. |
| 2005/0021103 A1 | 1/2005 | DiLorenzo |
| 2005/0037511 A1 | 2/2005 | Sharrock |
| 2005/0038498 A1 | 2/2005 | Dubrow et al. |
| 2005/0054939 A1 | 3/2005 | Ben-Ari et al. |
| 2005/0067293 A1 | 3/2005 | Naito |
| 2005/0082526 A1 | 4/2005 | Bedell et al. |
| 2005/0096513 A1 | 5/2005 | Ozguz |
| 2005/0113744 A1 | 5/2005 | Donoghue |
| 2005/0115308 A1 | 6/2005 | Koram et al. |
| 2005/0124712 A1 | 6/2005 | Anderson et al. |
| 2005/0133954 A1 | 6/2005 | Homola |
| 2005/0136501 A1 | 6/2005 | Kuriger |
| 2005/0171524 A1 | 8/2005 | Stern et al. |
| 2005/0177335 A1 | 8/2005 | Crisco |
| 2005/0203366 A1 | 9/2005 | Donoghue |
| 2005/0214962 A1 | 9/2005 | Daniels et al. |
| 2005/0215385 A1 | 9/2005 | Waters et al. |
| 2005/0227389 A1 | 10/2005 | Bhattacharya et al. |
| 2005/0233546 A1 | 10/2005 | Oohata et al. |
| 2005/0238967 A1 | 10/2005 | Rogers et al. |
| 2005/0255686 A1 | 11/2005 | Yamano et al. |
| 2005/0260706 A1 | 11/2005 | Kaplan et al. |
| 2005/0261561 A1 | 11/2005 | Jones et al. |
| 2006/0038182 A1 | 2/2006 | Rodgers |
| 2006/0049485 A1 | 3/2006 | Pan et al. |
| 2006/0056161 A1 | 3/2006 | Shin et al. |
| 2006/0068576 A1 | 3/2006 | Burdick, Jr. et al. |
| 2006/0076561 A1 | 4/2006 | Hicki et al. |
| 2006/0084012 A1 | 4/2006 | Nuzzo et al. |
| 2006/0084394 A1 | 4/2006 | Engstrom et al. |
| 2006/0085976 A1 | 4/2006 | Eldridge et al. |
| 2006/0102525 A1 | 5/2006 | Volkel et al. |
| 2006/0106321 A1 | 5/2006 | Lewinsky et al. |
| 2006/0119853 A1 | 6/2006 | Baumberg et al. |
| 2006/0127817 A1 | 6/2006 | Ramanujan et al. |
| 2006/0129056 A1 | 6/2006 | Leuthardt et al. |
| 2006/0134893 A1 | 6/2006 | Savage et al. |
| 2006/0154398 A1 | 7/2006 | Qing et al. |
| 2006/0159837 A1 | 7/2006 | Kaplan et al. |
| 2006/0169989 A1 | 8/2006 | Bhattacharya et al. |
| 2006/0173364 A1 | 8/2006 | Clancy et al. |
| 2006/0177479 A1 | 8/2006 | Giachelli et al. |
| 2006/0178655 A1 | 8/2006 | Santini et al. |
| 2006/0244105 A1 | 11/2006 | Forbes et al. |
| 2006/0255341 A1 | 11/2006 | Pinnington et al. |
| 2006/0264767 A1 | 11/2006 | Shennib |
| 2006/0273279 A1 | 12/2006 | Kaplan et al. |
| 2006/0279191 A1 | 12/2006 | Gehegan et al. |
| 2006/0286488 A1 | 12/2006 | Rogers et al. |
| 2006/0286785 A1 | 12/2006 | Rogers |
| 2006/0292756 A1* | 12/2006 | Primavera et al. ............ 438/149 |
| 2007/0009968 A1 | 1/2007 | Cunningham et al. |
| 2007/0027514 A1 | 2/2007 | Gerber |
| 2007/0031607 A1 | 2/2007 | Dubson et al. |
| 2007/0032089 A1 | 2/2007 | Nuzzo et al. |
| 2007/0043416 A1 | 2/2007 | Callas et al. |
| 2007/0058254 A1 | 3/2007 | Kim |
| 2007/0073130 A1 | 3/2007 | Finch et al. |
| 2007/0104944 A1 | 5/2007 | Laude et al. |
| 2007/0108389 A1 | 5/2007 | Makela et al. |
| 2007/0122819 A1 | 5/2007 | Wu |
| 2007/0123756 A1 | 5/2007 | Kitajima et al. |
| 2007/0187862 A1 | 8/2007 | Kaplan et al. |
| 2007/0212730 A1 | 9/2007 | Vepari et al. |
| 2007/0213616 A1 | 9/2007 | Anderson et al. |
| 2007/0227586 A1 | 10/2007 | Zapalac |
| 2007/0233208 A1 | 10/2007 | Kurtz et al. |
| 2007/0254468 A1 | 11/2007 | Burdick, Jr. et al. |
| 2008/0000871 A1 | 1/2008 | Suh et al. |
| 2008/0008626 A1 | 1/2008 | Lin et al. |
| 2008/0038236 A1 | 2/2008 | Gimble et al. |
| 2008/0041617 A1 | 2/2008 | Chen et al. |
| 2008/0046080 A1 | 2/2008 | Vanden Bulcke |
| 2008/0054875 A1 | 3/2008 | Saito |
| 2008/0055581 A1 | 3/2008 | Rogers et al. |
| 2008/0077225 A1 | 3/2008 | Carlin et al. |
| 2008/0085272 A1 | 4/2008 | Kaplan et al. |
| 2008/0090322 A1 | 4/2008 | Mech et al. |
| 2008/0102096 A1 | 5/2008 | Molin et al. |
| 2008/0108171 A1 | 5/2008 | Rogers et al. |
| 2008/0108942 A1 | 5/2008 | Brister et al. |
| 2008/0139894 A1 | 6/2008 | Szydlo-Moore et al. |
| 2008/0140152 A1 | 6/2008 | Imran |
| 2008/0152281 A1 | 6/2008 | Lundquist et al. |
| 2008/0157234 A1 | 7/2008 | Hong |
| 2008/0157235 A1 | 7/2008 | Rodgers |
| 2008/0183076 A1 | 7/2008 | Witte et al. |
| 2008/0188912 A1 | 8/2008 | Stone et al. |
| 2008/0193749 A1 | 8/2008 | Thompson et al. |
| 2008/0203268 A1 | 8/2008 | Hobbs et al. |
| 2008/0203431 A1 | 8/2008 | Garcia et al. |
| 2008/0204021 A1 | 8/2008 | Leussler et al. |
| 2008/0208628 A1 | 8/2008 | Bartic |
| 2008/0211087 A1* | 9/2008 | Mueller-Hipper et al. ... 257/704 |
| 2008/0212102 A1 | 9/2008 | Nuzzo et al. |
| 2008/0237840 A1 | 10/2008 | Alcoe |
| 2008/0239755 A1 | 10/2008 | Parker et al. |
| 2008/0249576 A1 | 10/2008 | Johnson et al. |
| 2008/0257586 A1 | 10/2008 | Chen et al. |
| 2008/0280360 A1 | 11/2008 | Kaplan et al. |
| 2008/0287167 A1 | 11/2008 | Caine |
| 2008/0288037 A1 | 11/2008 | Neysmith et al. |
| 2008/0293919 A1 | 11/2008 | Kaplan et al. |
| 2008/0313552 A1 | 12/2008 | Buehler et al. |
| 2009/0000377 A1 | 1/2009 | Shipps et al. |

(56) References Cited

U.S. PATENT DOCUMENTS

| | | |
|---|---|---|
| 2009/0001550 A1 | 1/2009 | Li et al. |
| 2009/0004737 A1 | 1/2009 | Borenstein et al. |
| 2009/0015560 A1 | 1/2009 | Robinson et al. |
| 2009/0028910 A1 | 1/2009 | Desimone et al. |
| 2009/0048556 A1 | 2/2009 | Durand |
| 2009/0054742 A1 | 2/2009 | Kaminska et al. |
| 2009/0088750 A1 | 4/2009 | Hushka et al. |
| 2009/0105605 A1 | 4/2009 | Abreau |
| 2009/0107704 A1 | 4/2009 | Vanfleteren |
| 2009/0149930 A1 | 6/2009 | Schecnk |
| 2009/0183986 A1 | 7/2009 | Johnson et al. |
| 2009/0184254 A1 | 7/2009 | Miura |
| 2009/0198293 A1 | 8/2009 | Cauller et al. |
| 2009/0199960 A1 | 8/2009 | Nuzzo et al. |
| 2009/0202614 A1 | 8/2009 | Kaplan et al. |
| 2009/0208555 A1 | 8/2009 | Kuttler et al. |
| 2009/0221896 A1 | 9/2009 | Rickert et al. |
| 2009/0232963 A1 | 9/2009 | Kaplan et al. |
| 2009/0234026 A1 | 9/2009 | Kaplan et al. |
| 2009/0247909 A1 | 10/2009 | Mukumoto |
| 2009/0261828 A1 | 10/2009 | Nordmeyer-Massner |
| 2009/0273909 A1 | 11/2009 | Shin et al. |
| 2009/0289246 A1 | 11/2009 | Schneider et al. |
| 2009/0294803 A1 | 12/2009 | Nuzzo |
| 2009/0317639 A1 | 12/2009 | Axisa et al. |
| 2009/0322480 A1 | 12/2009 | Benedict et al. |
| 2010/0002402 A1 | 1/2010 | Rodgers |
| 2010/0028451 A1 | 2/2010 | Kaplan et al. |
| 2010/0046902 A1 | 2/2010 | Kaplan et al. |
| 2010/0052112 A1 | 3/2010 | Rogers et al. |
| 2010/0055438 A1 | 3/2010 | Kaplan et al. |
| 2010/0059863 A1 | 3/2010 | Rogers |
| 2010/0063404 A1 | 3/2010 | Kaplan et al. |
| 2010/0065784 A1 | 3/2010 | Kaplan et al. |
| 2010/0068740 A1 | 3/2010 | Kaplan et al. |
| 2010/0070068 A1 | 3/2010 | Kaplan et al. |
| 2010/0072577 A1 | 3/2010 | Nuzzo |
| 2010/0073669 A1 | 3/2010 | Colvin, Jr. et al. |
| 2010/0087782 A1 | 4/2010 | Ghaffari |
| 2010/0090781 A1* | 4/2010 | Yamamoto et al. ............ 333/167 |
| 2010/0090824 A1 | 4/2010 | Rowell et al. |
| 2010/0096763 A1 | 4/2010 | Kaplan et al. |
| 2010/0116526 A1 | 5/2010 | Arora |
| 2010/0117660 A1 | 5/2010 | Douglas et al. |
| 2010/0120116 A1 | 5/2010 | Kaplan et al. |
| 2010/0121420 A1 | 5/2010 | Fiset et al. |
| 2010/0152629 A1 | 6/2010 | Kalpaxis et al. |
| 2010/0176705 A1 | 7/2010 | Van Herpen et al. |
| 2010/0178304 A1 | 7/2010 | Wang et al. |
| 2010/0178722 A1 | 7/2010 | De Graff |
| 2010/0188799 A1 | 7/2010 | Galvagni et al. |
| 2010/0191328 A1 | 7/2010 | Kaplan et al. |
| 2010/0196447 A1 | 8/2010 | Kaplan et al. |
| 2010/0200752 A1 | 8/2010 | Lee et al. |
| 2010/0203226 A1 | 8/2010 | Kaplan et al. |
| 2010/0245011 A1 | 9/2010 | Chatzopoulos et al. |
| 2010/0252840 A1 | 10/2010 | Ibbetson et al. |
| 2010/0271191 A1 | 10/2010 | De Graff |
| 2010/0279112 A1 | 11/2010 | Kaplan et al. |
| 2010/0283069 A1 | 11/2010 | Rogers et al. |
| 2010/0289124 A1 | 11/2010 | Nuzzo et al. |
| 2010/0298895 A1 | 11/2010 | Ghaffari |
| 2010/0317132 A1 | 12/2010 | Rodgers |
| 2010/0321161 A1 | 12/2010 | Isabell |
| 2010/0327387 A1 | 12/2010 | Kasai et al. |
| 2011/0011179 A1 | 1/2011 | Gustafsoon et al. |
| 2011/0018838 A1 | 1/2011 | Lee et al. |
| 2011/0034912 A1 | 2/2011 | De Graff |
| 2011/0051384 A1 | 3/2011 | Kriechbaum |
| 2011/0054583 A1 | 3/2011 | Litt |
| 2011/0068672 A1 | 3/2011 | Hasnain |
| 2011/0114894 A1 | 5/2011 | Choi et al. |
| 2011/0121822 A1 | 5/2011 | Parsche |
| 2011/0140897 A1 | 6/2011 | Purks et al. |
| 2011/0147715 A1 | 6/2011 | Rogers et al. |
| 2011/0170225 A1 | 7/2011 | Rogers et al. |
| 2011/0171813 A1 | 7/2011 | Rogers et al. |
| 2011/0177332 A1 | 7/2011 | Park et al. |
| 2011/0184320 A1 | 7/2011 | Shipps |
| 2011/0187798 A1 | 8/2011 | Rogers et al. |
| 2011/0215931 A1 | 9/2011 | Callsen |
| 2011/0218756 A1 | 9/2011 | Callsen |
| 2011/0218757 A1 | 9/2011 | Callsen |
| 2011/0220890 A1 | 9/2011 | Nuzzo |
| 2011/0230747 A1 | 9/2011 | Rogers et al. |
| 2011/0266561 A1 | 11/2011 | Rogers et al. |
| 2011/0272181 A1 | 11/2011 | Koo et al. |
| 2011/0277813 A1 | 11/2011 | Rodgers |
| 2011/0316120 A1 | 12/2011 | Rogers et al. |
| 2012/0016258 A1 | 1/2012 | Webster et al. |
| 2012/0051005 A1 | 3/2012 | Vanfleteren |
| 2012/0052268 A1 | 3/2012 | Axisa |
| 2012/0065937 A1 | 3/2012 | De Graff |
| 2012/0074546 A1 | 3/2012 | Chong |
| 2012/0083099 A1 | 4/2012 | Nuzzo et al. |
| 2012/0087216 A1 | 4/2012 | Keung et al. |
| 2012/0091594 A1* | 4/2012 | Landesberger et al. ....... 257/774 |
| 2012/0092178 A1 | 4/2012 | Callsen |
| 2012/0092222 A1 | 4/2012 | Kato et al. |
| 2012/0105528 A1 | 5/2012 | Alleyne |
| 2012/0108012 A1* | 5/2012 | Yasuda et al. ................. 438/113 |
| 2012/0157804 A1 | 6/2012 | Rodgers |
| 2012/0157986 A1 | 6/2012 | Stone et al. |
| 2012/0157987 A1 | 6/2012 | Steinke et al. |
| 2012/0157988 A1 | 6/2012 | Stone et al. |
| 2012/0157989 A1 | 6/2012 | Stone et al. |
| 2012/0158101 A1 | 6/2012 | Stone et al. |
| 2012/0165759 A1 | 6/2012 | Rogers et al. |
| 2012/0172697 A1 | 7/2012 | Urman |
| 2012/0226130 A1 | 9/2012 | De Graff |
| 2012/0244848 A1 | 9/2012 | Ghaffari |
| 2012/0251824 A1 | 10/2012 | Hur et al. |
| 2012/0256308 A1 | 10/2012 | Helin |
| 2012/0279762 A1 | 11/2012 | Hur et al. |
| 2012/0316455 A1 | 12/2012 | Rahman et al. |
| 2012/0320581 A1 | 12/2012 | Rogers et al. |
| 2012/0327608 A1 | 12/2012 | Rodgers |
| 2013/0036928 A1 | 2/2013 | Rogers et al. |
| 2013/0041235 A1 | 2/2013 | Rodgers |
| 2013/0099358 A1 | 4/2013 | Elolampi |
| 2013/0100618 A1 | 4/2013 | Rogers |
| 2013/0118255 A1 | 5/2013 | Callsen |
| 2013/0150693 A1 | 6/2013 | D'angelo |
| 2013/0185003 A1 | 7/2013 | Carbeck |
| 2013/0192356 A1 | 8/2013 | De Graff |
| 2013/0200268 A1 | 8/2013 | Rafferty |
| 2013/0225965 A1 | 8/2013 | Ghaffari |
| 2013/0245388 A1 | 9/2013 | Rafferty |
| 2013/0274562 A1 | 10/2013 | Ghaffari |
| 2013/0313713 A1 | 11/2013 | Arora |
| 2013/0316487 A1 | 11/2013 | De Graff |
| 2013/0320503 A1 | 12/2013 | Nuzzo |
| 2014/0001058 A1 | 1/2014 | Ghaffari |
| 2014/0012160 A1 | 1/2014 | Ghaffari |
| 2014/0012242 A1 | 1/2014 | Lee |
| 2014/0022746 A1 | 1/2014 | Hsu |
| 2014/0039290 A1 | 2/2014 | De Graff |
| 2014/0097944 A1 | 4/2014 | Fastert |
| 2014/0110859 A1 | 4/2014 | Rafferty |
| 2014/0140020 A1 | 5/2014 | Rodgers |
| 2014/0188426 A1 | 7/2014 | Fastert |
| 2014/0191236 A1 | 7/2014 | Nuzzo |
| 2014/0216524 A1 | 8/2014 | Rodgers |
| 2014/0240932 A1 | 8/2014 | Hsu |
| 2014/0249520 A1 | 9/2014 | Ghaffari |
| 2014/0303452 A1 | 10/2014 | Ghaffari |
| 2014/0340857 A1 | 11/2014 | Hsu |
| 2014/0374872 A1 | 12/2014 | Rodgers |
| 2014/0375465 A1 | 12/2014 | Fenuccio |
| 2015/0001462 A1 | 1/2015 | Rogers |
| 2015/0019135 A1 | 1/2015 | Kacyvenski |
| 2015/0035680 A1 | 2/2015 | Li |

(56) References Cited

U.S. PATENT DOCUMENTS

| | | | |
|---|---|---|---|
| 2015/0069617 | A1 | 3/2015 | Arora et al. |
| 2015/0099976 | A1 | 4/2015 | Ghaffari et al. |
| 2015/0100135 | A1 | 4/2015 | Ives |

FOREIGN PATENT DOCUMENTS

| | | |
|---|---|---|
| CN | 101772348 A | 7/2010 |
| DE | 4241045 C1 | 5/1994 |
| DE | 19748173 | 5/1999 |
| EP | 0929097 | 7/1999 |
| EP | 1357773 | 10/2003 |
| EP | 1 467 224 | 10/2004 |
| EP | 1 477 230 | 11/2004 |
| EP | 1 498 456 | 1/2005 |
| EP | 1 511 096 | 3/2005 |
| EP | 1 558 444 | 8/2005 |
| EP | 1 613 796 | 1/2006 |
| EP | 1746869 | 1/2007 |
| EP | 1 773 240 | 4/2007 |
| EP | 1 915 436 | 4/2008 |
| EP | 1 726 329 | 8/2009 |
| EP | 2 086 749 | 8/2009 |
| EP | 2 101 975 | 9/2009 |
| EP | 2 107 964 | 10/2009 |
| EP | 2 109 634 | 10/2009 |
| EP | 2 129 772 | 12/2009 |
| EP | 2 206 017 | 7/2010 |
| EP | 2 211 876 | 8/2010 |
| EP | 2 249 886 | 11/2010 |
| JP | 01-223064 | 9/1989 |
| JP | 2005126595 | 5/1993 |
| JP | 2006118441 | 4/1994 |
| JP | 2006-163365 | 6/1994 |
| JP | 2011-026344 | 1/1999 |
| JP | 2001332383 | 11/2001 |
| JP | 2001523631 | 11/2001 |
| JP | 2002092984 | 3/2002 |
| JP | 2003182475 | 7/2003 |
| JP | 2003289136 | 10/2003 |
| JP | 2003297974 | 10/2003 |
| JP | 2004506254 | 2/2004 |
| JP | 2005059800 | 3/2005 |
| JP | 2006-504450 | 2/2006 |
| JP | 2006044383 | 2/2006 |
| JP | 2006-186294 | 7/2006 |
| JP | 2007-515391 | 6/2007 |
| JP | 2008-502739 | 1/2008 |
| JP | 2008-531137 | 8/2008 |
| JP | 2010-508852 | 3/2010 |
| JP | 2010-509593 | 3/2010 |
| JP | 2010-509644 | 3/2010 |
| JP | 2010-509645 | 3/2010 |
| JP | 2010-522583 | 7/2010 |
| JP | 2010-529230 | 8/2010 |
| KR | 10-2007-0100617 | 10/2007 |
| KR | 10-2008-0069553 | 7/2008 |
| MY | P-020607 | 8/2012 |
| TW | 367570 | 8/1999 |
| TW | 494257 | 7/2002 |
| TW | 200836353 | 9/2008 |
| WO | WO 96/21245 | 7/1996 |
| WO | WO 98/49936 | 11/1998 |
| WO | WO 99/45860 | 9/1999 |
| WO | WO 00/46854 | 8/2000 |
| WO | WO 00/49421 | 8/2000 |
| WO | WO 00/49658 | 8/2000 |
| WO | WO 00/55915 | 9/2000 |
| WO | WO 00/55916 | 9/2000 |
| WO | WO 01/31082 | 5/2001 |
| WO | WO 01/33621 | 5/2001 |
| WO | WO 01/66833 | 9/2001 |
| WO | WO 01/98838 | 12/2001 |
| WO | WO 02/27701 | 4/2002 |
| WO | WO 02/43032 | 5/2002 |
| WO | WO 02/45143 | 6/2002 |
| WO | WO 02/45160 | 6/2002 |
| WO | WO 02/071137 | 9/2002 |
| WO | WO 02/073699 | 9/2002 |
| WO | WO 02/092778 | 11/2002 |
| WO | WO 02/097708 | 12/2002 |
| WO | WO 02/097724 | 12/2002 |
| WO | WO 03/021679 | 3/2003 |
| WO | WO 03/030194 | 4/2003 |
| WO | WO 03/032240 | 4/2003 |
| WO | WO 03/049201 | 6/2003 |
| WO | WO 03/063211 | 7/2003 |
| WO | WO 03/085700 | 10/2003 |
| WO | WO 03/085701 | 10/2003 |
| WO | WO 03/092073 | 11/2003 |
| WO | WO 04/000915 | 12/2003 |
| WO | WO 04/001103 | 12/2003 |
| WO | WO 2004/003535 | 1/2004 |
| WO | WO 2004/016485 | 2/2004 |
| WO | WO 2004/022637 | 3/2004 |
| WO | WO 2004/022714 | 3/2004 |
| WO | WO 2004/023527 | 3/2004 |
| WO | WO 2004/024407 | 3/2004 |
| WO | WO 2004/027822 | 4/2004 |
| WO | WO 2004/032190 | 4/2004 |
| WO | WO 2004/032191 | 4/2004 |
| WO | WO 2004/032193 | 4/2004 |
| WO | WO 2004/034025 | 4/2004 |
| WO | WO 2004/062697 | 7/2004 |
| WO | WO 2004/086289 | 10/2004 |
| WO | WO 2004/094303 | 11/2004 |
| WO | WO 2004/095536 | 11/2004 |
| WO | WO 2004/099068 | 11/2004 |
| WO | WO 2004/100252 | 11/2004 |
| WO | WO 2004/105456 | 12/2004 |
| WO | WO 2004/107973 | 12/2004 |
| WO | WO 2005/000483 | 1/2005 |
| WO | WO 2005/005679 | 1/2005 |
| WO | WO 2005/012606 | 2/2005 |
| WO | WO 2005/015480 | 2/2005 |
| WO | WO 2005/017962 | 2/2005 |
| WO | WO 2005/022120 | 3/2005 |
| WO | WO 2005/029578 | 3/2005 |
| WO | WO 2005/033786 | 4/2005 |
| WO | WO 2005/033787 | 4/2005 |
| WO | WO 2005/033789 | 4/2005 |
| WO | WO 2005/054119 | 6/2005 |
| WO | WO 2005/099310 | 10/2005 |
| WO | WO 2005/104756 | 11/2005 |
| WO | WO 2005/106934 | 11/2005 |
| WO | WO 2005/122285 | 12/2005 |
| WO | WO 2005/122285 A2 | 12/2005 |
| WO | WO 2005/123114 | 12/2005 |
| WO | WO 2006/028996 | 3/2006 |
| WO | WO 2006/042287 | 4/2006 |
| WO | WO 2006/069323 | 6/2006 |
| WO | WO 2006/076711 | 7/2006 |
| WO | WO 2006/104069 | 10/2006 |
| WO | WO 2006/130558 | 12/2006 |
| WO | WO 2006/130721 | 12/2006 |
| WO | WO 2007/000037 | 1/2007 |
| WO | WO 2007/016524 | 2/2007 |
| WO | WO 2007/028003 | 3/2007 |
| WO | WO 2007/056183 | 5/2007 |
| WO | WO 2007/126412 | 11/2007 |
| WO | WO 2008/030666 | 3/2008 |
| WO | WO 2008/030960 | 3/2008 |
| WO | WO 2008/030960 A2 | 3/2008 |
| WO | WO 2008/036837 | 3/2008 |
| WO | WO 2008/055054 | 5/2008 |
| WO | WO 2008/085904 | 7/2008 |
| WO | WO 2008/103464 | 8/2008 |
| WO | WO 2008/106485 | 9/2008 |
| WO | WO 2008/108838 | 9/2008 |
| WO | WO 2008/118133 | 10/2008 |
| WO | WO 2008/118211 | 10/2008 |
| WO | WO 2008/127401 | 10/2008 |
| WO | WO 2008/127402 | 10/2008 |
| WO | WO 2008/127403 | 10/2008 |

(56) References Cited

FOREIGN PATENT DOCUMENTS

| | | |
|---|---|---|
| WO | WO 2008/127404 | 10/2008 |
| WO | WO 2008/127405 | 10/2008 |
| WO | WO 2008/140562 | 11/2008 |
| WO | WO 2008/143635 | 11/2008 |
| WO | WO 2008/150861 | 12/2008 |
| WO | WO 2009/011709 | 1/2009 |
| WO | WO 2009/023615 | 2/2009 |
| WO | WO 2009/061823 | 5/2009 |
| WO | WO 2009/075625 | 6/2009 |
| WO | WO 2009/076088 | 6/2009 |
| WO | WO 2009/090398 | 7/2009 |
| WO | WO 2009/100280 | 8/2009 |
| WO | WO 2009/111641 | 9/2009 |
| WO | WO 2009/111641 A1 | 9/2009 |
| WO | WO 2009/114115 | 9/2009 |
| WO | WO 2009/114689 | 9/2009 |
| WO | WO 2009/114689 A1 | 9/2009 |
| WO | WO 2009/118678 | 10/2009 |
| WO | WO 2009/126689 | 10/2009 |
| WO | WO 2010/005707 | 1/2010 |
| WO | 2010/046883 | 4/2010 |
| WO | WO 2010/036807 | 4/2010 |
| WO | WO 2010/036807 A1 | 4/2010 |
| WO | WO 2010/036992 | 4/2010 |
| WO | WO 2010/040528 | 4/2010 |
| WO | WO 2010/042653 A1 | 4/2010 |
| WO | WO 2010/042798 | 4/2010 |
| WO | WO 2010/042957 A2 | 4/2010 |
| WO | WO 2010/049881 | 5/2010 |
| WO | WO 2010/056857 A2 | 5/2010 |
| WO | WO 2010/057142 | 5/2010 |
| WO | WO 2010/065957 | 6/2010 |
| WO | WO 2010/081137 A2 | 7/2010 |
| WO | WO 2010/082993 A2 | 7/2010 |
| WO | WO 2010/102310 A2 | 9/2010 |
| WO | WO 2010/126640 | 11/2010 |
| WO | WO 2010/132552 | 11/2010 |
| WO | WO 2010/132552 A1 | 11/2010 |
| WO | WO 2010/141133 | 12/2010 |
| WO | WO 2011/002931 | 1/2011 |
| WO | WO 2011/003181 A1 | 1/2011 |
| WO | WO 2011/005381 | 1/2011 |
| WO | WO 2011/006133 | 1/2011 |
| WO | WO 2011/008842 | 1/2011 |
| WO | WO 2011/011347 | 1/2011 |
| WO | WO 2011/026101 | 3/2011 |
| WO | WO 2011/038401 | 3/2011 |
| WO | 2011/041507 | 4/2011 |
| WO | WO 2011/041395 | 4/2011 |
| WO | WO 2011/041727 A1 | 4/2011 |
| WO | WO 2011/046652 | 4/2011 |
| WO | WO 2011/084450 | 7/2011 |
| WO | WO 2011/084450 A1 | 7/2011 |
| WO | WO 2011/084709 A2 | 7/2011 |
| WO | WO 2011/112931 | 9/2011 |
| WO | WO 2011/115643 | 9/2011 |
| WO | WO 2011/127331 A2 | 10/2011 |
| WO | WO 2012/097163 | 7/2012 |
| WO | WO 2012/125494 A2 | 9/2012 |
| WO | WO 2012/158709 | 11/2012 |
| WO | WO 2012/166686 A2 | 12/2012 |
| WO | WO 2012/167096 | 12/2012 |
| WO | WO 2013/010113 | 1/2013 |
| WO | WO 2013/010171 A1 | 1/2013 |
| WO | WO 2013/022853 A1 | 2/2013 |
| WO | WO 2013/033724 A1 | 3/2013 |
| WO | WO 2013/049716 A1 | 4/2013 |
| WO | WO 2013/052919 A2 | 4/2013 |
| WO | WO 2014/007871 A1 | 1/2014 |
| WO | WO 2014/058473 A1 | 4/2014 |
| WO | WO 2014/059032 | 4/2014 |
| WO | WO 2014/059032 A1 | 4/2014 |
| WO | WO 2014/106041 A1 | 7/2014 |
| WO | WO 2014/110176 A1 | 7/2014 |
| WO | WO 2014/130928 A2 | 8/2014 |
| WO | WO 2014/130931 A1 | 8/2014 |
| WO | WO 2014/186467 A2 | 11/2014 |
| WO | WO 2014/197443 A1 | 12/2014 |
| WO | WO 2014/205434 A2 | 12/2014 |
| WO | WO 2015/021039 A1 | 2/2015 |
| WO | WO 2015/054312 A1 | 4/2015 |

OTHER PUBLICATIONS

Adachi et al (1982) "Chemical Etching of InGaAsP/inP DH Wafer," *J. Electrochem. Soc. 129*:1053-1062.

Adachi et al. (1983) "Chemical Etching Characteristics of (001) GaAs," *J. Electrochem. Soc.* 130:2427-2435.

Adrega et al. (2010) "Stretchable Gold Conductors Embedded in PDMS and Patterned by Photolithography: Fabrication and Electro-mechanical Characterization," J. Micromech. Microeng. 20:055025.

Ago et al. (2005) "Aligned Growth of Isolated Single-Walled Carbon Nanotubes Programmed vby Atomic Arrangement of Substrate Surface," Chem. Phys. Lett. 408:433-438.

Ago et al. (2006) "Synthesis of Horizontally-Aligned Single-Walled Carbon Nanotubes with Controllable Density on Sapphire Surface and Polarized Raman Spectroscopy," Chem. Phys. Lett. 421:399-403.

Ahmed et al. (Web Release Oct. 11, 2005) "Extending the 3w-Method to the MHz Range for Thermal Conductivity Measurements of Diamond Thin Films," *Diamond Relat. Mater. 15*(2-3):389-393.

Ahn et al. (2007) "Bendable Integrated Circuits on Plastic Substrates by Use of Printed Ribbons of Single-Crystalline Silicon," *Appl. Phys. Lett. 90*:213501.

Ahn et al. (Dec. 15, 2006) "Heterogeneous Three-Dimensional Electronics by Use of Printed Semiconductor Nanomaterials," *Science 314*:1754-1757.

Ahn et al. (Jun. 2006) "High-Speed Mechanically Flexible Single-Crystal Silicon Thin-Film Transistors on Plastic Substrates," *IEEE Electron Dev. Lett. 27*(6):460-462.

Al-Sarawi et al. (Feb. 1998) "A Review of 3-D Packaging Technology," *IEEE Trans. Compo Packag. Manufac. Technol.* B 21(1):2-14.

Al-Halhouli et al. (2008) "Nanoindentation Testing of SU-8 Photoresist Mechanical Properties," Microelectronic Eng. 85:942-944.

Aliot, E. M. et al. (2009) "EHRA/HRS Expert Consensus on Catheter Ablation of Ventricular Arrhythmias: Developed in a partnership with the European Heart Rhythm Association (EHRA), a Registered Branch of the European Society of Cardiology (ESC), and the Heart Rhythm Society (HRS); in collaboration with the American College of Cardiology (ACC) and the American Heart Association (AHA)," Europace 11:771-817.

Alivisatos et al. (1996) "Semiconductor Clusters, Nanocrystals, and Quantum Dots," *Science* 271 :933-937.

Alivisatos et al. (1998) "From Molecules to Materials: Current Trends and Future Directions," *Adv. Mater. 10*:1297-1336.

Allen et al. (Feb. 20, 2006) "Nanomaterial Transfer Using Hot Embossing for Flexible Electronic Devices," *Appl. Phys. Lett.* 88:083112.

Altman et al., "Silk-Based Biomaterials," Biomaterials 2003; 24 (3): 24:401-416.

Amano et al. (Feb. 3, 1986) "Metalorganic Vapor Phase Epitaxial Growth of a High Quality GaN Film Using an AlN Buffer Layer," *Appl. Phys. Lett. 48*(5):353-355.

Ambrosy et al. (1996) "Silicon Motherboards for Multichannel Optical Modules," *IEEE Trans. Compon. Pack. A 19*:34-40.

Amir et al. (2000) "The Influence of Helium—Neon Irradiation on the Viability of Skin Flaps in the Rat," Br. J. Plast. Surg. 53:58-62.

Amsden et al. (Nov. 9, 2009) "Spectral Analysis of Induced Color Change on Periodically Nanopatterned Silk Films," Opt. Express 17(23):21271-21279.

Andersen et al. (2004) "Selecting the Signals for a Brain-Machine Interface," Curr. Opin. Neurobiol. 14:720-726.

Andersson et al. (Oct. 16, 2002) "Active Matrix Displays Based on All-Organic Electrochemical Smart Pixels Printed on Paper," *Adv. Mater. 14*:1460-1464.

(56) References Cited

OTHER PUBLICATIONS

Ando et al. (2004) "Self-Aligned Self-Assembly Process for Fabricating Organic Thin-Film Transistors," *Appl. Phys. Lett.* 85:1849-1851.

Angadi et al. (Web Release Jun. 1, 2006) "Thermal Transport and Grain Boundary Conductance in Ultrananocrystalline Diamond Thin Films," *J. Appl. Phys.* 99:114301.

Aoki et al. (2003) "Microassembly of Semiconductor Three Dimensional Photonic Crystals," *Nat. Mater.* 2:117-121.

Arnold et al. (Web Release Dec. 28, 2002) "Field-Effect Transistors Based on Single Semiconducting Oxide Nanobelts," *J. Phys. Chem. B* 107(3):659-663.

Ayon et al. (Jan. 1999) "Characterization of a Time Multiplexed Inductively Coupled Plasma Etcher," *J. Electrochem. Soc.* 146(1):339-349.

Baca et al. (2008) "Semiconductor Wires and Ribbons for High-Performance Flexible Electronics," *Angew. Chem. Int. Ed.* 47:5524-5542.

Bachtold et al. (Nov. 9, 2001) "Logic Circuits with Carbon Nanotube Transistors," *Science* 294:1317-1320.

Bae et al. (Jul. 1, 2002) "Single-Crystalline Gallium Nitride Nanobelts," *Appl. Phys. Lett.* 81: 126-128.

Ball et al. (2004) "Towards an Implantable Brain-Machine Interface Based on Epicortical Field Potentials," Biomed. Tech. 49:756-759.

Balmer et al. (2005) "Diffusion of Alkanethiols in PDMS and Its Implications on Microcontact Printing (IJCP)," *Lanqmuir* 21(2):622-632.

Banerjee et al. (May 2001) "3-D ICs: A Novel Chip Design for Improving Deep-Submicrometerinterconnect Performance and Systems-on-Chip Integration," *Proc. IEEE* 89(5):602-633.

Bao et al. (1997) "High-Performance Plastic Transistors Fabricated by Printing Techniques," *Chem. Mater.* 9:1299-1301.

Bao et al. (1999) "Printable Organic and Polymeric Semiconducting Materials and Devices," *J. Mater. Chem.* 9:1895-1904.

Barquins, M. (1992) "Adherence, Friction and Wear of Rubber-Like Materials," *Wear* 158:87-117.

Bates, F.S. (1991) "Polymer-Polymer Phase Behavior," *Science* 251:898-905.

Battaglia et al. (2003) "Colloidal Two-Dimensional Systems: CdSe Quantum Shells and Wells," Angew. Chem. Int. Ed. 442:5035-5039.

Bauer et al. (2004) "Biological Applications of High Aspect Ratio Nanoparticles," *J. Mater. Chem.* 14:517-526.

Berg et al. (2003) "Tailored Micropatterns Through Weak Polyelectrolyte Stamping," Langmuir 19:2231-2237.

Bernard et al. (1998) "Printing Patterns of Proteins," *Langmuir* 14(9):2225-2229.

Bett et al. (Aug. 1999) "III-V Compounds for Solar Cell Applications," Appl. Phys. A. Mater. Sci. 69(2):119-129.

Bhunia et al. (2004) "Free-Standing and Vertically Aligned InP Nanowires Grown by Metalorganic Vapor Phase Epitaxy," *Physica E* 21:583-587.

Bhushan et al. (2004) "Multiwalled Carbon Nanotube AFM Probes for Surface Characterization of Micro/Nanostructures," *Microsyst. Technol.* 10:633-639.

Bietsch et al. (2000) "Conformational Contact and Pattern Stability of Stamps Used for Soft Lithography," *J. Appl. Phys.* 88:4310-4318.

Bioflex—Biocompatible Flexible Electronic Circuits. Available at http:/tfcg.elis. Ugent.be/projects. Accessed Feb. 8, 2012.

Bishay et al. (2000) "Temperature Coefficient of the Surface Resistivity of Two-Dimensional Island Gold Films," *J. Phys. D. Appl. Phys.* 33(18):2218-2222.

Blanchet et al. (2003) "Large Area, High Resolution, Dry Printing of Conducting Polymers for Organic Electronics," *Appl. Phys. Lett.* 82:463-465.

Blanchet et al. (2003) "Printing Techniques for Plastic Electronics," *J. Imag. Sci. Tech.* 47(4):296-303.

Blazdell et al. (Nov. 1999) "Preparation of Ceramic Inks for Solid Freeforming Using a Continuous Jet Printer," *J. Mat. Syn. Process.* 7(6):349-356.

Boltau et al. (1998) "Surface-Induced Structure Formation of Polymer Blends on Patterned Substrates," *Nature* 391:877-879.

Boncheva et al. (Mar. 15, 2005) "Magnetic Self-Assembly of Three-Dimensional Surfaces from Planar Sheets," *Proc. Natl. Acad. Sci. USA* 102(11):3924-3929.

Boncheva et al. (Mar. 18, 2005) "Templated Self-Assembly: Formation of Folded Structures by Relaxation of Pre-Stressed, Planar Tapes. The Path to Ubiquitous and Low-cost Organic Electronic Appliances on Plastic," *Ad. Mater.* 17(5): 553-557.

Bourzac, K. (May/Jun. 2010) "TR10: Implantable Electronics," Technology Review, Published by MIT, http://www.technologyreview.com/biomedicine/25086/?a=f.

Bowden et al. (1997) "Self Assembly of Mesoscale Objects into Ordered Two-Dimensional Arrays," Science 276:233-235.

Bowden et al. (1998) "Spontaneous Formation of Ordered Structures in Thin Films of Metals Supported on an Elastomeric Polymer," Nature 393:146-149.

Bowden et al. (2001) "Molecule-Mimetic Chemistry and Mesoscale Self-Assembly," Ace. Chem. Res. 34:231-238.

Bracher et al. (2009) "Shaped Films of Ionotropic Hydrogels Fabricated Using Templates of Patterns Paper," Adv. Mater. 21:445-450.

Bradley et al. (2003) "Flexible Nanotube Electronics," Nano Lett., vol. 3, No. 10, pp. 1353-1355.

Braun et al. (1999) "Electrochemically Grown Photonic Crystals," *Nature* 402:603-604.

Britton et al. (Web Release Oct. 25, 2005) "Microstructural Defect Characterization of a Si:H Deposited by Low Temperature HW-CVD on Paper Substrates," Thin Solid Films 501(1-2):79-83.

Brown et al. (2005) "Evaluation of Polydimethylsiloxane Scaffolds with Physiologically-Relevant Elastic Moduli: Interplay of Substrate Mechanics and Surface Chemistry Effects on Vascular Smooth Muscle Cell Response," Biomaterials 26:3123-3129.

Brown et al. (Dec. 19, 2001) "Heterogeneous Materials Integration: Compliant Substrates to Active Device and Materials Packaging," Mater. Sci. Eng. B 87(3):317-322.

Brown, H.R. (1991) "The Adhesion Between Polymers," *Ann. Rev. Mater. Sci.* 21:463-489.

Bruschi et al. (2001) "Micromachined Silicon Suspended Wires With Submicrometric Dimensions," Microelectron. Eng. 57-58:959-965.

Buma et al. (2001) "High-Frequency Ultrasound Array Element Using Thermoelastic Expansion in an Elastomeric Film," Appl. Phvs. Lett. 79:548-550.

Burdinski et al. (2005) "Single Etch Patterning of Stacked Silver and Molybdenum Alloy Layers on Glass Using Microcontat Wave Printing," J. Am. Chem. Soc. 127(31):10786-1 0787.

Burdinski, D. (non-dated) "Soft Lithography and Microcontact Wave Printing," htt,Q://ilNWW.research.Q,hili,Qs.comitechnologies/light deY microsys/softlitho/index.html, Downloaded May 23, 2007.

Burge et al. (Jun. 25, 1997) "X-Ray Holography for VLSI Using Synthetic Bilevel Holograms," Proc. Int. Soc. Opt. Eng. 3183:2-13.

Burgin et al. (2000) "Large Area Submicrometer Contact Printing Using a Contact Aligner," Langmuir 16:5371-5375.

Burns et al. (2003) "Printing of Polymer Thin-Film Transistors for Active-Matrix-Display Applications," J. Soc. Int. Display 11:599-604.

Campbell et al. (2000) "Fabrication of Photonic Crystals for the Visible Spectrum by Holographic Lithography," *Nature* 404:53-56.

Cao et al. (2006) "Highly Bendable, Transparent Thin-Film Transistors That Use Carbon-Nanotube-Based Conductors and Semiconductors with Elastomeric Delectrics," Adv. Mater. 18(3):304-309.

Cao et al. (2006) "Bilayer Organic-Inorganic Gate Dielectrics for High-Performance, Low-Voltage, Single-Walled Carbon Nanotube Thin-Film Transistors, Complementary Logic Gates, and p-n Diodes on Plastic Substrates," Adv. Funct. Mater. 16:2355-2362.

Cao et al. (2006) "Transparent flexible organic thin-film transistors that use printed single-walled carbon nanotube electrodes," Applied Physics Letters 88:113511.

Cao et al. (Jan. 5, 2009) "Ultrathin Films of Single-Walled Carbon Nanotubes for Electronics and Sensors: A Review of Fundamental and Applied Aspects," Adv. Mater. 21(1):29-53.

Cao et al. (Jul. 24, 2008) "Medium-Scale Carbon Nanotube Thin-Film Integrated Circuits on Flexible Plastic Substrates," Nature 454:495-500.

(56) References Cited

OTHER PUBLICATIONS

Carr et al. (1998) "Measurement of Nanomechanical Resonant Structures in Single-Crystal Silicon," J. Vac. Sci. Technol. B 16:3821-3824.

Chadhury et al. (1991) "Direct Measurement of Interfacial Interactions Between Semispherical Lenses and Flat Sheets of Poly(dimethylsiloxane) and their Chemical Derivatives," Langmuir 7: 1013-1025.

Chang et al. (1994) "Process Techniques, Lithography and Device-Related Physics and Principles," In; GaAs High-Speed Devices: Physics, Technology and Circuit Application, John Wiley and Sons, New York, pp. 115-278.

Chen et al. (2003) "Characterization of Pd—GaAs Schottly Diodes Prepared by the Electrodes Plating Technique," Semiconductor. Sci. Technol. 18:620-626.

Chen et al. (2003) "Electronic Paper: Flexible Active-Matrix Electronics Ink Display," Nature 423: 136.

Chen et al. (2004) "Herringbone Buckling Patterns of Compresses Thin Films on Comlliant Substrates," J. Appl. Mech. 71 :597.

Chen et al. (2005) "InGaN Nanorings and Nanodots by Selective Area Epitaxy," Appl. Phys. Lett. 87:143111.

Chen et al. (2005) "The Role of Metal-Nanotube Caontact in the Performance of Carbon Nanotube Field-Effect Transistors," Nano Lett. 5(7):1497-1502.

Chen et al. (Feb. 27, 2006) "Complementary Carbon Nanotube-Gated Carbon Nanotube Thin-Fim Transistor," Appl. Phys. Lett. 88:093502.

Chen et al. (Jun. 2002) Effect of Process Parameters on the Surface Morphology and Mechanical Performance of Silicon Structures After Deep Reactive Ion Etching (DRIE) J. Microelectromech. Syst. 11 (3):264-2775.

Chen et al. (Mar. 2004) "A Family of Herringbone Patterns in Thin Films," Scr. Mater. 50(6):797-801.

Chen et al. (Mar. 24, 2006) "An Integrated Logic Circuit Assembled on a Single Carbon Nanotube," Science 311:1735.

Chen et al. (Sep. 2004) "Herringbone Buckling Patterns of Compressed Thin Films on Compliant Substrates," J. Appl. Mech. 71:597-603.

Cheng et al. (2005) "Ink-Jet Printing, Self-Assembled Polyelectrolytes, and Electroless Plating: Low Cost Fabrication of Circuits on a Flexible Substrate at Room Temperature," Macromol. Rapid Commun. 26:247-264.

Childs et al. (2002) "Decal Transfer Microlithography: A New Soft-Lithographic Patterning Method," J. Am. Chern. Soc. 124:13583-13596.

Childs et al. (2005) "Masterless Soft-Lithography: Patterning UV/Ozone-Induced Adhesion on Poly(dimethylsiloxane) Surfaces," Langmuir 21:10096-10105.

Childs et al. (Aug. 14, 2004) "Patterning of Thin-Film Microstructures on Non-Planar Substrate Surfaces Using Decal Transfer lithography," Adv. Mater. 16(15):1323-1327.

Choi et al. (2007) "Biaxially Stretchable 'Wavy' Silicon Nanomembranes," Nano Lett. 7(6): 1655-1663.

Choi et al. (Web Release Jan. 25, 2005) "Simple Detachment Patterning of Organic Layers and Its Applications to Organic light-Emitting Diodes," Adv. Mater. 17(2):166-171.

Chou et al. (2004) "An Orientation-Controlled Pentacene Film Aligned by Photoaligned Polyimide for Organic Thin-Film Transistor Applications," Adv. Func. Mater. 14:811-815.

Chou et al. (Jun. 8, 1999) "Micromachining on (111 )-Oriented Silicon," Sens. Actuators A 75(3):271-277.

Chu et al. (2005) "High-Performance Organic Thin-Film Transistors with Metal Oxide/Metal Bilayer Electrode," Appl. Phys. Lett. 87: 193508.

Chung et al. (2000) "Silicon Nanowire Devices," Appl. Phys. Lett. 76(15):2068-2070 Chung et al. (Jul. 1, 2003) "A Study on Formation of Al and Al2O3 on the Porous Paper by DC Magnetron Sputtering," Surf. Coat. Technol. 171(1-3):65-70.

Chung et al. (Jul. 1, 2003) "A Study on Formation of Al and Al2O3 on the Porous Paper by DC Magnetron Sputtering," Surf. Coat. Technol. 171(1-3):65-70.

Ciesinski, Michael, "Flexible Electronics: Why the Interest? Where are the Markets? What's Next?" Flextech Alliance Apr. 14, 2010, [retrieved online Apr. 29, 2011] http://www.avsusergroups.org/tfug_pdfs/tfug2010_4ciesinski.pdf.

Clerc, L. (1976) "Directional Differences of Impulse Spread in Trabecular Muscle from Mammalian Heart," J. Physiol. 255:335-346.

Cohen-Karni et al. (2009) "Flexible Electrical Recording from Cells Using Nanowire Transistor Arrays," Proc. Natl. Acad. Sci. USA 106:7309-7313.

Cole et al. (2008) "Patterned Growth and Transfer of ZnO Micro- and Nanocrystals with Size and Location Control," Adv. Mater. 20:1474-1478.

Collins et al. (Apr. 27, 2001) "Engineering Carbon Nanotubes and Nanotube Circuits Using Electrical Breakdown," Science 292:706-709.

Corazza et al. (2007) "Photobiomodulation on the Angiogenesis of Skin Wounds in Rats Using Different Light Sources," Photomedicine Laser Surg. 25:102-106.

Cox, H. L. (1952) "The Elasticity and Strength of Paper and Other Fibrous Materials," Br. J. Appl. Phys. 3:72-79.

Creagh et al. (2003) "Design and Performance of Inkjet Print Heads for Non-Graphic-Arts Applications," MRS Bull. 28:807-811.

Crone et al. (Feb. 3, 2000) "Large-Scale Complementary Integrated Circuits Based on Organic Transistors," Nature 403:521-523.

Crowder et al. (1998) "Low-Temperature Single-Crystal Si TFTs Fabricated on Si Films Processed via Sequential Lateral Solidification," IEEE Electron. Dev. Lett. 19:306-308.

Cui et al. (2001) "Nanowire Nanosensors for Highly Sensitive and Selective Detection of Biological and Chemical Species," Science 293:1289-1292.

Dai et al. (2002) "Gallium Oxide Nanoribbons and Nanosheets," J. Phys. Chem. B 106(5):902-904.

Dai et al. (2003) "Novel Nanostructures of Functional Oxides Synthesized by Thermal Evaporation," Adv. Funct. Mater. 13:9-24.

Dai et al. (Web Release Jan. 15, 2002) "Gallium Oxide Nanoribbons and Nanosheets," J. Phys. Chem. B 106(5):902-904.

Davidson et al. (2004) "Supercritical Fluid-liquid-Solid Synthesis of Gallium Arsenide Nanowires Seeded by Alkanethiol-Stabilized Gold Nanocrystals," Adv. Mater. 16:646-649.

de Gans (2004) "Inkjet Printing of Polymers: State of the Art and Future Developments," Adv. Mater. 16(3):203-213.

De Sio et al. (Web Release May 18, 2005) "Electro-Optical Response of a Single-Crystal Diamond Ultraviolet Photoconductor in Transverse Configuration," Appl. Phys. Lett. 86:213504.

DeBoer et al. (2004) "Organic Single-Crystal Field-Effect Transistors," *Phys. Stat. Sol. 201* :1302-1331.

Decision of Refusal corresponding to Japanese Patent Application No. P2007-515549, Issued Sep. 4, 2012.

Decision of Rejection corresponding to Korean Patent Application No. 10-2007-7000216, Issued Sep. 19, 2012—includes English translation.

Deen et al. (2004) "Electrical Characterization of Polymer-Based FETs Fabricated By Spin-Coating Poly(3-alkylthiophene)s," IEEE Trans. Electron Devices 51: 1892-1901.

Delmerche et al. (1997) "Stability of Molded Polydimethylsiloxane Microstructures," Adv. Mat. 9:741-746.

Deruelle et al. (1995) "Adhesion at the Solid-Elastomer Interface: Influence of Interfacial Chains," Macromol. 28:7419-7428.

Derycke et al. (Sep. 2001) "Carbon Nanotube Inter- and Intramolecular Logic Gates," Nano Lett. 1(9):453-456.

Desai et al. (Feb. 1999) "Nanopore Technology for Biomedical Applications," *Biomed. Microdevices 2*(1 ):11-40.

Dick et al. (2004) "Synthesis of Branched 'Nanotrees' by Controlled Seeding of Multiples Branching Events," Nat. Mater. 3:380-38.

Dimroth et al. (Mar. 2007) "High-Efficiency Multijunction Solar Cells," *MRS Bull. 32*:230-235.

Ding et al. (Oct. 4, 2004) "Self Catalysis and Phase Transformation in the Formation of CdSe Nanosaws," Adv. Mater. 16(19):1740-1743.

(56) References Cited

OTHER PUBLICATIONS

Dinsmore et al. (2002) "Colloidosomes: Selectively Permeable Capsules Composed of Colloidal Particles," Science 298:1006-1009.
Dinyari et al., (2008) "Curving Monolithic Silicon for Nonplanar Focal Plane Aarray Applications," Appl Phys Lett, 92:091114.
Divliansky et al. (2003) "Fabrication of Three-Dimensional Polymer Photonic Crystal Structures Using Single Diffraction Element Interference Lithography," Appl. Phys. Lett. 82(11):1667-1669.
Dodabalapur A. (Apr. 2006) "Organic and Polymer Transistors for Electronics," Mater Today 9(4):24-30.
Dodabalapur et al. (1995) "Organic Transistors: Two-Dimensional Transport and mproved Electrical Characteristics," Science 268:270-27.
Duan et al. (2000) "General Synthesis of Compound Semiconductor Nanowires," Adv. Mater. 12:298-302.
Duan et al. (2003) "High-performance Thin-Film Transistors Using Semiconductor Nanowires and Nanoribbons," Nature 425:274-278.
Duan X, (2003) "Semiconductor Nanowires: From Nanoelectronics to Macroelectronics," Abstract from a presentation given at the 11th Foresight Conference on Molecular Nanotechnology, Oct. 10-20, Burlingame, CA.
Duboz et al. (1998) "Transistors and Detectors Based on GaN-Related Materials," In; Group III Nitride Semiconductor Compounds, Gill, B. ed., Clarendon, Oxford, pp. 343-387.
Duesberg et al. (2000) "Polarized Raman Spectroscopy on Isolated Single-Wall Carbon Nanotubes," Phys. Rev. Lett., vol. 85, No. 25, pp. 5436-5439.
Duffy et al. (1998) "Rapid Prototyping of Microfluidic Systems in Poly(dimethylsiloxane)," Anal. Chem. 70(23):4974-4984.
Dupuis et al. (2008) "History, Development, and Applications of High-Brightness Visible Light-Emitting Diodes," IEEE J. Lightwave Tech. 26:1154-1171.
Durkop et al. (2004) "Extraordinary Mobility in Semiconducting Carbon Nanotube," Nano Lett. 4(1):35-39.
Eder et al. (Apr. 5, 2004) "Organic Electronics on Paper," Appl. Phys. Lett. 84(14):2673-2675.
Edrington et al. (2001)"Polymer-Based Photonic Crystals," Adv. Mater. 13:421-425.
Efimenko et al. (Oct. 15, 2002) "Surface Modification of Sylgard-184 Poly(dimethyl Siloxane) Networks by Ultraviolet and UltravioleUOzone Treatment," J. Colloid Interface Sci. 254(2):306-315.
Eftekhari, G. (1993) "Variation in the Effective Richardson Constant of Metal-GaAs and Metal-InP Contacta Due to the Effect of Processing Parameters," Phys. Status Solid A-Appl. Res. 140:189-194.
Ensell, G. (1995) "Free Standing Single-Crystal Silicon Microstructures," J.Micromech. Microeng. 5: 1-4.
European Extended Search Report dated Feb. 9, 2012 in Application No. 09826745.3.
Examination and Search Report, Corresponding to Malaysian Patent Application No. PI 20090622, Mailed Sep. 28, 2012.
Examination Report, Clear Report, Corresponding to Malaysian Patent Application No. PI 20062672, issued Aug. 6, 2006.
Examination Report, Corresponding to European Application No. 07 841 968.6.
Examination Report, Corresponding to European Application No. EP 05 756 327.2, Dated Jan. 20, 2010.
Examination Report, Corresponding to Malaysian Patent Application No. PI 20062672, Mailed Aug. 28, 2009.
Examination Report, Corresponding to Malaysian Patent Application No. PI20052553, Issued Feb. 27, 2009.
Examination Report, Corresponding to Malaysian Patent Application No. PI20092343, Issued May 26, 2012.
Examination Report, Corresponding to Malaysian Patent Application No. PI20092343, Mailed Jun. 15, 2010.
Examination Report, Corresponding to Malaysian Patent Publication No. PI20052553, Mailed Mar. 13, 2009.
Examination Report, Corresponding to Singapore Patent Application No. 200608359-6, Completed on Aug. 27, 2008.
Faez et al. (1999) "An Elastomeric Conductor Based on Polyaniline Prepared by Mechanical Mixing," Polymer 40:5497-5503.
Feigner et al. (1996) "Flexural Rigidity of Microtubules Measured with the Use of Optical Tweezers," J. Cell Sci. 109:509-516.
Final Office Action mailed Nov. 21, 2012 corresponding to U.S. Appl. No. 12/921,808.
Final Office Action, Corresponding to U.S. Appl. No. 12/575,008, mailed Oct. 17, 2011.
Final Office Action, Corresponding to U.S. Appl. No. 11/851,182, Mailed Oct. 29, 2010.
Fink et al. (1999) "Block Copolymers as Photonic Bandgap Materials," J. Lightwave Tech. 17:1963-1969.
Flewitt et al. (2005) "Low-Temperature Deposition of Hydrogenated Amorphous Silicon in an Electron Cyclotron Resonance Reactor for Flexible Displays," Proc. IEEE 93: 1364-1373.
Folch et al. (1999) "Wafer-Level In-Registry Microstamping," J. Microelectromech. Syst. 8:85-89.
Forment et al. (2004) "Influence of Hydrogen Treatment and Annealing Processes Upon the Schottky Barrier Height of Au/n-GaAs and Ti/n-GaAs Diodes," Semicond. Sci. Technol. 19:1391-1396.
Forrest et al. (2004) "The Path to Ubiquitous and Low-Cost Organic Electronic Appliances on Plastic," Nature 428:911-918.
Fortunato et al. (2005) "Flexible a-Si: H Position-Sensitive Detectors," Proc. IEEE 93:1281-1286.
Fortunato et al. (Sep. 2008) "High-Performance Flexible Hybrid Field-Effect Transistors Based on Cellulose Fiber Paper," IEEE Electron. Dev. Lett. 29(9):988-990.
Freeman et al. (2000) "Spatial Spectral Analysis of Human Electrocardiograms Including the Alpha and Gamma Bands," J. Neurosci. Methods 95:111-121.
Freire et al. (1999) "Thermal Stability of Polyethylene Terephthalate (PET): Oligomer Distribution and Formation of Volatiles," Packag. Technol. Sci. 12:29-36.
Freund, L.B. (2000) "The Mechanics of Electronic Materials," Int. J. Solids Struct. 37:185-196.
Friedman et al. (2005) "Nanotechnology: High-Speed Integrated Nanowire Circuits," Nature 434: 1085.
Fu et al. (Jan. 10, 2003) "Patterning of Diamond Microstructures on Si Substrate by Bulk and Surface Micromachining," J. Mater. Process. Technol. 132(1-3):73-81.
Furneaux et al. (1989) "The Formation of Controlled-Porosity Membranes from Anodically Oxidized Aluminum," Nature 337:147-149.
Gan et al. (2002) "Preparation of Thin-Film Transistors with Chemical Bath Deposited CdSe and CdS Thin Films," IEEE Trans. Electron. Dev. 49:15-18.
Gao et al. (Sep. 9, 2005) "Conversion of Zinc Oxide Nanobelts into Superlattice-Structures Nanohelices," Science 309: 1700-1704.
Garcia et al. (Oct. 2004) "Etchant Anisotropy Controls the Step Bunching Instability in KOH Etching of Silicon," Phys. Rev. Lett. 93(16):166102.
Gardner et al. (1965) "Physical Aspects of the Internal Water Relations of Plant Leaves," Plant Physiol. 40:705-710.
Gamier et al. (1994) "All-Polymer Field-Effect Transistor Realized by Printing Techniques," Science 265:1684-1686.
Geim et al. (Mar. 2007) "The Rise of Graphene," Nature Mater. 6:183-191.
Geissler et al. (2003) "Fabrication of Metal Nanowires Using Microcontact Printing," Langmuir 19(15):6301-6311.
Geissler et al. (Jun. 2003) "Selective Wet-Etching of Microcontact-Printed Cu Substrates with Control Over the Etch Profile," Microelec. Eng. 67-68:326-332.
Gelinck et al. (2000) "High-Performance All-Polymer Integrated Circuits," Appl. Phys. Lett. 77:1487-1489.
Gelinck et al. (2004) "Flexible Active-Matrix Displays and Shift Registers Based on Solution-Processed Organic Transistors," Nat. Mater. 3: 106-110.
Georgakilas et al. (2002) "Wafer-Scale Integration of GaAs Optoelectronic Devices with Standard Si Integrated Circuits Using a Low-Temperature Bonding Procedure," Appl. Phys. Lett. 81:5099-5101.
Givargizov, E.I. (1991) "Applications," In; Oriented Crystallization on Amorphous Substrates, Plenum Press, New York, pp. 341-363.

(56) References Cited

OTHER PUBLICATIONS

Goetting et al. (1999) "Microcontact Printing of Alkanephosphonic Acids on Aluminum: Pattern Transfer by Wet Chemical Etching," *Langmuir* 15:1182-1191.

Goldman et al. (1996) "Correlation of Buffer Strain Relaxation Modes with Transport Properties of Two-Dimensional Electron Gases," *J. Apple. Phys.* 80:6849-6854.

Goldmann et al. (2004) "Hole Mobility in Organic Single Crystals Measured by a "Flip Crystal" Field-Effect Technique," *J. Appl. Phys.* 96:2080-2086.

Goldsmith, T.H. (Sep. 1990) "Optimization, Constraint, and History in the Evolution of Eyes," *Quart. Rev. Biol.* 65(3):281-322.

Gratz et al. (1991) "Atomic Force Microscopy of Atomic-Scale Ledges and Etch Pits Formed During Dissolution of Quartz," Science, 251:1343-1346.

Gray et al. (2004) "High-Conductivity Elastomeric Electronics," *Adv. Mater.* 16:393 397.

Gray et al. (Dec. 2001) "Screen Printed Organic Thin Film Transistors (OTFTs) on a Flexible Substrate," *Proc. SPIE* 4466:89-94.

Grayson, T. (2002) "Curved Focal Plane Wide Field of View Telescope Design," *Proc. SPIE* 4849:269-274.

Gruen et al. (Mar. 21, 1994) "Fullerenes as Precursors for Diamond Film Growth Without Hydrogen or Oxygen Additions," *Appl. Phys. Lett.* 65(12):1502-1504.

Gudiksen et al. (Web Release Apr. 18, 2001) "Synthetic Control of the Diameter and Length of Single Crystal Semiconductor Nanowires," *J. Phys. Chem.* B 105:4062-4064.

Guo et al. (Aug. 19, 2002) "Metal-Insulator-Semiconductor Electrostatics of Carbon Nanotubes," *Appl. Phys. Lett.* 81(8):1486-1488.

Gur et al. (2005) "Air-Stable All-Inorganic Nanocrystal Solar Cells Processed from Solution," *Science* 310:462-465.

Gurbuz et al. (Jul. 2005) "Diamond Semiconductor Technology for RF Device Applications." *Solid State Electron*. 49(7): 1055-1070.

Haisma et al. (2002) "Contact Bonding, Including Direct-Binding in a Historical and Recent Context of Materials Science and Technology, Physics and Chemistry—Historical Review in a Broader Scope and Comparative Outlook," *Mater. Sci. Eng.* R 37:1-60.

Halik et al. (2004) "Low-Voltage Organic Transistors with an Amorphous Molecular Gate Dielectric," *Nature* 431 :963-966.

Hamedi et al. (May 2007) "Towards Woven Logic from Organic Electronic Fibres," *Nat. Mater.* 6:357-362.

Hamilton et al. (2004) "Field-Effect Mobility of Organic Polymer Thin-Film Transistors," *Chem. Mater*. 16:4699-4704.

Han et al. (2005) "Template-Free Directional Growth of Single-Walled Carbon Nanotues on a- and r-Plane Sapphire," *J. Am. Chem. Soc.* 127:5294-5295.

Harada et al. (2001) "Catalytic Amplification of the Soft Lithographic Patterning of Si. Nonelectrochemical Orthogonal Fabrication of Photoluminescent Porous Si Pixel Arrays," *J. Am. Chem. Soc.* 123:8709-8717.

Harkonen et al. (Jun. 8, 2006) "4 W Single-Transverse Mode VECSEL Utilizing Intra-Cavity Diamond Heat Spreader," *Electron Lett.* 42(12):693-694.

Hayase et al. (2001) "Photoangioplasty with Local Motexafin Lutetium Delivery Reduces Macrophages in a Rabbit Post-Balloon Injury Model," Cardiovascular Res. 49:449-455.

He et al. (2005) "Si Nanowire Bridges in Microtrenches: Integration of Growth into Device Fabrication," *Adv. Mater.* 17:2098-2102.

Heffelfinger et al. (1997) "Steps and the structure of the (0001) α-alumina surface," Surf. Sci., 370:L168-L172.

Hillbrog et al. (Web Release Dec. 30, 2003) "Nanoscale Hydrophobic Recovery: Chemical Force Microscopy Study of UV/Ozone-Treated Cross-Linker Poly(dimethylsiloxane)," *Langmuir* 20(3):785-794.

Hines et al. (2005) "Nanotransfer Printing of Organic and Carbon Nanotube Thin-Film Transistors on Plastic Substrates," *Appl. Phys. Lett.* 86:163101.

Hollenberg et al. (2006) "A MEMS Fabricated Flexible Electrode Array for Recording Surface Field Potentials," J. Neurosci. Methods 153:147-153.

Holmes et al. (Feb. 25, 2000) "Control of Thickness and Orientation of Solution-Grown Silicon Nanowires," *Science 287*:1471-1473.

Horan et al. (Jun. 2005) "In Vitro Degradation of Silk Fibroin," Biomaterials 26(17):3385-3393.

Horn et al. (1992) "Contact Electrification and Adhesion Between Dissimilar Materials," *Science 256*:362-364.

Hoyer, P. (1996) "Semiconductor Nanotube Formation by a Two-Step Template Process," *Adv. Mater.* 8:857-859.

Hsia et al. (2005) "Collapse of Stamps for Soft Lithography Due to Interfacial Adhesion," *Appl. Phys. Lett.* 86:154106.

Hsu et al. (2002) "Amorphous Si TFTs on Plastically Deformed Spherical Domes," *J. Non-Crystalline Solids* 299-302: 1355-1359.

Hsu et al. (2003) "Nature of Electrical Contacts in a Metal-Molecule-Semiconductor System," *J. Vac. Sci. Technol.* B 21(4):1928-1935.

Hsu et al. (2004) "Effects of Mechanical Strain on TFTs on Spherical Domes," *IEEE Trans. Electron. Dev.* 51 :371-377.

Hsu et al. (Jan. 15, 2004) "Spherical Deformation of Compliant Substrates with Semiconductor Device Islands," *J. Appl. Phys.* 95(2):705-712.

Hu et al. (1997) "Using Soft Lithography to Fabricate GaAs/AlGaAs Heterostructure Field Effect Transistors," *Appl. Phys. Lett.* 71 :2020-2022.

Hu et al. (1999) Chemistry and Physics in One Dimension: Synthesis and Properties of Nanowires and Nanotubes, *Ace. Chem. Res.* 32:435-445.

Hu et al. (2004) "Percolation in Transparent and Conducting Carbon Nanotube Networks," Nano Lett., vol. 4, No. 12, pp. 2513-2517.

Hu et al. (2009) "Highly Conductive Paper for Energy-Storage Devices," Proc. Natl. Acad. Sci. USA 106:21490-21494.

Hu et al. (2010) "Stretchable, Porous, and Conductive Energy Textiles," Nano Lett. 10:708-714.

Huang et al. (2001) "Directed Assembly of One-Dimensional Nanostructures into Functional Networks," *Science* 291 :630-633.

Huang et al. (2001) "Room-Temperature Ultraviolet Nanowire Nanolasers," Science 292:1897-1899.

Huang et al. (2003) "Growth of Millimeter-Long and Horizontally Aligned Single-Walled Carbon Nanotubes on Flat Substrates," J. Am. Chem. Soc., 125:5636-5637.

Huang et al. (2004) "Long and Oriented Single-Walled Carbon Nanotubes Grown by Ethanol Chemical Vapor Deposition," J. Phys. Chem. B. 108:16451-16456.

Huang et al. (2004) "Self-Organizing High-Density Single-Walled Carbon Nanotube Arrays from Surfactant Suspensions," Nanotechnol. 15:1450-1454.

Huang et al. (2005) "Nanomechanical Architecture of Strained Bilayer Thin Films: From Design Principles to Experimental Fabrication," *Adv. Mater.* 17(23):2860-2864.

Huang et al. (2005) "Nanowires for Integrated Multicolor Nanophotonics," *Small* 1(1):142-147.

Huang et al. (2005) "Nonlinear Analyses of Wrinkles in a Film Bonded to a Compliant Substrate," *J. Mech. Phys. Solids 53*:2101-2118.

Huang et al. (2005) "Stamp Collapse in Soft Lithography," *Langmuir* 21 :8058-8068.

Huang et al. (Jan. 16, 2001) "Catalytic Growth of Zinc Oxide Nanowires by Vapor Transport," *Adv. Mater.* 13(2):113-116.

Huck et al. (2000) "Ordering of Spontaneously Formed Buckles on Planar Surfaces," *Langmuir* 16:3497-3501.

Huie, J.C. (2003) "Guided Molecular Self-Assembly: A Review of Recent Efforts," *Smart Mater. Struct.* 12:264-271.

Huitema et al. (2001) "Plastic Transistors in Active-Matrix Displays," *Nature 414*:599.

Hur et al. (2005) "Organic Nanodelectrics for Low Voltage Carbon Nanotube Thin Film Transistors and Complementary Logc Gates," *J. Am. Chem. Soc. 127*:13808-13809.

Hur et al. (2005) "Printed thin-film transistors and complementary logic gates that use polymer-coated single-walled carbon nanotube networks," J. Appl. Phys., 98, 114302.

Hur et al. (Dec. 2004) "Nanotransfer Printing by Use of Noncovalent Surface Forces: Applications to Thin-Film Transistors that Use Single-Walled Carbon Nanotube Networks and Semiconducting Polymers," *Appl. Phys. Lett. 85*(23):5730-5732.

(56) References Cited

OTHER PUBLICATIONS

Hur et al. (Jun. 13, 2005) "Extreme Bendability of Single Walled Carbon Nanotube Networks Transferred From High-Temperature Growth Substrates to Plastic and Their Use in Thin-Film Transistors," *Appl. Phys. Lett.* 243502.

Hutchinson et al. (1992) "Mixed Mode Cracking in Layered Materials," *Adv. Appl. Mech.* 29:63-191.

Imparato et al. (2005) "Excimer Laser Induced Crystallization of Amorphous Silicon on Flexible Polymer Substrates," *Thin Solid Films* 487:58-62.

International Preliminary Report on Patentability for PCT Application No. PCT/US2010/060425, mailed May 25, 2011.

International Preliminary Report on Patentability for PCT Application PCT/US2009/067670, mailed Jun. 14, 2011.

International Preliminary Report on Patentability for PCT Application PCT/US2010/051196, mailed Apr. 12, 2012.

International Search Report and Written Opinion Corresponding to International Application No. PCT/US2012/053701 mailed Jan. 15, 2013.

International Search Report and Written Opinion corresponding to International Application No. PCT/US2012/058114 mailed Feb. 1, 2013.

International Search Report and Written Opinion dated Aug. 14, 2012, corresponding to International Patent Application No. PCT/US12/37973.

International Search Report and Written Opinion, Corresponding to Inernational Application No. PCT/US12/46930 mailed Dec. 10, 2012.

International Search Report and Written Opinion, Corresponding to International Application No. PCT/US10/50468, Mailed Jan. 6, 2011.

International Search Report and Written Opinion, Corresponding to International Application No. PCT/US10/60425, Mailed May 25, 2011.

International Search Report and Written Opinion, Corresponding to International Application No. PCT/2005/014449, Mailed Jul. 3, 2008.

International Search Report and Written Opinion, Corresponding to International Application No. PCT/US 07/77759, Mailed Apr. 11, 2008.

International Search Report and Written Opinion, Corresponding to International Application No. PCT/US07/74293, Mailed Jul. 24, 2008.

International Search Report and Written Opinion, Corresponding to International Application No. PCT/US07/77217, Mailed Jun. 3, 2008.

International Search Report and Written Opinion, Corresponding to International Application No. PCT/US07/82633, Mailed May 16, 2008.

International Search Report and Written Opinion, Corresponding to International Application No. PCT/US09/47442, Mailed Sep. 21, 2009.

International Search Report and Written Opinion, Corresponding to International Application No. PCT/US2006/032125, Mailed Mar. 21, 2008.

International Search Report and Written Opinion, Corresponding to International Application No. PCT/US2009/036192, Mailed Jul. 6, 2009.

International Search Report and Written Opinion, Corresponding to International Application No. PCT/US2009/058231, Mailed Nov. 17, 2009.

International Search Report and Written Opinion, Corresponding to International Application No. PCT/US2010/027209, Mailed Nov. 11, 2010.

International Search Report and Written Opinion, Corresponding to International Application No. PCT/US2010/034520, Mailed Sep. 24, 2010.

International Search Report and Written Opinion, Corresponding to International Application No. PCT/US2010/042585, Mailed May 25, 2011.

International Search Report and Written Opinion, Corresponding to International Application No. PCT/US2011/028094, Mailed Jul. 14, 2011.

International Search Report and Written Opinion, Corresponding to International Application No. PCT/US2012/039779, mailed Feb. 1, 2013.

International Search Report and Written Opinion, Corresponding to International PCT Application No. PCT/US05/19354 Mailed Apr. 18, 2007.

International Search Report and Written Opinion, Corresponding to International PCT Application No. PCT/US2006/021161, Mailed Feb. 28, 2008.

International Search Report and Written Opinion, Corresponding to International PCT Application No. PCT/US2007/077759, Mailed Apr. 11, 2008.

International Search Report and Written Opinion, Corresponding to International PCT Application No. PCT/US2007/079070, Mailed Apr. 23, 2008.

International Search Report and Written Opinion, Corresponding to International PCT US2010/061151.

International Search Report Corresponding to International Application No. PCT/US2009/036956, mailed Jun. 29, 2009.

International Search Report Corresponding to International Application No. PCT/US2011/031648, mailed Dec. 15, 2011.

International Search Report Corresponding to International Application No. PCT/US2012/028590, mailed Jun. 13, 2012.

International Search Report, Corresponding to International Application No. PCT/US2009/059892, mailed Jan. 7, 2010.

International Search Report, Corresponding to International Application No. PCT/US2009/064199, mailed May 20, 2011.

International Search Report, Corresponding to International Application No. PCT/US2009/065806, mailed Jun. 1, 2010.

International Search Report, Corresponding to International Application No. PCT/US2009/067670, mailed Aug. 4, 2010.

International Search Report, Corresponding to International Application No. PCT/US2010/020742, mailed Sep. 14, 2010.

International Search Report, Corresponding to International Application No. PCT/US2010/051196, mailed Dec. 1, 2010.

Isberg et al. (Sep. 6, 2002) "High Carrier Mobility in Single-Crystal Plasma-Deposited Diamond," *Science* 297:1670-1672.

Islam et al. (Jan. 16, 2003) "High Weight Fraction Surfactant Solubilization of Single-Wall Carbon Nanotubes in Water," *Nano Lett.* 3(2):269-273.

Ismach et al. (2004) "Atomic-Step-Templated Formation or a Single Wall Carbon Nanotube Patterns," *Angew. Chem. Int. Ed.* 43:6140-6143.

Itoh et al. (1991) "Cathodoluminescence Properties of Undoped and Zn-Doped $Al_xGa_{1-x}N$ Grown by Metaloganic Vapor Phase Epitaxy," *Jap. J. Appl. Phys.* 30: 1604-1608.

Jabbour et al. (2001) "Screen Printing for the Fabrication of Organic Light-Emitting Devices," *IEEE J. Select. Top. Quantum. Electron.* 7(5):769-773.

Jackman et al. (Aug. 4, 1995) "Fabrication of Submicrometer Features on Curved Substrates by Microcontact Printing," *Science* 269:664-666.

Jacobs et al. (2001) "Submicrometer Patterning of Charge in Thin-Film Electrets," Science 291:1763-1766.

Jacobs et al. (2002) "Fabrication of a Cylindrical Display by Patterned Assembly," *Science* 296:323-325.

Jain et al. (2000) "III-Nitrides: Growth, Characterization, and Properties," *J. Appl. Phys.*87:965-1006.

Jain et al. (2005) "Flexible Electronics and Displays: High-Resolution, Roll-to-Roll, Projection Lithography and Photoblation processing Technologies for Hiogh-Throughput Production," *Proc. IEEE* 93:1500-1510.

James et al. (1998) "Patterned Protein Layers on Solid Substrates by This Stamp Microcontact Printing," *Langmuir* 14:742-744.

Jang et al. (2003) "Lateral Growth of Aligned Multiwalled Carbon Nanotubes Under Electric Fiels," Solid State Commun. 126:305-308.

Jang et al. (2006) "Low-Voltage and High-Field-Effect Mobility Organic Transistors with a Polymer Insulator," *Appl. Phys. Lett.* 88:072101.

(56) References Cited

OTHER PUBLICATIONS

Javey et al. (2002) "High-K Dielectrics for Advanced Carbon-Nanotube Transistors and Logic Gates," *Nature Mater.* 1:241-246.

Javey et al. (2005) "High Performance n-Type Carbon Nanotube Field-Effect Transistors with Chemically Doped Contacts," Nano Lett., vol. 5, No. 2, pp. 345-348.

Javey et al. (Aug. 7, 2003) "Ballistic Carbon Nanotube Field-Effect Transistors," *Nature* 424:654-657.

Jenkins et al. (1994) "Gallium Arsenide Transistors: Realization Through a Molecularly Designed Insulator," *Science* 263:1751-1753.

Jeon et al. (1995) "Patterning of Dielectric Oxide Thin Layers by Microcontact Printing of Self-Assembled Monolayers," *J. Mater. Res.* 10:2996-2999.

Jeon et al. (2003) "Structural and Mechanical Properties of Woven Fabrics Employing Peirce's Model," Textile Res. J. 73:929-933.

Jeon et al. (2004) "Three Dimensional Nanofabrication with a rubber sub-wavelength optical element," Nanotechnology E-Bulletin, 2 pp.

Jeon et al. (Aug. 4, 2004) "Three Dimensional Nanofabrication with Rubber Stamps and Conformable Photomasks," *Adv. Mater.* 16(15):1369-1373.

Jiang et a. (Oct. 2, 2007) "Finite Deformation Mechanics in Buckled Thin Films on Compliant Supports," *Proc. Natl. Acad. Sci. USA* 104(40):15607-15612.

Jiang et al. (1999) "Preparation of Macroporous Metal Films from Colloidal Crystals," *J. Am. Chem. Soc.* 121:7957-7958.

Jiang et al. (2002) "Polymer-on-Polymer Stamping: Universal Approaches to Chemically Patterned Surfaces," *Langmuir* 18:2607-2615.

Jiang et al. (2007) "Mechanical Properties of Robust Ultrathin Silk Fibroin Films," Adv. Funct. Mater. 17:2229-2237.

Jin et al. (2004) "Scalable Interconnection and Integration of Nanowire Devices Without Registration," *Nano Lett.* 4:915-919.

Jin et al. (2004) "Soft Lithographic Fabrication of an Image Sensbor Array on a Curved Substrate," *J. Vac. Sci. Technol.* B 22:2548-2551.

Jin et al. (Aug. 2005) "Water-Stable Silk Films with Reduced β-Sheet Content," Adv. Funct. Mater. 15(8):1241-1247.

Jin et al. (Web Release Jan. 23, 2004) "Biomaterial Films of *Bombyx mori* Silk Fibroin with Poly(ethylene oxide)," Biomacromolecules 5(3):711-717.

Jiyun, C.H. (2003) "Guided Molecular Self-Assembly: A Review of Recent Efforts," Smart Mater. Struct. 12:264-271.

Joachim et al. (Nov. 30, 2000) "Electronics Using Hybrid-Molecular and Mono-Molecular Devices," *Nature* 408:541-548.

Johnson et al. (1999) "Ordered Mesoporous Polymers of Tunable Pore Size from Colloidal Silica Templates," *Science* 283:963-965.

Jones et al. (Jul./Aug. 2004) "Stretchable Wavy Metal Interconnects," *J. Vac. Sci. Technol.* A 22(4):1723-1725.

Joo et al. (2006) "Low-Temperature Solution-Phase Synthesis of Quantum Well Structures CdSe Nanoribbons," *J. Am. Chem. Soc.* 128(17):5632-5633.

Jortner et al. (2002) "Nanostructured Advanced Materials Perspectives and Directions," *Pure Appl. Chem.* 74(9):1491-1506.

Joselevich (2002) "Vectorial Growth of Metallic and Semiconducting Single-Wall Carbon Nanotubes," Nano Lett., vol. 2, No. 10, pp. 1137-1141.

Kadish et al. (1988) "Interaction of Fiber Orientation and Direction of Impulse Propagation with Anatomic Barriers in Anisotropic Canine Myocardium," Circulation. 78:1478-1494.

Kagan (1999) "Organic-Inorganic Hybrid Materials as Semiconducting Channels in Thin-Film Field-Effect Transistors," *Science* 286:945-947.

Kagan et al. (2001) "Patterning Organic-Inorganic Thin-Film Transistors Using Microcontact Printed Templates," *Appl. Phys. Lett.* 79(21):3536-3538.

Kagan et al. (2003) "Thin Film Transistors—A Historical Perspective," In; *Thin Film Transistors*, Dekker, New York, pp. 1-34.

Kane et al. (2000) "Analog and Digital Circuits Using Organic Thin-Film Transistors on Polyester Substrates," *IEEE Electron. Dev. Lett.* 21:534-536.

Kang et al. (2007) "High-Performance Electronics Using Dense, Perfectly Aligned Arrays of Single-Walled Carbon Nanotubes," *Nat. Nanotechnol.* 2:230-236.

Kang et al. (2007) "Printed Multilayer Superstructures of Aligned Single-Walled Carbon Nanotubes for Electronic Applications," Nano Lett. 7(11):3343-3348.

Kar et al. (Web Release Feb. 18, 2006) "Shape Selective Growth of CdS One-Dimensional Nanostructures by a Thermal Evaporation Process," *J. Phys. Chem.* B. 110(10):4542-4547.

Kar et al. (Web Release Feb. 8, 2005) "Controlled Synthesis and Photoluminescence Properties of ZnS Nanowires and Nanoribbons," *J. Phys. Chem.* B 109(8):3298-3302.

Kar et al. (Web Release Sep. 28, 2005) "Synthesis and Optical Properties of CdS Nanoribbons," *J. Phys. Chem* B. 109(41):19134-19138.

Karnik et al. (2003) "Lateral Polysilicon $p^+$-p-$n^+$ and $p^+$-n-$n^+$ Diodes," *Solid-State Electronics* 47:653-659.

Karnik et al. (2003) "Multiple Lateral Polysilicon Diodes as Temperature Sensors for Chemical Microreaction Systems," *Jpn. J. Appl. Phys.* 42:1200-1205.

Kato et al. (2004) The Characteristic Improvement of Si(111) Metal-Oxide-Semiconductor Field-Effect Transistor by Long-Time Hydrogen Annealing, *Jpn. J. Appl. Phys.* 43(10):6848-6853.

Katz et al. (2001) "Synthetic Chemistry for Ultrapure, Processable, and High-Mobility Organic Transistor Semiconductors," *Ace. Chem. Res.* 34:359-369.

Katz, H.E. (2004) "Recent Advances in Semiconductor Performance and Printing Processes for Organic Transistor-Based Electronics," *Chem. Mater.* 16:4748-4756.

Kawata et al. (2001) "Finer Features for Functional Microdevices," *Nature* 412:697-698.

Kellis et al. (2009) "Human Neocortical Electrical Activity Recorded on Nonpenetrating Microwire Arrays: Applicability for Neuroprostheses," Neurosurg. Focus 27(1):E9.

Kendall, D.L. (1979) "Vertical Etching of Silicon at Very High Apect Ratios," *Ann. Rev. Mater. Sci.* 9:373-403.

Khakani et al. (2006) "Lateral Growth of Single Wall Carbon Nanotubes on Various Substrates by Means of an 'All-Laser' Synthesis Approach," Diamond Relat. Mater. 15:1064-1069.

Khan et al. (1993) "High Electron Mobility Transistor Based on a GaN-$Al_xGa_{1-x}$N Heterojunction," *Appl. Phys. Lett.* 63:1214-1215.

Khang et al. (2006) "A Stretchable Form of Single-Crystal Silicon for High-Performance Electronics on Rubber Substraights," *Science* 311:208-212.

Kilby, J.S. (1976) "Invention of the Integrated Circuit," *IEEE Trans. Electron. Dev* 23:648-654.

Kim et al. (2000) "Field Emission from Carbon Nanotubes for Displays," *Diamond and Related Mater.* 9(3-6): 1184-1189.

Kim et al. (2002) "Nanolithography Based on Patterned Metal Transfer and its Application to Organic Electronic Devices," *Appl. Phys. Lett.* 80:4051-4053.

Kim et al. (2003) "Epitaxial self-assembly of block copolymers on lithographically defined nanopatterned substrates," *Nature* 424:411-414.

Kim et al. (2008) "Materials and Noncoplanar Mesh Designs for Integrated Circuits with Linear Elastic Responses to Extreme Mechanical Deformations," *Proc. Natl. Acad. Sci. USA* 105(48):18675-18680.

Kim et al. (2008) "Stretchable and Foldable Silicon Integrated Circuits," *Science* 320:507-511.

Kim et al. (2008) "Stretchable Electronics: Materials Strategies and Devices," Adv. Mater. 20:4887-4892.

Kim et al. (2009) "Integrated Wireless Neural Interface Based on the Utah Electrode array," Biomed. Microdevices 11:453-466.

Kim et al. (2009) "Optimized Structural Designs for Stretchable Silicon Integrated Circuits," Small 5(24):2841-2847.

Kim et al. (Dec. 2, 2008) "Materials and Noncoplanar Mesh Designs for Integrated Circuits with Linear Elastic Responses to Extreme Mechanical Deformations," Proc. Natl. Acad. Sci. USA 105(48):18675-18680.

Kim et al. (Jan. 2008) "Complementary Logic Gates and Ring Oscillators Plastic Substrates by Use of Printed Ribbons Single-Crystalline Silicon," *IEEE Electron. Dev. Lett.* 29(1):73-76.

(56) References Cited

OTHER PUBLICATIONS

Kim et al. (Nov. 15, 1999) "Direct Observation of Electron Emission Site on Boron-Doped Polycrystalline Diamond Thin Films Using an Ultra-High-Vacuum Scanning Tunneling Microscope," *Appl. Phys. Lett.* 75(20):3219-3221.

Kim et al. (Oct. 17, 2010) "Waterproof AlInGaP optoelectronics on stretchable substrates with applications in biomedicine and robotics," Nature Materials 9:929-937.

Kim et al. (Oct. 2004) "Organic TFT Array on a Paper Substrate," *IEEE Electron. Dev.Lett.* 25(10):702-704.

Kim et al. (Web Release Apr. 18, 2010) "Dissolvable Films of Silk Fibroin for Ultrathin Conformal Bio-Integrated Electronics," Nature Materials 9:511-517.

Kim et al. (Web Release Feb. 29, 2008) "Highly Emissive Self-Assembled Organic Nanoparticles Having Dual Color Capacity for Targeted Immunofluorescence Labeling," *Adv. Mater.* 20(6):1117-1121.

Kim et al. (Web Release Jul. 31, 2008) "Complementary Metal Oxide Silicon Integrated Circuits Incorporating Monolithically Integrated Stretchable Wavy Interconnects," Appl. Phys. Lett. 93(4):044102.

Kim et al. (Web Release Jul. 6, 2009) "Ultrathin Silicon Circuits with Strain-Isolation Layers and Mesh Layouts for High-Performance Electronics on Fabric, Vinyl, Leather and Paper," *Adv. Mater.* 21(36):3703-3707.

Kim et al. (Web Release Sep. 29, 2009) "Silicon Electronics on Silk as a Path to Bioresorbable, Implantable Devices," Appl. Phys. Lett. 95:133701-133703.

Kim et al., (2008) "Complimentary Metal Oxide Silicon Integrated Circuits Incorporating Monolithically Integrated Stretchable Wavy Interconnects," Appl Phys Lett, 93:044102.

Kim, Y.S. (Web Release Aug. 9, 2005) "Microheater-Integrated Single Gas Sensor Array Chip Fabricated on Flexible Polyimide Substrate," *Sens. Actuators* B 114(1):410-417.

Klauk et al. (2002) "High-Mobility Polymer Gate Dielectric Pentacene Thin Film Transistors," *J. Appl. Phys.* 92:5259-5263.

Klein-Wiele et al. (2003) "Fabrication of Periodic Nanostructures by Phase-Controlled Multiple-Beam Interference," *Appl. Phys. Lett.* 83(23):4707-4709.

Knipp et al. (2003) "Pentacine Thin Film Transistors on Inorganic Dielectrics: Morphology, Structural Properties, and Electronic Transport," *J Appl. Phys.* 93:347-355.

Ko et al. (2006) "Bulk Quantities of Single-Crystal Silicon Micro-/Nanoribbons Generated from Bulk Wafers," *Nano Lett.* 6(10):2318-2324.

Ko et al. (2008) "A Hemispherical Electronic Eye Camera Based on Compressible Silicon Optoelectronics," *Nature* 454:748-753.

Ko et al. (2010) "Flexible Carbon Nanofiber Connectors with Anisotropic Adhesion Properties," Small 6:22-26.

Ko et al. (Web Release Oct. 28, 2009) "Curvilinear Electronics Formed Using Silicon Membrane Circuits and Elastomeric Transfer Elements," *Small* 5(23):2703-2709.

Kocabas et al. (2004) "Aligned Arrays of Single-Walled Carbon Nanotubes Generated from Random Networks by Orientationally Selective Laser Ablation," Nano Lett., vol. 4, No. 12, pp. 2421-2426.

Kocabas et al. (2005) "Guided Growth of Large-Scale, Horizontally Aligned Arrays of Single-Walled Carbon Nanotubes and Their Use in Thin-Film Transstors," *Small* 1(11 ): 111 0-1116.

Kocabas et al. (2006) "Spatially Selective Guided Growth of High-Coverage Arrays and Random Networks of Single-Walled Carbon Nanotbes and Thir Integration into Electronic Devices," *J. Am. Chem. Soc.* 128:4540-4541.

Kocabas et al. (2006) "Large Area Aligned Arrays of SWNTs for High Performance Thin Film Transistors," American Physical Society, APS March Meeting, Mar. 13-17, Abstract # W31.004.

Kocabas et al. (2007) "Experimental and Theoretical Studies of Transport Through Large Scale, Partially Aligned Arrays of Single-Walled Carbon Nanotubes ni Thin Film Type Transistors," Nano Lett. 7(5):1195-1202.

Kocabas et al. (Feb. 5, 2008) "Radio Frequency Analog Electronics Based on Carbon Nanotube Transistors," *Proc. Natl. Acad. Sci. USA* 105(5):1405-1409.

Kodambaka et al. (2006) "Control of Si Nanowire Growth by Oxygen," *Nano Lett.* 6(6):1292-1296.

Koide et al. (2000) "Patterned Luminescence of Organic Light-Emitting Diodes by Hot Microcontact Printing (H1JCP) of Self-Assembled Monolayers," *J. Am. Chem. Soc.* 122:11266-11267.

Konagai et al. (1978) "High Efficiency GaAs Thin Film Solar Cells by Peeled Film Technology," *J. Cryst. Growth* 45:277-280.

Kong et al. (2004) "Single-Crystal Nanorings Formed by Epitaxial Self-Coiling of Polar Nanobelts," *Science* 303: 1348-1351.

Kong et al. (Jan. 28, 2000) "Nanotube Molecular Wires as Chemical Sensors," *Science* 287:622-625.

Kong et al. (Oct. 2003) "Structure of Indium Oxide Nanobelts," *Solid State Commun.* 128(1): 1-4.

Kong et al. (Oct. 29, 1998) "Synthesis of Individual Single-Walled Carbon Nanotubes on Patterned Silicon Wafers," *Nature* 395:878-881.

Kudo et al. (Web Release Jun. 13, 2006) "A Flexible and Wearable Glucose Sensor Based on Functional Polymers with Soft-MEMS Techniques," *Biosens. Bioelectron.* 22:558-562.

Kulkarni et al. (2002) "Mesoscale Organization of Metal Nanocrystals," *Pure Appl. Chem* 74(9):1581-1591.

Kumar et al. (1993) "Features of Gold Having Micrometer to Centimeter Dimensions can be Formed Through a Combination of Stamping with an Elastomeric Stamp and an Alkanethiol "Ink" Followed by Chemical Etching," *Appl. Phys. Lett.* 63(14):2002-2004.

Kumar et al. (1994) "Patterninq Self-Assembled Monolavers: Applications in Material Science," *Langmuir* 10:1498-1511.

Kumar et al. (2002) "Thermally-Stable Low-Resistance Ti/Al/Mo/Au Multilayer Ohmic Contacts on n-GaN," *J. Appl. Phys.* 92:1712-1714.

Kumar et al. (2005) "Percolating in Finite Nanotube Networks," Phys. Rev. Lett., 95, 066802.

Kuo et al. (1985) "Effect of Mismatch Strain on Band Gap in III-V Semiconductors," *J. Appl. Phys.* 57:5428-5432.

Kuykendall et al. (Aug. 2004) "Crystallographic Alignment of High Density Gallium Nitride Nanowire Arrays," *Nat. Mater.* 3:524-528.

Lacour et al. (2003) "Stretchable Gold Conductors on Elastomeric Substrates," *Appl. Phys. Lett.* 82(15):2404-2406.

Lacour et al. (2005) "Stretchable Interconnects for Elastic Electronic Surfaces," *Proc.IEEE* 93(8):1459-1467.

Lacour et al. (2010) "Flexible and Stretchable Micro-Electrodes for in Vitro and n Vivo Neural Interfaces," Med. Biol. Eng. Comput. 48:945-954.

Lacour et al. (Apr. 2004) "Design and Performance of Thin Metal Film Interconnects for Skin-Like Electronic Circuits," *IEEE Electron. Dev. Lett.* 25(4):179-181.

Lacour et al. (Dec. 2004) "An Elastically Stretchable TFT Circuit," *IEEE Electron Dev. Lett.* 25(12):792-794.

Lacour et al. (Web Release Jul. 14, 2006) "Stiff Subcircuit Islands of Diamondlike Carbon for Stretchable Electronics," *J. Appl. Phys.* 100:014913.

Lacour et al. (Web Release May 16, 2006) "Mechanisms of Reversible Stretchability of Thin Metal Films on Elastomeric Substrates," *Appl. Phys. Lett.* 88:204103.

Laimer et al. (Mar. 1997) "Diamond Growth in a Direct-Current Low-Pressure Supersonic Plasmajet," *Diamond Relat. Mater.* 6:406-410.

Lambacher et al. (2004) "Electrical Imaging of Neuronal Activity by Multi-Transistor-Array (MTA) Recording at 7.8 μm Resolution," *Appl. Phys. A* 79:1607-1611.

Landes et al. (2002) "Some Properties of Spherical and Rod-Shaped Semiconductorand Metal Nanocrystals," *Pure Appl. Chem.* 74(9):1675-1692.

Law et al. (2004) "Semiconductor Nanowires and Nanotubes," *Ann. Rev. Mater. Res.*34:83-122.

Law et al. (Aug. 27, 2004) "Nanoribbon Waveguides for Subwavelength PhotonicsIntegration," *Science* 305:1269-1273.

Lawrence et al. (2008) "Bioactive Silk Protein Biomaterial Systems for Optical Devices," Biomacromolecules 9:1214-1220.

(56) References Cited

OTHER PUBLICATIONS

Lay et al. (2004) "Simple Route to Large-Scale Ordered Arrays of Liquid-Deposited Carbon Nanotubes," Nano Lett., vol. 4, No. 4, pp. 603-606.
Leclercq et al. (1998) "II I-V Micromachined Devices for Microsystems," *Microelectronics J.* 29:613-619.
Lecomte et al. (Apr. 2006) "Degradation Mechanism of Diethylene Glycol Units in aTerephthalate Polymer," *Polym. Degrade. Stab.* 91(4):681-689.
Lee et al. (2000) "Thin Film Transistors for Displays on Plastic Substrates," *Solid State Electron.* 44:1431-1434.
Lee et al. (2003) "High-Performance Poly-Si TFTs on Plastic Substrates Using a Nano-Structured Separation Layer Approach," *IEEE Elec. Dev. Lett.* 24: 19-21.
Lee et al. (2004)"Organic Light-Emitting Diodes Formed by Soft Contact Lamination," *Proc. Natl. Acad. Sci. USA* 101(2):429-433.
Lee et al. (2005) "A Printable Form of Single-Crystalline Gallium Nitride for Flexable Optoelectronic Systems," *Small* 1:1164-1168.
Lee et al. (2005) "Large-Area, Selective Transfer of Microstructured Silicon (μs-Si): A Printing-Based Approach to High-Performance Thin-Film Transistors Supported on Flexible Substraights," *Adv. Mater.* 17:2332-2336.
Lee et al. (2006) "Micron and Submicron Patterning of Polydimethylsiloxane Resists on Electronic Materials by Decal Transfer Lithography and Reactive Ion-Beam Etching: Application to the Fabrication of High-Mobility, Thin-Film Transistors," Journal of Applied Physics 100. 0894907 (2006).
Lee et al. (Apr. 2005) "Fabrication of Stable Metallic Patterns Embedded in Poly(dimethylsiloxane) and Model Applications in Non-Planar Electronic and Lab-on a-Chip Device Patterning," *Adv. Funct. Mater.* 15(4):557-566.
Lee et al. (Dec. 1999) "The Surface/Bulk Micromachining (SBM) Process: A New Method For Fabricating Released MEMS in Single Crystal Silicon," *J. Microelectromech. Syst.* 8(4):409-416.
Lee et al. (Feb. 2001) "Application of Carbon Nanotubes to Field Emission Displays," *Diamond and Related Mater.* 10(2):265-270.
Lee et al. (Feb. 2005) "Weave Patterned Organic Transistors on Fiber for E-Textiles," *IEEE Trans. Electron. Dev.* 52(2):269-275.
Leong et al. (2009) "Tetherless Thermobiochemicall Actuated Microgrippers," Proc. Natl. Acad. Sci. USA 106:703-709.
Létant et al. (Jun. 2003) "Functionalized Silicon Membranes for Selective Bio-Organisms Capture," Nat. Mater. 2:391-395.
Li et al. (2002) "High-Resolution Contact Printing with Dendrimers," *Nano Lett.* 2(4):347-349.
Li et al. (2003) "Ultrathin Single-Crystalline-Silicon Cantilever Resonators: Fabrication Technology and Significant Specimen Size Effect on Young's Modulus," *Appl. Phys. Lett.* 83:3081-3083.
Li et al. (2004) "Electrospinning of Nanofibers: Reinventing the Wheel," *Adv. Mater.*16(14):1151-1170.
Li et al. (2006) "Catalyst-Assisted Formation of Nanocantilever Arrays on ZnS Nanoribbons by Post-Annealing Treatment," J. Phys. Chem. B 110(13):6759-6762.
Li et al. (Dec. 2005) "Compliant Thin Film Patterns of Stiff Materials as Platforms for Stretchable Electronics," *J. Mater. Res.* 20(12):3274-3277.
Li et al. (Jul. 1, 2002) "ZnO Nanobelts Grown on Si Substrate," *Appl. Phys. Lett.* 81 (1): 144-146.
Li et al. (Web Release Mar. 16, 2006) "Catalyst-Assisted Formation of Nanocantilever Arrays on ZnS Nanoribbons by Post-Annealing Treatment," *J. Phys. Chem. 8* 110(13):6759-6762.
Lieber, C. (2001) "The Incredible Shrinking Circuit," *Sci. Am.* 285(3):58-64.
Lieber, C.M. (2003) "Nanoscale Science and Technology: Building a Bog Future from Small Things," *MRS. 8ull.* 28:486-491.
Lim et al. (2005) "Flexible Membrance Pressure Sensor," *Sens. Act. A 119*:332-335.
Lima et al. (2007) "Creating Micro- and Nanostructures on Tubular and Spherical Surfaces," J. Vac. Sci. Technol. 825(6):2412-2418.
Lin et al. (2005) "High-Performance Carbon Nanotube Field-Effect Transistor with Tunable Polarities," *IEEE Trans. Nano* 4(5):481-489.

Linder et al. (1994) "Fabrication Technology for Wafer Through-Hole Interconnections and Three-Dimensional Stacks of Chips and Wafers," *Proc. IEEE Micro. Electro Mech. Syst. 349-354.*
Ling et al. (2004) "Thin Film Deposition, Patterning, and Printing in Organic Thin Film Transistors," *Chem. Mater.* 16:4824-4840.
Liu et al. (1999) "Controlled deposition of individual single-walled carbon nanotubes on chemically functionalized templates," Chem. Phys. Lett., 303:125-129.
Long et al. (1990) "Heterostructure FETs and Bipolar Transistors," In; *Gallium Arsenide Digital Integrated Circuit Design*, McGraw-Hill, New York, pp. 58-69.
Loo et al. (2002) "Additive, Nanoscale Patterning of Metal Films with a Stamp and a Surface Chemistry Mediated Transfer Process: Applications in Plastic Electronics," *Appl. Physics Lett.* 81 :562-564.
Loo et al. (2002) "High-Resolution Transfer Printing on GaAs Surfaces Using Alkane Dithiol Monolavers," *J. Vac. Sci. Technol.* B 20(6):2853-2856.
Loo et al. (2002) "Interfacial Chemistries for Nanoscale Transfer Printing," *J. Am. Chem. Soc.* 124:7654-7655.
Loo et al. (2002) "Soft, Conformable Electrical Contacts for Organic Semiconductors: High-Resolution Plastic Circuits by Lamination," *Proc. Natl. Acad. Sci. USA* 99(16): 10252-1 0256.
Loo et al. (2003) "Electrical Contacts to Molecular Layers by Nanotransfer Printing," *Nano Lett.* 3(7):913-917.
Lopes et al. (Sep. 2004) "Thermal Conductivity of PET/(LDPE/Al) Composites Determined by MDSC," *Polym. Test.*23(6):637-643.
Lu et al. (Apr. 2010) "Water-Insoluble Silk Films with Silk I Structure," Acta Biomater. 6(4):1380-1387.
Lu et al. (Dec. 2006) "Electronic Materials—Buckling Down for Flexible Electronics," *Nat. Nanotechnol.* 1: 163-164.
Lu et al. (Jul. 19, 2005) "One Dimensional Hole Gas in Germanium/Silicon Nanowire Heterostructures," *Proc. Nat. Acad. Sci. USA* 102(29):10046-10051.
Lu et al. (Nov. 2008) "Nanowire Transistor Performance Limits and Applications," *IEEE Trans Electron Dev.* 55(11 ):2859-2876.
Luan et al. (1992) "An Experimental Study of the Source/Drain Parasitic Resistance Effects in Amorphous Silicon Thin Film Transistors," *J. Appl. Phys.* 72:766-772.
Ma et al. (2004) "Single-Crystal CdSe Nanosaws," *J. Am. Chem. Soc.* 126(3):708-709.
Mack et al. (2006) "Mechanically Flexible Thin-Film Transistors that Use Ultrathin Ribbons of Silicon Derived from Bulk Wafers," *Appl. Phvs. Lett.* 88:213101.
Madou, M. (1997) "Etch-Stop Techniques," In; *Fundamentals of Microfabrication*, CRC Press, New York, pp. 193-199.
Maikap et al. (2004) "Mechanically Strained-Si NMOSFETs," *IEEE Electron. Dev. Lett.* 25:40-42.
Maldovan et al. (2004) "Diamond-Structured Photonic Crystals," *Nature Materials* 3:593-600.
Mandlik et al. (Aug. 2006) "Fully Elastic Interconnects on Nanopatterned Elastomeric Substrates," *IEEE Electron Dev. Lett.* 27(8):650-652.
Manna et al. (Web Release May 25, 2003) "Controlled Growth of Tetrapod-Branched Inorganic Nanocrystals," *Nat. Mater.* 2:382-385.
Markovich et al. (1999) "Architectonic Quantum Dot Solids," *Ace. Chem. Res.* 32:415-423.
Marquette et al. (2004) "Conducting Elastomer Surface Texturing: A Path to Electrode Spotting Application to the Biochip Production," *Biosens. Bioelectron.* 20:197-203.
Martensson et al. (2004) "Nanowire Arrays Defined by Nanoimprint Lithography," *Nano Lett.* 4:699-702.
Martin, C.R. (1995) "Template Synthesis of Electronically Conductive Polymer Nanostructures," *Ace. Chem. Res.* 28:61-68.
Mas-Torrent et al. (2006) "Large Photoresponsivity in High-Mobility Single-Crystal Organic Field-Effect Phototransistors," *ChemPhysChem* 7:86-88.
Masuda et al. (2000) "Fabrication of Ordered Diamonds/Metal Nanocomposite Structures," *Chem. Lett.* 10:1112-1113.
Matsunaga et al. (2003) "An Improved GaAs Device Model for the Simulation of Analog Integrated Circuit," *IEEE Trans. Elect. Dev.* 50:1194-1199.

(56) References Cited

OTHER PUBLICATIONS

McAlpine et al. (2003) "High-Performance Nanowire Electronics and Photonics on Glass and Plastic Substrates," *Nano Lett.* 3:1531-1535.
McAlpine et al. (2005) "High-Performance Nanowire Electronics and Photonics and Nanoscale Patterning on Flexible Plastic Substrates," *Proc. IEEE* 93:1357-1363.
McCaldin et al. (1971) "Diffusivity and Solubility of Si in the Al Metallization of Integrated Circuits," *Appl. Phys. Lett.* 19:524-527.
Mehring C. et al. (2003) Inference of hand movements from local field potentials in monkey motor cortex. Nature Neurosci. 6, 1253-1254.
Meisel et al. (2004) "Three-Dimensional Photonic Crystals by Holographic Lithography Using the Umbrella Configuration: Symmetries and Complete Photonic Band Gaps," *Phys. Rev.* B. 70:165101:1-10.
Meitl et al. (2004) "Solution Casting and Transfer Printing Single-Walled Carbon Nanotube Films," *Nano Lett.* 4(9):1643-1947.
Meitl et al. (2006) "Transfer Printing by Kinetic Control of Adhesion to an Elastomeric Stamp," *Nat. Mater.* 5:33-38.
Meitl et al. (Web Release Feb. 22, 2007) "Stress Focusing for Controlled Fracture in Microelectromechanical Systems," *Appl. Phys. Lett.* 90:083110.
Melosh et al. (2003) "Ultrahigh-Density Nanowire Lattices and Circuits," *Science* 300:112-115.
Menard et al. (2004) "A Printable Form of Silicon for High Performance Thin Film Transistors on Plastic Substrates," *Appl. Phys. Lett.* 84:5398-5400.
Menard et al. (2004) "High-Performance n- and p-Type Single-Crystal Organic Transistors with Free-Space Gate Dielectrics," *Adv. Mat.* 16:2097-2101.
Menard et al. (2004) "Improved Surface Chemistries, Thin Film Deposition Techniques, and Stamp Designs for Nanotransfer Printing," *Langmuir* 20:6871-6878.
Menard et al. (2005) Bendable Single Crystal Silicon Thin Film Transistors Formed by Printing on Plastic Substrates *Appl. Phys. Lett.* 86:093507.
Menard et al. (2007) Micro- and Nanopatterning Techniques for Organic Electronic and Optoelectronic Systems, *Chem. Rev.* 107:1117-1160.
Miao et al. (2003) "Micromachining of Three-Dimensional GaAs Membrane Structures Using High-Energy Nitrogen Implantation," *J. Micromech. Microenq.* 13:35-39.
Michalske et al. (1985) "Closure and Repropagation of Healed Cracks in Silicate Glass," *J. Am. Ceram. Soc.* 68:586-590.
Michel et al. (2001) Printing Meets Lithography: Soft Approaches to High-Resolution Patterning, IBM *J. Res. Dev.* 45(5):697-719.
Miller et al. (2002) "Direct Printing of Polymer Microstructures on Flat and Spherical Surfaces Using a Letterpress Technique," *J. Vac. Sci. Technol.* B 20(6):2320-2327.
Milliron et al. (2004) "Colloidal Nanocrystal Heterostructures with Linear and Branched Topoloqy," *Nature* 430:190-195.
Min, G. (Apr. 4, 2003) "Plastic Electronics and Their Packaging Technologies," *Syn. Metals.* 135:141-143.
Minev et al. (2010) "Impedance Spectroscopy on Stretchable Microelectrode Arrays," *Appl. Phys. Lett.* 97:043707.
Mirkin et al. (Jul. 2001) "Emerging Methods for Micro- and Nanofabrication," *MRS Bull.* 26(7):506-507.
Misewich et al. (May 2, 2003) "Electronically Induced Optical Emission from a Carbon Nanotube FET," *Science* 300:783-786.
Mishra et al. (2002) "AlGaN/GaN HEMTs—an Overview of Device Operation and Applications," *Proc. IEEE* 90:1022-1031.
Mitzi et al. (2004) "High-Mobility Ulltrathin Semiconducting Films Prepared by Spin Coating," *Nature* 428:299-303.
Moon et al. (2002) "Ink-Jet Printing of Binders for Ceramic Compinents," *J. Am. Ceram. Soc.* 85(4):755-762.
Moore et al. (Sep. 9, 2003) "Individually Suspended Single-Walled Carbon Nanotubes in Various Surfactants," *Nano Lett.* 3(10):1379-1382.

Morales et al. (Jan. 9, 1998) "A Laser Ablation Method for the Synthesis of Crystalline Semiconductor Nanowires," *Science* 279:208-211.
Morent et al. (2007) "Adhesion Enhancement by a Dielectric Barrier Discharge of PDMS used for Flexible and Stretchable Electronics," *J. Phys. D. Appl. Phys.* 40:7392-7401.
Mon et al. (1978) "A New Etching Solution System, H3P04-H2O2-H2O, for GaAs and Its Kinetics," *J. Electrochem. Soc.* 125:1510-1514.
Morkoc et al. (1995) "High-Luminosity Blue and Blue-Green Gallium Nitride Light-Emitting Diodes," *Science* 267:51-55.
Morkved et al. (1994) "Mesoscopic Self-Assembly of Gold Islands on Diblock-Copolymer Films," *Appl. Phys. Lett.* 64:422-424.
Morra et al. (1990) "On the Aging of Oxygen Plasma-Treated Polydimethylsiloxane Surfaces," *J. Colloid Interface Sci.* 137:11-24.
Murakami et al. (2005) "Polarization Dependence of the Optical Absorption of Single-Walled Carbon Nanotubes," *Phys. Rev. Lett.*, 94, 087402.
Murphy et al. (2008) "Modification of Silk Fibroin Using Diazonium Coupling Chemistry and the Effects on hMSC Proliferation and Differentiation," *Biomaterials* 29:2829-2838.
Namazu et al. (2000) "Evaluation of Size Effect on Mechanical Properties of Single Crystal Silicon by Nanoscale Bending Test Using AFM," *J. MEMS* 9:450-459.
Nanotube Films, *Nano Lett.* 4(9):1643-1647.
Nath et al. (2002) "Nanotubes of the Disulfides of Groups 4 and 5 Metals," *Pure Appl. Chem.* 74(9):1545-1552.
Nathan et al. (2000) "Amorphous Silicon Detector and Thin Film Transistor Technology for Large-Area Imaging of X-Rays,." *Microelectron J.* 31 :883-891.
Nathan et al. (2002) "Amorphous Silicon Technology for Large Area Digital X-Ray and Optical Imaging," *Microelectronics Reliability* 42:735-746.
Newman et al. (2004) "Introduction to Organic Thin Film Transistors and Design of n-Channel Organic Semiconductors," *Chem. Mater.* 16:4436-4451.
Nirmal et al. (1999) "Luminescence Photophysics in Semiconductor Nanocrystals," *Ace. Chem. Res.* 32:407-414.
Noda et al. (1996) "New Realization Method for Three-Dimensional Photonic Crystal in Optical Wavelength Region," *Jpn. J. Appl. Phys.* 35:L909-L912.
Nomura et al. (2004) "Room-Temperature Fabrication of Transparent Flexible Thin-Film Transistors Using Oxide Semiconductors," *Nature* 432:488-492.
Notice of Allowance corresponding to Korean Patent Application No. 10-20102-7010094, dated Feb. 25, 2013—includes English translation.
Notice of Allowance, Corresponding to U.S. Appl. No. 11/423,287, Mailed Jan. 12, 2009.
Notice of Allowance, Corresponding to U.S. Appl. No. 12/723,475, mailed on Oct. 14, 2011.
Notice of Allowance, U.S. Appl. No. 12/686,076, mailed Oct. 5, 2012.
Notice of Allowance, U.S. Appl. No. 11/851,182, mailed Feb. 16, 2012.
Notice of Allowance, U.S. Appl. No. 12/405,475, mailed Mar. 1, 2012.
Notice of Allowance, U.S. Appl. No. 12/616,922, mailed Oct. 19, 2012.
Notice of Final Rejection for Japanese Patent Application No. 2007-515549, dated Sep. 19, 2012.
Notice of Preliminary Rejection corresponding to Korean Patent Application No. 10-2007-7000216, dated Feb. 21, 2013—includes English translation.
Notice of Preliminary Rejection corresponding to Korean Patent Application No. 10-2012-7030789, dated Feb. 25, 2013—includes English translation.
Notice of Reasons for Rejection corresponding to Japanese Patent Application No. P2006-165159, Dispatched Apr. 24, 2012—includes English translation.
Notice of Reasons for Rejection corresponding to Japanese Patent Application No. P2008-514820, Dispatched May 8, 2012—includes English translation.

(56) References Cited

OTHER PUBLICATIONS

Notice of Reasons for Rejection corresponding to Japanese Patent Application No. P2009-546361, Dispatched Jul. 3, 2012—includes English translation.
Notice of Reasons of Rejection corresponding to Japanese Patent Application No. 2009-527564, mailed Jan. 29, 2013.
Notification Concerning Transmittal of International Preliminary Report on Patentability, Corresponding to International Application No. PCT/US2009/059892, mailed Jan. 7, 2010.
Notification Concerning Transmittal of International Preliminary Report on Patentability, Corresponding to International Application No. PCT/US2009/064199, mailed May 17, 2011.
Notification of Grant of Patent Right and Notice of Registration corresponding to Chinese Patent App. No. 200780041127.6 issued Dec. 26, 2012.
Novoselov et al. (Oct. 22, 2004) "Electric Field Effect in Atomically Thin Carbon Films," Science 306:666-669.
O'Riordan et al. (2004) "Field Configured Assembly: Programmed Manipulation and Self-Assembly at the Mesoscale," Nano Lett. 4:761-765.
O'Connell et al. (Jul. 26, 2002) "Band Gap Fluorescence from Individual Single-Walled Caarbon Nanotubes," Science 297:593-596.
Odom et al. (2002) "Improved Pattern Transfer in Soft Lithography Using Compasite Stamps," Langmuir 18:5314-5320.
Office Action and Response, Corresponding to Malaysian Patent Publication No. PI 20052553, dated Feb. 24, 2012 and Feb. 28, 2012.
Office Action and Response, Corresponding to U.S. Appl. No. 11/423,287, Mailed Feb. 13, 2008.
Office Action and Response, Corresponding to U.S. Appl. No. 11/421,654, Mailed Sep. 29, 2009.
Office Action and Response, Corresponding to U.S. Appl. No. 11/858,788, Mailed Beginning Jan. 28, 2011.
Office Action Corresponding to Chinese Patent Application No. 200780041127.6, issued Apr. 8, 2011.
Office Action Corresponding to Chinese Patent Application No. 200780049982.1, Issued May 12, 2010.
Office Action Corresponding to European Patent Application No. 05755193.9, issued Jul. 7, 2011.
Office Action for U.S. Appl. No. 11/851,182 mailed Apr. 1, 2010.
Office Action for U.S. Appl. No. 12/405,475 mailed Jun. 8, 2011.
Office Action for U.S. Appl. No. 12/636,071 mailed Jan. 3, 2013.
Office Action for U.S. Appl. No. 13/441,598 mailed Jan. 14, 2013.
Office Action, Corresponding to Chinese Patent Application No. 200580013574.1, Issued May 11, 2010.
Office Action, Corresponding to Taiwan Patent Application No. 095121212, Issued May 7, 2010.
Office Action, Corresponding to U.S. Appl. No. 11/423,287, Mailed Feb. 13, 2008.
Office Action, Corresponding to U.S. Appl. No. 11/851,182, Mailed Apr. 1, 2010.
Office Action, Corresponding to U.S. Appl. No. 11/851,182, Mailed Jun. 7, 2011.
Office Action, Corresponding to U.S. Appl. No. 12/686,076.
Office Action, Corresponding to U.S. Appl. No. 11/421,654, Mailed Sep. 29, 2009.
Office Action, Corresponding to U.S. Appl. No. 11/981,380, Mailed Sep. 23, 2010.
Office Action, Corresponding to U.S. Appl. No. 12/398,811 mailed Nov. 26, 2012.
Office Action, Corresponding to U.S. Appl. No. 12/616,922, mailed Apr. 9, 2012.
Office Action, Corresponding to U.S. Appl. No. 12/636,071, mailed Jun. 6, 2012.
Office Action, Corresponding to U.S. Appl. No. 12/778,588 mailed Jan. 8, 2013.
Office Actions, Corresponding to Chinese Patent Application No. 200580018159.5, Issued Jan. 23, 2009 and Feb. 12, 2010.
Office Actions, Corresponding to U.S. Appl. No. 11/145,542, Mailed between Apr. 5, 2007 and Dec. 23, 2008.
Ohzono et al. (Web Release Jul. 7, 2005) "Geometry-Dependent Stripe Rearrangement Processes Induced by Strain on Preordered Microwrinkle Patterns," Langmuir 21(16):7230-7237.
Omenetto et al. (2008) "A New Route for Silk," Nature Photon. 2:641-643.
Ong et al. (2004) "High-Performance Semiconducting Poolythiophenes for Organic Thin-Film Transistors," J. Am. Chem. Soc. 126:3378-3379.
Ong et al. (2005) "Design of High-Performance Regioreular Polythiophenes for Organic Thin-Film Transistors," Proc. IEEE 93:1412-1419.
Origin Energy (May 2004) "Fact Sheet—Sliver Cells," www.oriqinenergY.com.au/sliver Ouyang et al. (2002) "High-Performance, Flexible Polymer Light-Emitting Diodes Fabricated by a Continuous Polymer Coating Process," Adv. Mat. 14:915-918.
Ouyang et al. (2002) "High-Performance, Flexible Polymer Light-Emitting Diodes Fabricated by a Continuous Polymer Coating Process," Adv. Mat. 14:915-918.
Ouyang et al. (2008) "High Frequency Properties of Electro-Textiles for Wearable Antenna Applications," IEEE Trans. Antennas Propaq. 56(2):381-389.
Ouyang et al. (Web Release Mar. 20, 2000) "Conversion of Some Siloxane Polymers to Silicon Oxide by UV/Ozone Photochemical Processes," Chem. Mater. 12(6): 1591-1596.
Overholt et al. (2005) "Photodynamic Therapy for Esophageal Cancer using a 180° Windowed Esophageal Balloon," Lasers in Surg. Med. 14:27-33.
Pan et al. (2001) "Nanobelts of Semiconducting Oxides," Science 291: 1947-1949.
Panev et al. (2003) "Sharp Exciton Emission from Single InAs Quantum Dots in GaAs Nanowires," Appl. Phys. Lett. 83:2238-2240.
Pardo et al. (2000) "Application of Screen Printing in the Fabrication of Organic Ligh-Emitting Devices," Adv. Mater. 12(17):1249-1252.
Park et al. (1997) "Block Copolymer Lithography: Periodic Arrays of –10 Holes in 1 Square Centimeter," Science 276:1401-1404.
Park et al. (1998) "Fabrication of Three-Dimensional Macroporous Membranes with Assemblies of Microspheres as Templates," Chem. Mater. 10:1745-1747.
Park et al. (Aug. 2009) "Printed Assemblies of Inorganic Light-Emitting Diodes for Deformable and Semitransparent Displays," Science 325:977-981.
Park et al. (Web Release Feb. 22, 2009) "Biodegradable Luminescent Porous Silicon Nanoparticles for in Vivo Applications," Nature Mater. 8:331-336.
Parker et al. (2009) "Biocompatible Silk Printed Optical Waveguides," Adv. Mater. 21:2411-2415.
Patolsky et al. (2006) "Detection, Stimulation, and Inhibition of Neuronal Signals with High-Density Nanowire Transistor Arrays," Science 313:1100-1104.
Patton et al. (Mar. 1998) "Effect of Diamond like Carbon Coating and Surface Topography on the Performance of Metal Evaporated Magnetic Tapes," IEEE Trans Magn. 34(2):575-587.
Paul et al. (Apr. 2003) "Patterning Spherical Surfaces at the Two Hundred Nanometer Scale Using Soft Lithography," Adv. Func. Mater. 13(4):259-263.
Pearton et al. (1999) "GaN: Processing, Defects, and Devices," J. Appl. Phys. 86:1-78.
Peng et al. (Mar. 2, 2000) "Shape Control of CdSe Nanocrystals," Nature 404:59-61.
Perry et al. (2008) "Nano- and Micropatterning of Optically Transparent, Mechanically Robust, Biocompatible Silk Fibroin Films," Adv. Mater. 20:3070-3072.
Piazza et al. (2005) "Protective Diamond-Like Carbon Coatings for Future Optical Storage Disks," Diamond Relat. Mater. 14:994-999.
Pimparkar et al. (Feb. 2007) "Current-Voltage Characteristics of Long-Channel Nanobundle Thin-Film Transistors: A 'Bottom-Up' Perspective," IEEE Electron Dev. Lett. 28(2):157-160.
Podzorov et al. (2005) "Hall Effect in the Accumulation Layers on the Surface of Orgaic Semiconductors," Phys. Rev. lett. 95:226601.
Pushpa et al. (2002) "Stars and Stripes. Nanoscale Misfit Dislocation Patterns on Surfaces," Pure Appl. Chem. 74(9):1663-1671.
Qian et al. (2006) "Scaling Effects of Wet Adhesion in Biological Attachment Systems," Acta Biomaterialia 2:51-58.

(56) References Cited

OTHER PUBLICATIONS

Quake et al (2000) "From Micro- to Nanofabrication with Soft Materials," *Science 290*: 1536-1540.
Radtke et al. (Feb. 5, 2007) "Laser-Lithography on Non-Planar Surfaces," *Opt. Exp. 15*(3):1167-1174.
Raman et al. (1989) "Study of Mesa Undercuts Produced in GaAs with H3PO4-Based Etchants," J. Electrochem. Soc. 136:2405-2410.
Randall et al. (2005) "Permeation-driven flow in poly(dimethylsiloxane) microfluidic devices," Proc. Nat. Acad. Sci. USA 102(31):10813-10818.
Rao et al. (2003) "Large-scale assembly of carbon nanotubes," Nature, 425:36-37.
Razavi et al. (2009) "Three Dimensional Nanopillar Array Photovoltaics on Low Cost and Flexible Substrates," Nature Materials 8:648-653.
Razeghi et al. (1994) "High-Power Laser Diodes Based on InGaAsP Alloys," *Nature 369*:631-633.
Razouk et al. (Sep. 1979) "Dependence of Interface State Density on Silicon Thermal Oxidation Process Variables," J. Electrochem. Soc. 126(9):1573-1581.
Reuss et al. (2005) "Macroelectronics: Perspectives on Technology and Applications," Proc. IEEE 93:1239-1256.
Reuss et al. (Jun. 2006) "Macroelectronics," *MRS Bull*. 31 :447-454.
Ribas et al. (1998) "Bulk Micromachining Characterization of 0.2 μm HEMT MMIC Technology for GaAs MEMS Design," Mater. Sci. Eng. B 51 :267-273.
Ridley et al. (1999) "All-Inorganic Field Effect Transistors Fabricated by Printing," Science 286:746-749.
Roberts et al. (1979) "Looking at Rubber Adhesion," *Rubber Chem. Technol. 52*:23-42.
Roberts et al. (May 2006) "Elastically Relaxed Free-Standing Strained-Silicon Nanomembranes," Nat. Mater. 5:388-393.
Robinson et al. (1983) "GaAs Readied for High-Speed Microcircuits," *Science 219*:275-277.
Roelkens et al. (Dec. 2005) "Integration of InP/InGaAsP Photodetectors onto Siliconon-Insulator Waveguide Circuits," Optics Express 13(25):10102-10108.
Rogers et al. (1997) "Using an Elastomeric Phase Mask for Sub-100 nm Photolithography in the Optical Near Field," Appl. Phys. Lett. 70:2658-2660.
Rogers et al. (1998) "Generating ~90 Nanometer Features Using Near Field Contact Mode Photolithography with an Elastomeric Phase Mask," J. Vac. Sci. Technol. 16(1 ):59-68.
Rogers et al. (1998) "Quantifying Distortions in Soft Lithography," *J. Vac. Sci. Technol. 16*:88-97.
Rogers et al. (1998) "Using Printing and Molding Techniques to Produce Distributed Feedback and Bragg Reflector Resonators for Plastic Lasers," Appl. Phys. Lett. 73: 1766-1768.
Rogers et al. (1999) "Printing Process Suitable for Reel-to-Reel Production of High-Performance Organic Transistors and Circuits, Adv. Mater. 11 (9):741-745.
Rogers et al. (2000) "Organic Smart Pixels and Complementart Inverter Circuits Formed on Plastic Substrates by Casting and Rubber Stamping," IEEE Electron Dev. Lett. 21 (3): 100-103.
Rogers et al. (2001) "Paper-Like Electronic Displays: Large-Area Rubber-Stamped Plastic Sheets of Electronics and Microencapsulated Electrophoretic Inks," Proc. Nat/Acad. Sci. USA 98:4835-4840.
Rogers et al. (2002) "Printed Plastic Electronics and Paperlike Displays," *J. Polym. Sci. Part A. Polym. Chem. 40*:3327-3334.
Rogers, J. (Jul. 9, 2010) "Farewell to Flatland," Science 329:138139.
Rogers, JA (2001) "Rubber Stamping for Plastic Electronics and Fiber Optics," *MRS Bulletin 26*(7):530-534.
Rogers, JA (2001) "Toward Paperlike Displays," *Science* 291: 1502-1503.
Rosenblatt et al. (2002) "High Performance Electrolyte Gated Carbon Nanotube Transistors," Nano Lett. 2(8):869-872.
Rotkin et al. (2003) "Universal Description of Channel Conductivity for Nanotube and Nanowire Transistors," Appl. Phys. Lett. 83:1623-1625.
Roundy et al. (2003) "Photonic Crystal Structure with Square Symetry within EachLayer and a Three-Dimensional Band Gap," Appl. Phys Lett. 82:3835-3837.
Rubehn et al. (2009) "A MEMS based Flexible Multichannel ECoG-Electrode Array," J. Neural Eng. 6:036003.
Ruchehoeft et al. (2000) "Optimal Strategy for Controlling Linewidth on Spherical Focal Surface Arrays," J. Vac. Sci. Technol. B 18(6):3185-3189.
Ryu et al. (2009) "Human Cortical Prostheses: Lost in Translation?" Neurosurg Focus 27(1):E5.
Samuelson et al. (2004) "Semiconductor Nanowires for Novel One-Dimensional Devices," Physica E 21 :560-567.
Sangwal et al. (1997) "Nature of multilayer steps on the {100} cleavage planes of MgO single crystals," Surf. Sci., 383:78-87.
Santin et al. (1999) "In vitro Evaluation of the Inflammatory Potential of the Silk Fibroin," J. Biomed. Mater. Res. 46:382-389.
Sanyal et al. (2002) "Morphology of Nanostructures Materials," *Pure Appl. Chem. 74*(9): 1553-1570.
Sazonov et al. (2005) "Low-Temperature Materials and Thin-Film Transistors for Flexible Electronics," Proc. IEEE 93:1420-1428.
Scherlag et al. (1969) "Catheter Technique for Recording His Bundle Activity in Man," Circulation 39:13-18.
Schermer et al. (2005) "Thin-Film GaAs Epitaxial Lift-Off Solar Cells for Space Applications," Prog. Photovolt. Res. Appl. 13:587-596.
Schermer et al. (2006) "Photon Confinement in High-Efficiency, Thin Film II I-V Solar Cells Obtained by Epitaxial Lift-Off," Thin Solid Films 211-512:645-653.
Schindl et al. (2003) "Direct Stimulatory Effect of Low-Intensity 670-nm Laser Irradiation on Human Endothelial Cell Proliferation," Br. J. Dermatol. 148:334-336.
Schlegel et al. (2002) "Structures of quartz (1010)- and (1011)-water interfaces determined by X-ray reflectivity and atomic force microscopy of natural growth surfaces," Geochim. Cosmochim. Acta, vol. 66, No. 17, pp. 3037-3054.
Schmid et al. (2003) "Preparation of Metallic Films on Elastomeric Stamps and Their Application for Contact Processing and Contact Printing," Adv. Funct. Mater. 13:145-153.
Schmid et al. (Mar. 25, 2000) "Siloxane Polymers for High-Resolution, High-Accuracy Soft Lithography," Macromolecules 33(8):3042-3049.
Schmid et al. (May 11, 1998) "Light-Coupling Masks for Lensless, Sub-wavelength Optical Lithography," Appl. Phys. Lett. 72(19):2379-2381.
Schmidt et al. (Mar. 8, 2001) "Thin Solid Films Roll up into Nanotubes," *Nature 410*:168.
Schnable et al. (1969) "Aluminum Metallization; Advantages and Limitations for Integrated Circuit Applications," IEEE 57: 1570-1580.
Schneider et al. (2008) "Mechanical Properties of Silicones for MEMS," *J. Micromech. Microeng. 18*:065008.
Schon et al. (1995) "Ambipolar Pentacene Field-Effect Transistors and Inverters," Science 287: 1022-1 023.
Schrieber et al. (1998) "The Effectiveness of Silane Adhesion Promotors in the Performance of Polyurethane Adhesives," J. Adhesion 68:31-44.
Scorzoni et al. (Oct. 4, 2004) "On the Relationship Between the Temperature coefficient of Resistance and the Thermal Conductance of Integrated Metal Resistors," Sens Actuators A 116( 1): 137-144.
Search and Examination Report, Corresponding to Singapore Patent Application No. 200607372-0, Mailed Oct. 17, 2007.
Search Report and Examination Report Corresponding to Singapore Patent Application No. 200901178-4, completed Mar. 13, 2010.
Search Report Corresponding to Singapore Patent Application No. SG 200607372-0, Mailed Oct. 17, 2007.
Search Report Corresponding to Taiwanese Application No. 095121212, completed Oct. 8, 2010.
Search Report, Corresponding to Republic of China (Taiwan) Patent Application No. 094118507, Dated Feb. 24, 2007.
Second Substantive Office Action corresponding to Chinese Patent Application No. 20100519400.5 issued on Oct. 30, 2012.
Seidel et al. (2004) "High-Current Nanotube Transistors," Nano Lett., vol. 4, No. 5, pp. 831-834.

(56) References Cited

OTHER PUBLICATIONS

Sekitani et al. (2005) "Bending Experimant on Pentacene Field-Effect Transistors on Plastic Films," Appl. Phys. Lett. 86:073511.
Sekitani et al. (2009) "Stretchable Active-Matrix Organic Light-Emitting Diode Display Using Printable Elastic Conductors," Nature Mater. 8:494-499.
Sekitani et al. (Sep. 12, 2008) "A Rubberlike Stretchable Active Matrix Using Elastic Conductors," Science 321:1468-1472.
Sen et al. (2002) "Nonequilibrium Processes for Generating Silicon Nanostructures in Single-Crystalline Silicon," Pure Appl. Chem. 74(9):1631-1641.
Serikawa et al. (May 1, 2000) "High-Mobility Poly-Si Thin Film Transistors Fabricated on Stainless-Steel Foils by Low-Temperature Processes Using Sputter-Depositions," Jpn. J. Appl. Phys. 39:L393-L395.
Servanti et al. (2005) "Functional Pixel Circuits for Elastic AMOLED displays," *Prac. IEEE 93*:1257-1264.
Service, R.F. (Aug. 15, 2003) "Electronic Textiles Charge Ahead," *Science* 301:909-911.
Shan et al. (2004) "From Si Source Gas Directly to Positioned, Electrically Contacted Si Nanowires: The Self-Assembling 'Grow-in-Place' Approach," Nano Lett. 4(11):2085-2089.
Sharp et al. (2003) "Holographic Photonic Crystals with Diamond Symmetry," *Phys. Rev. B 68*:205102/1-205102/6.
Sheraw et al. (2002) "Organic Thin-Film Transistor-Driven Polymer-Dispersed Liquid Crystal Displays on Flexible Polymeric Substrates," Appl. Phys. Lett. 80: 1088-1 090.
Shetty et al. (2005) "Formation and Characterization of Silicon Films on Flexible Polymer Substrates," Mater. Lett. 59:872-875.
Shi et al. (2001) "Free-Standing Single Crystal Silicon Nanoribbons," J. Am. Chem. Soc. 123(44):11095-11096.
Shi et al. (Sep. 2000) "Synthesis of Large Areas of Highly Oriented, Very Long Silicon Nanowires," Adv. Mater. 12(18):1343-1345.
Shi et al. (Web Release Oct. 11, 2001) "Free-Standing Single Crystal Silicon Nanoribbons," J. Am. Chem. Soc. 123(44):11095-11096.
Shin et al. (2003) "PDMS-Based Micro PCR Chip with Parylene Coating," J. Micromech. Microeng. 13:768-774.
Shtein et al. (Oct. 15, 2004) "Direct Mask-Free Patterning of Molecular Organic Semiconductors Using Organic Vapor Jet Printing," J. Appl. Phys. 96(8):4500-4507.
Shull et al. (1998) "Axisymmetric Adhesion Tests of Soft Materials," *Macramol. Chem. Phys.199*:489-511.
Siegel et al. (2009) "Thin, lightweight, Foldable Thermochromic Displays on Paper," Lab Chip 9:2775-2781.
Siegel et al. (2010) "Foldable Printed Circuit Boards on Paper Substrates," Adv. Funct. Mater. 20:28-35.
Siegel et al. (Web Release Feb. 7, 2007) "Microsolidics: Fabrication of Three-Dimensional Metallic Microstructures in Poly(dimethylsiloxane)," Adv. Mater. 19(5):727-733.
Sim et al. (1993) "An Analytical Back-Gate Bias Effect Model for Ultrathin SOI CMOS Devices," IEEE Trans. Elec. Dev. 40:755-765.
Sirringhaus et al. (2003) "Inkjet Printing of Functional Materials," *MRS Bull. 28*:802-806.
Sirringhaus et al. (Dec. 15, 2000) "High-Resolution Inkjet Printing of All-Polymer Transistor Circuits," Science 290:2123-2126.
Sirringhaus, H. (2005) "Device Physics of Solution-Processed Organic Field-Effect Transistors," Adv. Mater. 17:2411-2425.
Smay et al. (2002) "Colloidal Inks for Directed Assembly of 3-D Periodic Structures," Langmuir 18:5429-5437.
Smith et al. (2000) "Electric-Field Assisted Assembly and Alignment of Metallic Nanowires," Appl. Phys. Lett. 77(9):1399-1401.
Snow et al. (2003) "Random networks of carbon nanotubes as an electronic material," Appl. Phys. Lett., vol. 82, No. 13, pp. 2145-2147.
Snow et al. (2005) "High-mobility carbon-nanotube transistors on a polymeric substrate," Appl. Phys. Lett., 86, 033105.
So et al. (2008) Organic Light-Emitting Devices for Solid-State Lighting, MRS Bull. 33:663-669.
Sofia et al. (2001) "Functionalized Silk-Based Biomaterials for Bone Formation," J. Biomed. Mater. Res. 54:139-148.
Someya et al. (2005) "Conformable, Flexible, Large-Area Networks of Pressure and Thermal Sensors with Organic Transistor Active Matrixes," Proc. Nat. Acad. Sci. USA 102:12321-12325.
Someya et al. (2005) "Integration of Organic FETs with Organic Photodiodes for a Large Area, Flexible, and Lightweight Sheet Image Scanners," IEEE Trans. Electron Devices 52:2502-2511.
Someya et al. (Jul. 6, 2004) "A Large-Area, Flexible Pressure Sensor Matrix With Organic Field-Effect Transistors for Artificial Skin Applications," Proc. Nat. Acad. Sci. USA 101 (27):9966-9970.
Someya, T. (Aug. 7, 2008) "Electronic Eyeballs," Nature 454:703-704.
Soole et al. (Mar. 1991) "InGaAs Metal-Semiconductor-Metal Photodetectors for Long Wavelength Optical Communications," IEEE J. Quantum Electron. 27(3):737-752.
Soong et al. (1984) "Adverse Reactions to Virgin Silk Sutures in Cataract Surgery," Ophthalmology 91:479-483.
Srinivasan et al. (Web Release Mar. 26, 2007) "Piezoelectric/Ultrananocrystalline Diamond Heterostructures for High-Performance Multifunctional Micro/Nanoelectromechanical Systems," Appl. Phys. Lett. 90: 1341 01.
Stafford et al. (2004) "A Buckling-Based Metrology for Measuring the Elastic Moduli of Polymeris Thin Films," Nature Mater. 3:545-550.
Star et al. (2004) "Nanotube Optoelectric Memory Devices," Nano Lett., vol. 4, No. 9, pp. 1587-1591.
Stella Newsletter IV, Stretchable Electronics for Large Area Applications [online: Apr. 29, 2011] http://www.stella-project.de/Portals/0/Stella_Newsletter_6.pdf.
Storm et al. (Web Release Jul. 13, 2003) "Fabrication of Solid-State Nanopores with Single-Nanometre Precision," Nat. Mater. 2:537-540.
Streetman et al. (2000) "Intrinsic Material," In; Solid State Electronic Devices, 5th Ed., Prentice Hall; Upper Saddle River, NJ; pp. 74-75.
Strukov et al. (2005) "CMOL FPGA: A Reconfigurable Architecture for Hybrid Digital Circuits with Two-Terminal Nanodevices," Nanotechnology 16:888-900.
Su et al. (2000) "Lattice-Oriented Growth of Single-Walled Carbon Nanotubes," J. Phys. Chem. B 104(28):6505-6508.
Sum et al. (2009) "Near-Infrared Spectroscopy for the Detection of Lipid Core Coronary Plaques," Curr. Cardiovasc. Imag. Rep. 2:307-315.
Sumant et al. (Apr. 2005) "Toward the Ultimate Tribological Interface: Surface Chemistry and Nanotribology of Ultrananocrystalline Diamond," Adv. Mater 17(8):1039-1045.
Sun et al. (2004) "Fabricating Semiconductor Nano/Microwires and Transfer Printing Ordered Arrays of them onto Plastic Substrates," *Nano Lett.* 4: 1953-1959.
Sun et al. (2005) "Advances in Organic Field-Effect Transistors," *J. Mater. Chem.15*:53-65.
Sun et al. (2005) "Bendable GaAs Metal-Semiconductor Field-Effect Transistors Formed with a Printed GaAs Wire Arrays on Plastic Substrates," Appl. Phys. Lett. 87:083501.
Sun et al. (2005) "Photolithographic Route to the Fabrication of Micro/Nanowires of II I-V Semiconductors," Adv. Funct. Mater. 15:30-40.
Sun et al. (2007) "Inorganic Semiconductors for Flexible Electronics," *Adv. Mater. 19*:1897-1916.
Sun et al. (2007) "Structural Forms of Single Crystal Semiconductor Nanoribbons for High-Performance Stretchable Electronics," J. Mater Chem. 17:832-840.
Sun et al. (2007) "Controlled Buckling of Semiconductor Nanoribbons for Stretchable Electronics," Nat. Nanotechnol. 1:201-207.
Sun et al. (Nov. 2006) "Buckled and Wavy Ribbons of GaAs for High-Performance Electronics on Elastomeric Substrates," Adv. Mater. 18(21):2857-2862.
Sun et al. (Web Release Dec. 5, 2006) "Controlled Buckling of Semiconductor Nanoribbons for Stretchable Electronics," Nature Nanotech. 1:201-207.
Sundar et al. (2004) "Elastomeric Transistor Stamps: Reversible Probing of Charge Transport in Organic Crystals," Science 303: 1644-1646.
Suo et al. (Feb. 22, 1999) "Mechanics of Rollable and Foldable Film-on-Foil Electronics," Appl. Phys. Lett. 74(8):11771179.

(56) References Cited

OTHER PUBLICATIONS

Supplemental European Search Report for European Application 07 84 1968, completed Mar. 31, 2011.
Supplementary European Search Report dated Jun. 15, 2012, corresponding to European Patent Application No. 09 71 6695.
Supplementary European Search Report, Corresponding to European Application No. 04 81 2651, Completed Oct. 19, 2010.
Supplementary European Search Report, Corresponding to European Application No. EP 05 75 6327, Completed Sep. 25, 2009.
Swain et al. (2004) "Curved CCD Detector Devices and Arrays for Multi-Spectral Astrophysical Application and Terrestrial Stereo Panoramic Cameras," Proc. SPIE 5499:281-301.
Sweet: Stretchable and Washable Electronics for Embedding Textiles. Available at http://tfcg.elis.ugent.be/projects/sweet. Access Feb. 8, 2012.
Sze et al. (1985) *Semiconductor Devices, Physics and Technology*, $2^{nd}$ ed., Wiley, New York, pp. 190-192.
Sze, S. (1985) "Lithography and Etching," In; *Semiconductor Devices: Physics and Technology*, New York: *Wiley*, pp. 428-467.
Sze, S. (1988) VLSI Technology, Chapter 8, ION Implantation, Mcgraw-Hill, 327-374, 566-611.
Sze, S. (1994) "Semiconductor Sensor Technologies," In; *Semiconductor Sensors,John Wiley and Sons*: New York pp. 17-95.
Takamoto et al. (Jan. 20, 1997) "Over 30% Efficient InGaP/GaAs Tandem Solar Cells," Appl. Phys. Lett. 70(3):381-383.
Talapin et al. (Oct. 7, 2005) "PbSe Nanocrystal Solids for n- and p-Channel Thin Film Field-Effect Transistors," Science 310:86-89.
Tan et al. (Apr. 12, 2004) "Performance Enhancement of InGaN Light Emitting Diodes by Laser-Lift-off and Transfer from Sapphire to Copper Substrate," Appl. Phys. Lett. 84(15):2757-2759.
Tanase et al. (2002) "Magnetic Trapping and Self-Assembly of Multicomponent Nanowires," J. Appl. Phys. 91 :8549-8551.
Tang et al. (2005) "One-Dimensional Assemblies of Nanoparticles: Preparation,Properties, and Promise," Adv. Mater. 17:951-962.
Tao et al. (2003) "Langmuir-Blodgett Silver Nanowire Monolayers for Molecular Sensing Using Surface-Enhanced Raman Spectroscopy," Nano Lett. 3:1229-1233.
Tate et al. (2000) "Anodization and Microcontact Printing on Elotroless Silver: Solution-Based Fabrication Procedures for Low-Voltage Electronic Systems with Organic Active Components," Langmuir 16:6054-6060.
Teshima et al. (2001) "Room-Temperature Deposition of High-Purity Silicon Oxide Films by RF Plasma-Enhanced CVD," Surf. Coat. Technol. 146-147:451-456.
Theiss et al. (1998) "PolySilicon Thin Film Transistors Fabricated at 100° C. on a Flexible Plastic Substrate," IEDM 98:257-260.
Thornwood et al. (Oct. 1, 1990) "Utilizing Olptical Lithography in the Sub-Micron Dimensional Regime," IBM Tech. Disc. Bull. 33(5):187-188.
Timko et al. (2009) "Electrical Recording from Hearts with Flexible Nanowire Device Arrays," Nano Lett. 9:914-918.
Toader et al. (2004) "Photonic Band Gap Architectures for Holographic lithography," Phy. Rev. Lett. 043905/1-043905/4.
Toader et al. (2004) "Photonic Band Gaps Based on Tetragonal Lattices of Slanted Pores," Phys. Rev. Lett. 90:233901/1-233901/4.
Tong (1999) "Stresses in Bonded Wafers," In; *Semiconductor Wafer Bonding: Science and Technology, John Wiley*; New York, pp. 187-221.
Tong (1999) Semiconductor Wafer Bonding: Science and Technology, John Wiley; New York, pp. 187-221.
Trau et al. (1997) "Microscopic Patterning of Orientated Mesoscopic Silica Through Guided Growth," Nature 390:674-676.
Trentler et al. (1995) "Solution-liquid-Solid Growth of Crytalline III-V Semiconductors: An Analogy to Vapor-liquid-Solid Growth," Science 270:1791-1794.
Tseng et al. (Web Release Dec. 19, 2003) "Monolithic Integration of Carbon Nanotube Devices with Silicon MOS Technology" Nano Lett. 4(1):123-127.

Ucjikoga, S. (2002) "Low-Temperature Polycrystalline Silicon Thin-Film Transistor Technologies of System-on-Glass Displays," MRS Bull. 27:881-886.
Upon the Schottky Barrier Height of Au/n-GaAs and Ti/n-GaAs Diodes, *Semicond. Sci. Technol. 19*:1391-1396.
Urruchi et al. (2000) "Etching of DLC Films Using a Low Intensity Oxygen Plasma Jet," Diamond Relat. Mater. 9:685-688.
US Office Action for U.S. Appl. No. 12/575,008 mailed Feb. 17, 2011.
Vanhollenbeke et al. (2000) "Compliant Substrate Technology: Integration of Mismatched Materials for Opto-Electronic Applications," Prog. Cryst. Growth Charact. Mater. 41(1-4):1-55.
Velev et al. (1997) "Porous silica via colloidal crystallization," *Nature 389*:447-448.
Vepari et al. (Aug. Sep. 2007) "Silk as a Biomaterial," Prog. Polym. Sci. 32(8-9):991-1007.
Vilan et al. (2000) "Molecular Control Over Au/GaAs Diodes," *Nature 404*:166-168.
Vinck et al. (2003) "Increased Fibroblast Proliferation Induced by Light Emitting Diode and Low Power Laser Irradiation," Lasers Med. Sci. 18:95-99.
Viventi et al. (Mar. 2010) "A Conformal, Bio-Interfaced Class of Silicon Electronics for Mapping Cardiac Electrophysiology," Sci. Trans. Med. 2(24):24ra22.
Vlasov et al. (2001) "On-Chip Natural Assembly of Silicon Photonic Bandgap Crystals," Nature 414:289-293.
Voss, D. (2000) "Cheap and Cheerful Circuits," *Nature 407*:442-444.
Wagner et al. (2003) "Silicon for Thin-Film Transistors," *Thin Solid Films* 430: 15-19.
Wagner et al. (2005) "Electronic Skin: Architecture and Components," *Physica E* 25:326-334.
Wagner et al. (Mar. 1, 1964) "Vapor-liquid-Solid Mechanism of Single Crystal Growth," Appl. Phys. Lett. 4(5):89-90.
Waksman et al.(2008) "Photopoint Photodynamic Therapy Promotes Stabilization of Atherosclerotic Plaques and Inhibits Plaque Progression," J. Am. Coll. Cardiol. 52:1024-1032.
Wang et al. (2003) "A Solution-Phase, Precursor Route to Polycrystalline $SnO_2$ Nanowores That Can Be Used for Gas Sensing under Ambient Conditions," J. Am. Chem. Soc. 125:16176-16177.
Wang et al. (2005) "Oxidation Resistant Germanium Nanowires: Bulk Synthesis, Long Chain Alkanethiol Functionalization, and Langmuir-Blodgett Assembly," J. Am. Chern. Soc. 127(33):11871-11875.
Wang et al. (2005) "Electronically Selective Chemical Functionalization of Carbon Nanotubes: Correlation between Raman Spectral and Electrical Responses," J. Am. Chem. Soc., 127:11460-11468.
Wang et al. (2006) "Direct Synthesis and Characterization of CdS Nanobelts," *Appl. Phys. Lett.* 89:033102.
Wang et al. (Aug.-Sep. 2008) "In Vivo Degradation of Three-Dimensional Silk Fibroin Scaffolds," Biomaterials 29(24-25):3415-3428.
Waxman et al. (2009) "In vivo Validation of a Catheter-Based Near-Infrared Spectroscopy System for Detection of Lipid Core Coronary Plaques: Initial Results of the Spectacl Study," J. Am. Coll. Cardiol. Img. 2:858-868.
Waxman, S. (2008) "Near-Infrared Spectroscopy for Plaque Characterization," J. Interv. Cardiol. 21:452-458.
Whang et al. (2003) "Large-Scale Hierarchical Organization of Nanowire Arrays for Integrated Nanosystems," Nano Lett. 3(9): 1255-1259.
Williams et al. (Oct. 2006) "Growth and Properties of Nanocrystalline Diamond Films," Phys. Stat. Sol. A 203(13):3375-3386.
Williams et al. (Web Release Jan. 23, 2006) "Comparison of the Growth and Properties of Ultranocrystalline Diamond and Nanocrystalline Diamond," Diamond Relat. Mater. 15:654-658.
Willner et al. (2002) "Functional Nanoparticle Architectures for Senoric, Optoelectronic, and Bioelectronic Applications," Pure Appl. Chem. 74(9): 1773-1783.
Wilson et al. (2006) "ECoG Factors Underlying Multimodal Control of a Brain-Computer Interface," IEEE Trans. Neural Syst. Rehabil. Eng. 14:246-250.

(56) References Cited

OTHER PUBLICATIONS

Wind et al. (May 20, 2002) "Vertical Scaling of Carbon Nanotube-Field-Effect Transitors Using Top Gate Electrodes," Appl. Phys. Lett. 80(20):3871-3819.

Wise et al. (Jul. 2008) "Microelectrodes, Microelectronics, and Implantable Neural Microsystems," Proc. IEEE 96(7):1184-1202.

Won et al. (2004) "Effect of Mechanical and Electrical Stresses on the Performance of an a-Si:H TFT on Plastic Substrate," J. Electrochem. Soc. 151:G167-G170.

Wong-Riley et al. (2005) "Photobiomodulation Directly Benefits Primary Neurons Functionally Inactivated by Toxins," J. Biol. Chem. 280:4761-4771.

Woodburn et al. (1996) "Phototherapy of Cancer and Atheromatous Plaque with Texaphyrins," J. Clin. Laser Med. Surg. 14:343-348.

Written Opinion of the International Search Authority Corresponding to International patent Application No. PCT/US05/19354 Issued Apr. 18, 2007.

Wu et al. (2001) "Amorphous Silicon Crystallization and Polysilicon Thin Film Transistors on $SiO_2$ Passivated Steel Foil Substrates," Apple. Surf. Sci 175-176:753-758.

Wu et al. (2001) "Thermal Oxide of Polycrystalline Silicon on Steel Foil as a Thin-Film Transitor Gate Dielectric," Appl. Phys. Lett. 78:3729-3731.

Wu et al. (2001) "Direct Observation of Vapor-Liquid-Solid Nanowire Growth," J. Am. Chem. Soc. 123(13):3165-3166.

Wu et al. (2002) "Growth of Au-Catalyzed Ordered GaAs Nanowire Arrays by Molecular-Beam Epitaxy," Appl. Phys. Lett. 81:5177-5179.

Wu et al. (2002) "Inorganic Semiconductor Nanowires: Rational Growth, Assembly, and Novel Properties," Chem. Eur. J. 8(6):1261-1268.

Wu et al. (2003) "Growth, Branching, and Kinking of Molecular-Beam Epitaxial (110) GaAs Nanowires," Appl. Phys. Lett. 83:3368-3370.

Wu et al. (Jul. 1, 2004) "Single-Crystal Metallic Nanowires and Metal/Semiconductor Nanowire Heterostructures," Nature 430:61-65.

Wu et al. (Nov. 2002) "Complementary Metal-Oxide-Semiconductor Thin-Film Transistor Circuits from a High-Temperature Polycrystalline Silicon Process on Steel Foil Substrates," IEEE Trans. Electr. Dev. 49(11): 1993-2000.

Wu et al. (Web Release Jan. 19, 2002) "Block-by-Block Growth of Single-Crystalline Si/SiGe Superlattice Nanowires," Nano Lett. 2(2):83-86 Si/SiGe Superlattice Nanowires, Nano Lett. 2(2):83-86.

Wu et al. (Web Release Mar. 13, 2001) "Direct Observation of Vapor-Liquid-Solid Nanowire Growth," J. Am. Chern. Soc. 123(13):3165-3166.

Xia et al. (1996) "Shadowed Sputtering of Gold on V-Shaped Microtrenches Etched in Silicon and Applications in Microfabrication," Adv. Mater. 8(9):765-768.

Xia et al. (1998) "Soft Lithography," Annu. Rev. Mater. Sci. 28:153-184.

Xia et al. (1999) "Unconventional Methods for Fabricating and Patterning Nanostructures," Chem. Rev. 99: 1823-1848.

Xia et al. (2003) "One-Dimensional Nanostructures: Synthesis, Characterization and Applications," Adv. Mater. 15:353-389.

Xia et al. (Jul. 19, 1996) "Complex Optical Surfaces Formed by Replica Molding Against Elastomeric Masters," Science 273:347-349.

Xiang et al. (Mar. 25, 2006) "Ge/Si Nanowire Heterostructures as High-Performance Field-Effect Transistors," Nature 441:489-493.

Xiao et al. (2003) "High-mobility thin-film transistors based on aligned carbon nanotubes," Appl. Phys. Lett., vol. 83, No. 1, pp. 150-152.

Xie et al. (May 2003) "Polymer-Controlled Growth of $Sb_2Se_3$ Nanoribbons Via a Hydrothermal Process," J. Cryst. Growth 252(4):570-574.

Xin et al. (Jun. 2005) "Evaluation of Polydimethylsiloxane Scaffolds with Physiologically-Relevant Elastic Moduli: Interplay of Substrate Mechanics and Surface Chemistry Effects on Vascular Smooth Muscle Cell Response," Biornaterials 26(16):3123-3129.

Yang et al. (1997) "Mesoporous Silica with Micrometer-Scale Desgns," Adv. Mater. 9:811-814.

Yang et al. (2000) "Stability of Low-Temperature Amorphous Silicon Thin Film Transistors Formed on Glass and Transparent Plastic Substrates," J. Vac. Sci. Technol. B 18:683-689.

Yang et al. (2002) "Creating Periodic Three-Dimensional Structures by Multibeam Interface of Visible Laser," Chem. Mater. 14:2831-2833.

Yang et al. (Dec. 2007) "RFID Tag and RF Structures on a Paper Substrate Using Inkjet-Printing Technology," IEEE Trans. Microw. Theory Tech. 55(12):2894-2901.

Yang, P. (2005) "The Chemistry and Physics of Semiconductor Nanowires," MRS Bull. 30:85-91.

Yanina et al. (2002) "Terraces and ledges on (001) spinel surfaces," Surf. Sci., 513:L402-L412.

Yao et al. (2008) "Seeing Molecules by Eye: Surface Plasmon Resonance Imaging at Visible Wavelengths with High Spatial Resolution and Submonolayer Sensitivity," Angew. Chem. 47:5013-5017.

Yao et al. (2010) "Functional Nanostructured Plasmonic Materials," Adv. Mater. 22:1102-1110.

Yao et al. (Mar. 2000) "High-Field Effect Electrical Transport in Single-Walled Carbon Nanotubes," Phys. Rev. Lett. 84(13):2941-2944.

Yeager et al. (Aug. 30, 2008) "Characterization of Flexible ECoG Electrode Arrays for Chronic Recording in Awake Rats," J. Neurosci. Methods 173(2):279-285.

Yeh et al. (1994) "Fluidic Self-Assembly for the Integration of GaAs light-Emitting Diodes on Si Substrates," IEEE Photon. Technol. Lett. 6:706-708.

Yin et al. (2000) "A Soft lithography Approach to the Fabrication of Nanostructures of Single Crystalline Silicon with Well-Defined Dimensions and Shapes," Adv. Mater. 12:1426-1430.

Yin et al. (2005) "Colloidal Nanocrystal Synthesis and the Organic-Inorganic Interface," Nature 437:664-670.

Yoon et al. (2005) "Low-Voltage Organic Field-Effect Transistors and Inverters Enabled by Ultrathin Cross-linked Polymers as Gate Dielectrics," J. Am. Chern. Soc. 127: 10388-10395.

Yu et al. (2000) "Silicon Nanowires: preparation, Device Fabrication, and Transport Properties," J. Phys. Chem. B 104(50):11864-11870.

Yu et al. (2003) "Solution-liquid-Solid Growth of Soluble GaAs Nanowires," Adv. Mater. 15:416-419.

Yu et al. (2003) "Two- Versus Three-Dimensional Quantum Confinement in Indium Phosphide Wires and Dots," Nat. Mater. 2:517-520.

Yu et al. (2004) "The Yield Strength of Thin Copper Films on Kapton," J. Appl. Phys. 95:2991-2997.

Yuan et al. (2006) "High-Speed Strained-Single-Crystal-Silicon Thin-Film Transistors on Flexible Polymers," J. Appl. Phys. 100:013708.

Yurelki et al. (Jul. 24, 2004) "Small-Angle Neutron Scattering from Surfactant-Assisted Aqueous Dispersions of Carbon Nanotubes," J. Am. Chem. Soc. 126(32):9902-9903.

Zakhidov et al. (1998) "Carbon Structure with Three-Dimensional Periodicity at Optical Wavelengths," Science 282:897-901.

Zaumseil et al. (2003) "Nanoscale Organic Transistors that use Source/Drain Electrodes Supported by High Resolution Rubber Stamps," Appl. Phys. Lett. 82(5):793-795.

Zaumseil et al. (2003) "Three-Dimensional and Multilayer Nanostructures Formed by Nanotransfer Printing," Nano Lett. 3(9):1223-1227.

Zhang et al. (2001) "Electric-field-directed growth of aligned single-walled carbon nanotubes," Appl. Phys. Lett., vol. 79, No. 19. pp. 3155-3157.

Zhang et al. (2005) "Low-Temperature Growth and Photoluminescence Property of ZnS Nanoribbons," J. Phys. Chem. B 109(39):18352-18355.

Zhang et al. (Apr. 2003) "Oxide-Assisted Growth of Semiconducting Nanowires," Adv. Mater. 15(7-8):635-640.

Zhang et al. (Apr. 5, 2004) "Structure and Photoiluminescence of ZnSe Nanoribbons Grown by Metal Organic Chemical Vapor Deposition," Appl. Phys. Lett. 84(14):2641-2643.

(56) References Cited

OTHER PUBLICATIONS

Zhang et al. (Feb. 9, 2006) "Electronic Transport in Nanometre-Scale Silicon-on-Insulator Membranes," Nature 439:703-706.

Zhang et al. (Jun. 6, 2006) "Anomalous Coiling of SiGe/Si and SiGe/Si/Cr Helical Nanobelts," Nano Lett. 6(7):1311-1317.

Zhao et al. (Mar. 2007) "Improved Field Emission Properties from Metal-Coated Diamond Films," Diamond Relat Mater. 16(3):650-653.

Zheng et al. (1998) "Sudden Cardiac Death in the United States, 1989 to 1998," Circulation 104, 2158-2163.

Zheng et al. (2004) "Shape- and Solder-Directed Self-Assembly to Package Semiconductor Device Segments," Appl. Phys. Lett. 85:3635-3637.

Zheng et al. (Aug. 31, 2004) "Sequential Shape-and-Solder-Directed Self Assembly of Functional Microsystems," Proc. Natl. Acad. Sci. USA 101(35):12814-12817.

Zhou et al. (2002) "An Efficient Two-Photon-Generated Photoacid Applied to Positive-Tone 3D Microfabrication," Science 296:1106-1109.

Zhou et al. (2004) "p-Channel, n-Channel Thin Film Transistors and p-n Diodes Based on Single Wall Carbon Nanotube Networks," Nano Lett. 4:2031-2035.

Zhou et al. (2005) "Band Structure, Phonon Scattering, and the Performance Limit of Single-Walled Carbon Nanotube Transistors," Phys. Rev. Lett. 95:146805.

Zhou et al. (2005) "Mechanism for Stamp Collapse in Soft Lithography," *Appl. Phys.Lett.* 87:251925.

Zhu et al. (2005) "Spin on Dopants for High-Performance Single Crystal Silicon Transistors on Flexible Plastic Substrates," Applied Physics Letters 86, 133507 (2005).

Zipes et al. (2006) "ACC/AHA/ESC 2006 Guidelines for Management of Patients With Ventricular Arrhythmias and the Prevention of Sudden Cardiac Death: A Report of the American College of Cardiology/American Heart Association Task Force and the European Society of Cardiology Committee for Practice Guidelines (Writing Committee to Develop Guidelines for Management of Patients With Ventricular Arrhythmias and the Prevention of Sudden Cardiac Death," Circulation 114:385-484.

International Search Report and Written Opinion, corresponding to International Application No. PCT/US13/64152, mailed Jan. 2, 2014.

Demura et al., "Immobilization of Glucose Oxidase with *Bombyx mori* Silk Fibroin by Only Stretching Treatment and its Application to Glucose Sensor," Biotechnology and Bioengineering, vol. 33, 598-603 (6 pages) (1989).

Halsted, "Ligature and Suture Material," Journal of the American Medical Association, vol. LX, No. 15, 1119-1126, (8 pages) (Apr. 12, 1913).

International Preliminary Report on Patentability, PCT/US2013/064152, 12 pages, date of issuance Apr. 14, 2015.

International Search Report, PCT/US2013/064152, 3 pages, date of mailing Jan. 2, 2014.

International Written Opinion, PCT/US2013/064152, 11 pages, date of mailing Jan. 2, 2014.

Kim et al., "Complementary Metal Oxide Silicon Integrated Circuits Incorporating Monolithically Integrated Stretchable Wavy Interconnects," Applied Physics Letters, vol. 93, 044102-044102.3 (3 pages) (Jul. 31, 2008).

Kim et al., "Dissolvable Films of Silk Fibroin for Ultrathin Conformal Bio-Integrated Electronics," Nature, 1-8 (8 pages) (Apr. 18, 2010).

Kim et al., "Materials and Noncoplanar Mesh Designs for Integrated Circuits with Linear Elastic Responses to Extreme Mechanical Deformations," PNAS, vol. 105, No. 48, 18675-18680 (6 pages) (Dec. 2, 2008).

Kim et al., "Stretchable and Foldable Silicon Integrated Circuits," Science, vol. 320, 507-511 (5 pages) (Apr. 25, 2008).

Ko et al., "A Hemispherical Electronic Eye Camera Based on Compressible Silicon Optoelectronics," Nature, vol. 454, 748-753 (6 pages) (Aug. 7, 2008).

Lawrence et al., "Bioactive Silk Protein Biomaterial Systems for Optical Devices," Biomacromolecules, vol. 9, 1214-1220 (7 pages) (Nov. 4, 2008).

Meitl et al., "Transfer Printing by Kinetic Control of Adhesion to an Elastomeric Stamp," Nature, vol. 5, 33-38 (6 pages) (Jan. 2006).

Omenetto et al., "A New Route for Silk," Nature Photonics, vol. 2, 641-643 (3 pages) (Nov. 2008).

Omenetto et al., "New Opportunities for an Ancient Material," Science, vol. 329, 528-531 (5 pages) (Jul. 30, 2010).

Tsukada et al., "Structural Changes of Silk Fibroin Membranes Induced by Immersion in Methanol Aqueous Solutions," Journal of Polymer Science, vol. 32, 961-968 (8 pages) (1994).

Wang et al., "Controlled Release From Multilayer Silk Biomaterial Coatings to Modulate Vascular Cell Responses" Biomaterials, 29, 894-903 (10 pages) (Nov. 28, 2008).

\* cited by examiner

E

D

EMBEDDING THIN CHIPS IN POLYMER

CROSS-REFERENCES TO RELATED APPLICATIONS

This application claims priority to U.S. provisional application Ser. No. 61/711,629, filed Oct. 9, 2012, entitled "Embedding Thinned Chips and Interconnects in Flex Polymer," which is hereby incorporated herein by reference in its entirety, including drawings.

BACKGROUND

Traditional integrated circuit (IC) chips are generally thick and rigid. In addition, they are mounted on printed circuit boards (PCBs) that are as thick, if not thicker, than the chips and similarly rigid. Such processing using thick printed circuit boards are generally incompatible with chips that are thinned or have stretchable interconnects.

SUMMARY

Many schemes have been proposed for embedding chips on PCBs in flexible polymers. Most of these schemes are based on an assumption that the chips are considerably thicker than the layers of the flexible polymer that makes up the PCBs. Such schemes are not compatible for thinner chips.

In view of the foregoing, various examples described herein are directed generally to methods for embedding thin device islands, including IC chips, and/or stretchable interconnects in a flexible polymer. Various examples described herein are also directed generally to apparatus and systems based on thin device islands, including IC chips, and/or stretchable interconnects embedded in flexible polymer.

According to the principles disclosed herein, an apparatus can include a substrate comprising a standoff well region. The substrate can include a layer of a first conductive material disposed on a layer of a flexible polymer, and a patterned portion of the first conductive material comprises a standoff bordering a portion of exposed flexible polymer, thereby forming the standoff well region. The apparatus can also include a thin chip disposed within the standoff well region on a portion of the exposed flexible polymer proximate to the standoff. The height of the standoff can be comparable to a height of the thin chip.

In an example, the apparatus can include an adhesive material disposed within the standoff well region at a portion of the exposed flexible polymer proximate to the standoff. The thin chip can be disposed on the adhesive material proximate to the standoff. The adhesive material can have a thickness of about 8 μm, about 10 μm, about 12 about 15 μm, about 20 μm, about 25 μm, or about 30 μm. In some examples, the adhesive material comprises a conductive adhesive or a non-conductive adhesive.

In an example, the patterned portion of the first conductive material can be formed using laser ablation or etching. The flexible polymer can be a polyimide or a liquid crystal polymer.

In an example, the first conductive material includes copper, gold, aluminum, or some combination thereof. The substrate can be a copper-clad polyimide.

In certain examples, the layer of flexible polymer can have a thickness of about 8 μm, about 10 μm, about 15 μm, about 25 μm, about 35 μm, about 50 μm, about 60 μm, about 75 μm, or about 85 μm, and the layer of first conductive material can have a thickness of about 2 μm, about 5 μm, about 8 μm, about 12 μm, about 15 μm, about 25 μm, about 35 μm, about 50 μm, about 60 μm, or about 70 μm. In an example, the thin chip can have a thickness of about 2 μm, about 5 μm, about 8 μm, about 12 μm, about 15 μm, about 25 μm, about 35 μm, about 50 μm, about 60 μm, or about 70 μm.

In an example, the thin chip can be a thinned chip. The thinned chip can be formed from a chip that can be thinned using an etching process or a grinding process. In an example, the thin chip can be disposed within the standoff well region such that the height of the standoff can be greater than or about equal to the height of the thin chip. In another example, the thin chip can be disposed within the standoff well region such that the height of the standoff can be less than the height of the thin chip.

In an example, the thin chip can have a layer of first conductive material can have a thickness of about 2 about 5 about 8 μm, about 12 μm, about 15 μm, about 25 μm, about 35 μm, about 50 about 60 μm, or about 70 μm.

In one example, the apparatus can also include a polymer sheet disposed over the substrate. At least one via can be formed through the polymer sheet. The apparatus can also include a second conductive material disposed on a portion of the polymer sheet proximate to the at least one via, such that the second conductive material forms an electrical communication with an electrical contact of the thin chip.

In an example, the second conductive material can include titanium, tungsten, gold, nickel, chromium, or some combination thereof.

In an example, the standoff surrounds a portion of the thin chip. In another example, the standoff can completely surrounds the thin chip. In one example, a dielectric material can be disposed between the standoff and a portion of the thin chip.

In an example, at least one additional layer can be disposed on the first conductive material or on the flexible polymer, wherein the at least one additional layer positions the thin chip at a neutral mechanical plane of the apparatus.

According to the principles disclosed herein, a method for embedding thin chips can include providing a substrate comprising a standoff well region, wherein the substrate includes a layer of a first conductive material disposed on a layer of a flexible polymer. The substrate can also include at least a portion of the first conductive material can be patterned to form a standoff bordering a portion of exposed flexible polymer, thereby forming the standoff well region. The method can also include disposing a thin chip on a portion of the exposed flexible polymer proximate to the standoff such that a height of the standoff can be comparable to a height of the thin chip.

In an example, the method can also include disposing an adhesive material on a portion of the exposed flexible polymer proximate to the standoff, and disposing the thin chip on the adhesive material disposed on the portion of the exposed flexible polymer proximate to the standoff.

In some examples, the height of the standoff can be greater than or about equal to a height of a thin chip.

In certain examples, the disposing step can also include disposing the thin chip on a portion of the flexible polymer proximate to the standoff such that the height of the standoff can be greater than or about equal to the height of the thin chip.

In an example, the thin chip can be a thinned chip, and the thinning a chip can be provided by an etching process or a grinding process. The thinned chip can be disposed on a portion of the exposed flexible polymer proximate to the standoff such that a height of the standoff can be comparable to a height of the thinned chip.

In an example, the method can also include disposing a polymer sheet over the substrate and forming at least one via through the polymer sheet. The method can further include disposing a conductive material on a portion of the second polymer sheet proximate to the at least one via, such that the conductive material forms an electrical communication with an electrical contact of the thin chip.

In an example, the method can further include disposing at least one additional layer on the first conductive material or on the flexible polymer, wherein the at least one additional layer positions the thin chip at a neutral mechanical plane of the apparatus.

According to the principles disclosed herein, an apparatus can include a substrate with a polymer well region. The substrate can include a layer of a flexible polymer disposed on a layer of a first conductive material. The substrate can also include a cavity in at least a portion of the flexible polymer to form at least one polymer wall bordering a portion of exposed first conductive material, thereby forming the polymer well region. The apparatus can also include a thin chip disposed within the polymer well region on at least a portion of the exposed first conductive material proximate to the at least one polymer wall.

In an example, the apparatus can also include an adhesive material disposed within the polymer well region on at least a portion of the exposed first conductive material proximate to the at least one polymer wall, wherein the thin chip can be disposed on the adhesive material proximate to the at least one polymer wall.

In an example, the adhesive material can have a thickness of about 8 µm, about 10 µm, about 12 µm, about 15 µm, about 20 µm, about 25 µm, or about 30 µm. The adhesive material can include a conductive adhesive or a non-conductive adhesive.

In an example, the cavity can be formed using laser ablation or etching. The flexible polymer can be a polyimide or a liquid crystal polymer. The first conductive material can include copper, gold, aluminum, or some combination thereof. The substrate can include a copper-clad polyimide.

In an example, the layer of flexible polymer can have a thickness of about 8 µm, about 10 µm, about 15 µm, about 25 µm, about 35 µm, about 50 µm, about 60 µm, about 75 µm, or about 85 µm. The layer of first conductive material can have a thickness of about 2 µm, about 5 µm, about 8 µm, about 12 µm, about 15 µm, about 25 µm, about 35 µm, about 50 µm, about 60 µm, or about 70 µm. The thin chip can have a thickness of about 2 µm, about 5 µm, about 8 µm, about 12 µm, about 15 µm, about 25 µm, about 35 µm, about 50 µm, about 60 µm, or about 70 µm.

In an example, the thin chip can be a thinned chip. The thinned chip can be formed from a chip that can be thinned using an etching process or a grinding process. The thin chip can be disposed within the polymer well region such that the height of the at least one polymer wall can be greater than or about equal to the height of the thin chip. In an example, the thin chip can be disposed within the polymer well region such that the height of the at least one polymer wall can be less than the height of the thin chip.

In an example, the thin chip can have a layer of first conductive material can have a thickness of about 2 µm, about 5 µm, about 8 µm, about 12 µm, about 15 µm, about 25 µm, about 35 µm, about 50 µm, about 60 µm, or about 70 µm.

In an example, the apparatus can also include a polymer sheet disposed over the substrate. The apparatus can further include at least one via formed through the polymer sheet, and a second conductive material disposed on a portion of the polymer sheet proximate to the at least one via, such that the second conductive material forms an electrical communication with an electrical contact of the thin chip.

In an example, the second conductive material can include titanium, tungsten, gold, nickel, chromium, or some combination thereof.

In an example, the at least one polymer wall can surround a portion of the thin chip. The at least one polymer wall can completely surround the thin chip in another example.

In an example, a dielectric material can be disposed between the at least one polymer wall and a portion of the thin chip. The apparatus can further include at least one additional layer disposed on the first conductive material or on the flexible polymer, wherein the at least one additional layer positions the thin chip at a neutral mechanical plane of the apparatus.

In an example, the thin chip can be a thinned chip, and the thin chip can be thinned using an etching process or a grinding process, and disposed within the polymer well region on at least a portion of the exposed first conductive material proximate to the at least one polymer wall such that a height of the least one wall can be comparable to a height of the thinned chip.

According to the principles described herein, a method for embedding thin chips can include providing a substrate comprising a polymer well region, the substrate comprising a layer of a flexible polymer and a layer of a first conductive material, the polymer well region comprising at least one polymer wall formed from a portion of the flexible polymer and a base region formed from at least a portion of the first conductive material, and disposing the thin chip within the polymer well region on a portion of the first conductive material proximate to the at least one polymer wall.

In an example, the method can also include disposing an adhesive material at the portion of the first conductive proximate to the at least one polymer wall, and disposing the thin chip on the adhesive material proximate to the at least one polymer wall.

In an example, the thin chip can be disposed within the polymer well region such that the height of the at least one polymer wall can be greater than or about equal to the height of the thin chip. In another example, the thin chip can be disposed within the polymer well region such that the height of the at least one polymer wall can be less than the height of the thin chip. In yet another example, thin chip can be disposed within the polymer well region such that the first conductive material can be in physical and electrical communication with the thin chip.

In an example, the method can further include disposing a polymer sheet over the substrate, forming at least one via through the polymer sheet, and disposing a second conductive material on a portion of the polymer sheet proximate to the at least one via, such that the second conductive material forms an electrical communication with an electrical contact of the thin chip.

In another example, the method can further include disposing at least one additional layer disposed on the first conductive material or on the flexible polymer, wherein the at least one additional layer positions the thin chip at a neutral mechanical plane of the apparatus.

According to the principled disclosed herein, an apparatus can include a flexible substrate including a well region. The flexible substrate can include a polyimide or a liquid crystal polymer, and the flexible substrate can include a cavity forming a well region in the flexible substrate. The apparatus can also include a thin chip disposed within the well region, wherein the height of at least one polymer wall of the well region can be comparable to a height of the thin chip. The apparatus can further include a polymer adhesive material disposed in the well region in substantial contact with at least a portion of the thin chip.

In an example, the apparatus can also include a polymer sheet disposed over the flexible substrate and at least one via formed through the polymer sheet. The apparatus can also include a conductive material disposed on a portion of the polymer sheet proximate to the at least one via, such that the second conductive material forms an electrical communication with an electrical contact of the thin chip.

In an example, the apparatus can also include at least one via formed through the polymer adhesive material, and a conductive material disposed on a portion of the polymer adhesive material proximate to the at least one via, such that the conductive material forms an electrical communication with an electrical contact of the thin chip.

In an example, an adhesive material can be disposed within the well region, wherein the thin chip can be disposed on the adhesive material.

In another example, the thin chip can be disposed within the well region such that the height of the at least one polymer wall can be greater than or about equal to the height of the thin chip. The thin chip can be disposed within the well region such that the height of the at least one polymer wall can be less than the height of the thin chip. In an example, a dielectric material can be disposed between the at least one polymer wall and a portion of the thin chip.

The following publications, patents, and patent applications are hereby incorporated herein by reference in their entirety:

Kim et al., "Stretchable and Foldable Silicon Integrated Circuits," Science Express, Mar. 27, 2008, 10.1126/science. 1154367;

Ko et al., "A Hemispherical Electronic Eye Camera Based on Compressible Silicon Optoelectronics," Nature, Aug. 7, 2008, vol. 454, pp. 748-753;

Kim et al., "Complementary Metal Oxide Silicon Integrated Circuits Incorporating Monolithically Integrated Stretchable Wavy Interconnects," Applied Physics Letters, Jul. 31, 2008, vol. 93, 044102;

Kim et al., "Materials and Noncoplanar Mesh Designs for Integrated Circuits with Linear Elastic Responses to Extreme Mechanical Deformations," PNAS, Dec. 2, 2008, vol. 105, no. 48, pp. 18675-18680;

Meitl et al., "Transfer Printing by Kinetic Control of Adhesion to an Elastomeric Stamp," Nature Materials, January, 2006, vol. 5, pp. 33-38;

U.S. Patent Application publication no. 2010 0002402-A1, published Jan. 7, 2010, filed Mar. 5, 2009, and entitled "STRETCHABLE AND FOLDABLE ELECTRONIC DEVICES;"

U.S. Patent Application publication no. 2010 0087782-A1, published Apr. 8, 2010, filed Oct. 7, 2009, and entitled "CATHETER BALLOON HAVING STRETCHABLE INTEGRATED CIRCUITRY AND SENSOR ARRAY;"

U.S. Patent Application publication no. 2010 0116526-A1, published May 13, 2010, filed Nov. 12, 2009, and entitled "EXTREMELY STRETCHABLE ELECTRONICS;"

U.S. Patent Application publication no. 2010 0178722-A1, published Jul. 15, 2010, filed Jan. 12, 2010, and entitled "METHODS AND APPLICATIONS OF NON-PLANAR IMAGING ARRAYS;" and U.S. Patent Application publication no. 2010 027119-A1, published Oct. 28, 2010, filed Nov. 24, 2009, and entitled "SYSTEMS, DEVICES, AND METHODS UTILIZING STRETCHABLE ELECTRONICS TO MEASURE TIRE OR ROAD SURFACE CONDITIONS."

Kim, D. H. et al. (2010). Dissolvable films of silk fibroin for ultrathin conformal bio-integrated electronics. *Nature Materials*, 9, 511-517.

Omenetto, F. G. and D. L. Kaplan. (2008). A new route for silk. *Nature Photonics*, 2, 641-643.

Omenetto, F. G., Kaplan, D. L. (2010). New opportunities for an ancient material. *Science*, 329, 528-531.

Halsed, W. S. (1913). Ligature and suture material. *Journal of the American Medical Association*, 60, 1119-1126.

Masuhiro, T., Yoko, G., Masaobu, N., et al. (1994). Structural changes of silk fibroin membranes induced by immersion in methanol aqueous solutions. *Journal of Polymer Science*, 5, 961-968.

Lawrence, B. D., Cronin-Golomb, M., Georgakoudi, I., et al. (2008). Bioactive silk protein biomaterial systems for optical devices. *Biomacromolecules*, 9, 1214-1220.

Demura, M., Asakura, T. (1989). Immobilization of glucose oxidase with Bombyx mori silk fibroin by only stretching treatment and its application to glucose sensor. *Biotechnololgy and Bioengineering*, 33, 598-603.

Wang, X., Zhang, X., Castellot, J. et al. (2008). Controlled release from multilayer silk biomaterial coatings to modulate vascular cell responses. *Biomaterials*, 29, 894-903.

U.S. patent application Ser. No. 12/723,475 entitled "SYSTEMS, METHODS, AND DEVICES FOR SENSING AND TREATMENT HAVING STRETCHABLE INTEGRATED CIRCUITRY," filed Mar. 12, 2010.

U.S. patent application Ser. No. 12/686,076 entitled "Methods and Applications of Non-Planar Imaging Arrays," filed Jan. 12, 2010.

U.S. patent application Ser. No. 12/636,071 entitled "Systems, Methods, and Devices Using Stretchable or Flexible Electronics for Medical Applications," filed Dec. 11, 2009.

U.S. Patent Application publication no 2012-0065937-A1, published Mar. 15, 2012, and entitled "METHODS AND APPARATUS FOR MEASURING TECHNICAL PARAMETERS OF EQUIPMENT, TOOLS AND COMPONENTS VIA CONFORMAL ELECTRONICS."

U.S. patent application Ser. No. 12/616,922 entitled "Extremely Stretchable Electronics," filed Nov. 12, 2009.

U.S. patent application Ser. No. 12/575,008 entitled "Catheter Balloon Having Stretchable Integrated Circuitry and Sensor Array," filed on Oct. 7, 2009.

U.S. patent application Ser. No. 13/336,518 entitled "Systems, Methods, and Devices Having Stretchable Integrated Circuitry for Sensing and Delivering Therapy," filed Dec. 23, 2011.

It should be appreciated that all combinations of the foregoing concepts and additional concepts described in greater detail below (provided such concepts are not mutually inconsistent) are contemplated as being part of the inventive subject matter disclosed herein. It also should be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the figures, described herein, are for illustration purposes only, and that the drawings are not intended to limit the scope of the disclosed teachings in any way. In some instances, various aspects or features may be shown exaggerated or enlarged to facilitate an understanding of the inventive concepts disclosed herein (the drawings are not necessarily to scale, emphasis instead being placed upon illustrating the principles of the teachings). In the drawings, like reference characters generally refer to like features, functionally similar and/or structurally similar elements throughout the various figures.

DETAILED DESCRIPTION

Figure 1:
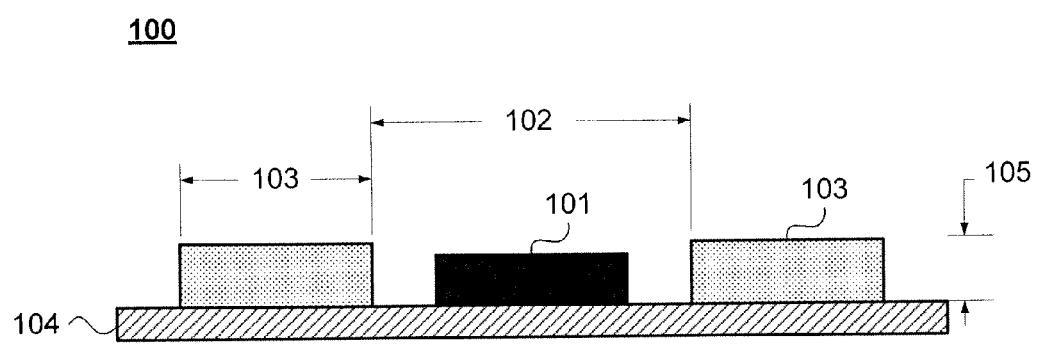
FIG. 1 shows a cross sectional view of an example apparatus that includes a thin chip disposed in a well region, according to the principles described herein.
Figure 2:
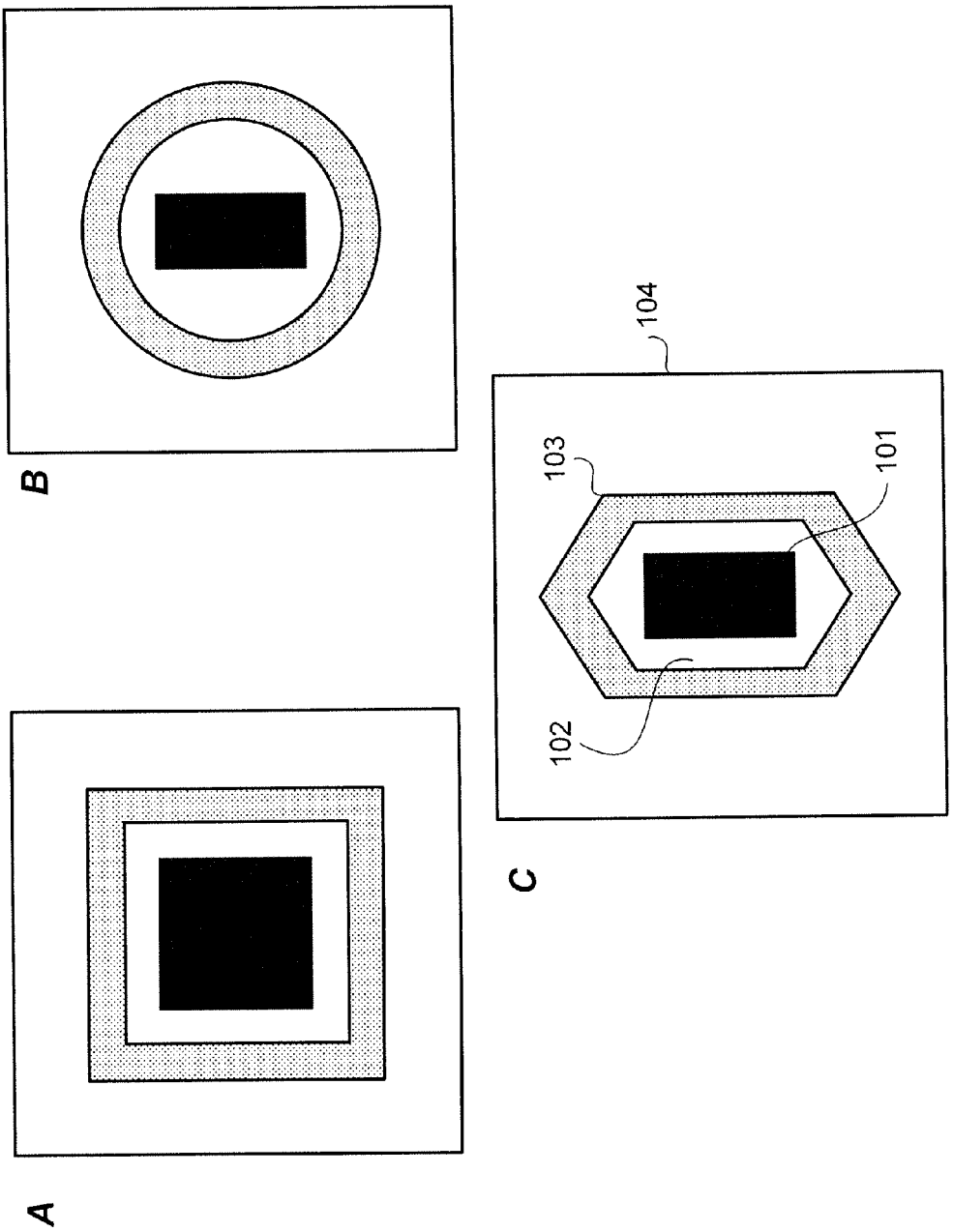
FIGS. 2A-2E show example configurations of well regions, according to the principles described herein.
Figure 2:
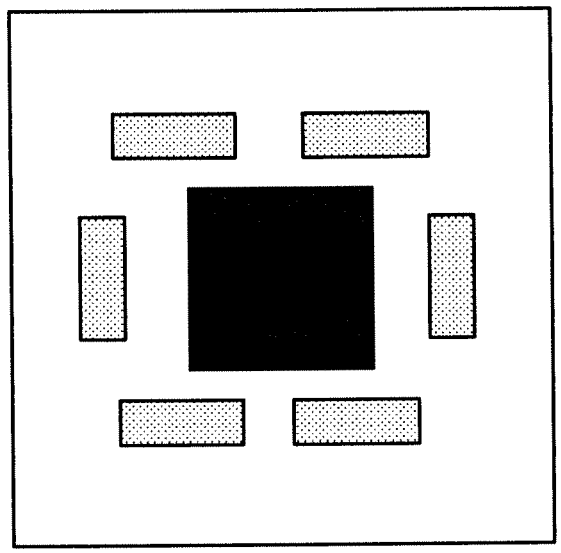
Figure 2:
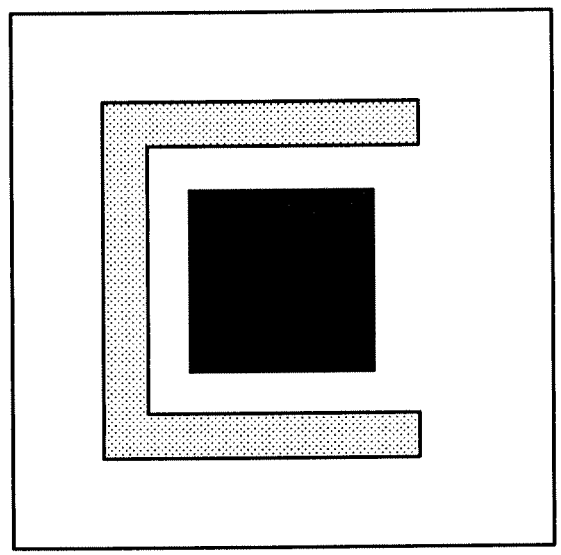

Following below are more detailed descriptions of various concepts related to, and embodiments of, an apparatus and systems for embedding thinned chips in a flexible polymer. It should be appreciated that various concepts introduced above and described in greater detail below may be implemented in any of numerous ways, as the disclosed concepts are not limited to any particular manner of implementation. Examples of specific implementations and applications are provided primarily for illustrative purposes.

As used herein, the term "includes" means includes but is not limited to, the term "including" means including but not limited to. The term "based on" means based at least in part on. As used herein, the term "disposed on" or "disposed above" is defined to encompass "at least partially embedded in."

With respect to substrates or other surfaces described herein in connection with various examples of the principles herein, any references to "top" surface and "bottom" surface are used primarily to indicate relative position, alignment and/or orientation of various elements/components with respect to the substrate and each other, and these terms do not necessarily indicate any particular frame of reference (e.g., a gravitational frame of reference). Thus, reference to a "bottom" of a substrate or a layer does not necessarily require that the indicated surface or layer be facing a ground surface. Similarly, terms such as "over," "under," "above," "beneath" and the like do not necessarily indicate any particular frame of reference, such as a gravitational frame of reference, but rather are used primarily to indicate relative position, alignment and/or orientation of various elements/components with respect to the substrate (or other surface) and each other. The terms "disposed on" "disposed in" and "disposed over" encompass the meaning of "embedded in," including "partially embedded in." In addition, reference to feature A being "disposed on," "disposed between," or "disposed over" feature B encompasses examples where feature A is in contact with feature B, as well as examples where other layers and/or other components are positioned between feature A and feature B.

A system, apparatus and method described herein provides for embedding chips in well regions. The well region can be generated as a standoff well region or a polymer well region, as described herein.

Herein, a "thin chip" refers to chips or other device islands that are formed to have thicknesses of about 5 microns, about 8 microns, about 10 microns or more, or that have been thinned to thicknesses of about 5 microns, about 8 microns, about 10 microns or more. In various examples, the chips (or other device islands) can be fabricated as thin as (or be thinned to) about 5 microns, about 8 microns, about 15 microns, about 20 microns, about 25 microns, 30 microns, 37.5 microns, 42 microns, 50 microns or more.

An example standoff well region according to the principles described herein can be formed in a substrate that includes a layer of a conductive material disposed on a layer of a flexible polymer. Portion of the conductive material can be patterned to create standoffs bordering a portion of exposed flexible polymer, forming the standoff well region. According to the principles described herein, a thin chip can be disposed within the standoff well region on a portion of the exposed flexible polymer proximate to the standoff. Based on the thickness of the thin chips herein, the height of the standoff is comparable to the height of the thin chip.

In a non-limiting example, an adhesive can be disposed on the exposed portion of the flexible polymer prior to the thin chip being disposed in the standoff well region. The adhesive can be a non-conductive (dielectric) adhesive that is configured to withstand the temperatures of further processing.

In various examples, further processing can be performed on the apparatus including the thin chip disposed in the standoff well region. For example, an additional adhesive can be disposed over the thin chip to fill the void between the thin chip and the standoff of the standoff well region. As another example, at least one additional sheet of a flexible polymer can be disposed on the apparatus or vias can be generated to establish an electrical communication with the thin chip, as described in greater detail below.

The principles described herein can be applied to rigid or flexible printed circuit boards. The printed circuit boards are referred to herein as flex and/or PCB. As a non-limiting example, a PCB board or flex sheet that includes a metal clad polymer sheet can be patterned, including being etched, to generate at least one standoff well region in the metal layer that extends down to the polymer. A thin chip is disposed in the standoff well region on the exposed portions of the polymer sheet of the flex board. An adhesive can be placed above the nestled chip and a second flex sheet is placed above the polymer. The sandwiched structure can be subjected to further processing to cause the adhesive to flow around at least a portion of the chip. At least one via can be formed through the top flex board down to the chip, and filled with a conductive material, to provide electrical communication with the bond pads of the thin chip.

An example polymer well region according to the principles described herein can be formed in a layer of flexible polymer disposed on a layer of a conductive material. A cavity can be formed in at least a portion of the flexible polymer to form the at least one polymer wall bordering a portion of the exposed first conductive material to form the polymer well region. A thin chip can be disposed in the polymer well region on at least a portion of the exposed first conductive material proximate to the at least one polymer wall.

In various examples, based on the thickness of the flexible polymer of the substrate or the depth from the surface to which the cavity extends into the flexible polymer, the height of the polymer wall may be comparable to the height of the thin chip. In other examples, the thin chip can be mounted in the polymer well region such that the level of the top surface of the thin chip is comparable to the top surface of the thin chip.

In a non-limiting example, an adhesive can be disposed on the exposed portion of the conductive material prior to the thin chip being disposed in the polymer well region. The adhesive can be a conductive adhesive or a non-conductive (dielectric) adhesive that is configured to withstand the temperatures of further processing. The conductive adhesive can be used to establish electrical communication between the conductive material of the substrate and conductive contact pads on the bottom surface of the thin chip.

In various example, further processing can be performed on the apparatus including the thin chip disposed in the polymer well region. For example, an additional adhesive can be disposed over the thin chip to fill the void between the thin chip and the polymer wall of the polymer well region.

In another example, at least one additional sheet of a flexible polymer can be disposed on the apparatus including the thin chip disposed in the polymer well region. Vias can be generated to establish an electrical communication with the thin chip, as described in greater detail below. In this example, the additional sheet of a flexible polymer can include a layer of a conductive material, and can be disposed on the apparatus such that the side that includes the conductive material layer is directed away from the thin chip. In this example, the conductive layer of the substrate and the conductive layer of the additional sheet would be located on the outside of the "sandwich" with the thin chip embedded within the sandwich. Vias can be generated through the conductive material layers and the flexible polymer layers as described herein to facilitate the electrical communication to the thin chip.

In an example system, apparatus and method, an embedded device formed according to the principles herein can be encapsulated using an encapsulant, such as but not limited to a polymer, to form an encapsulated device. The encapsulated device can be placed on the skin to perform a measurement or other diagnostic or therapeutic procedure. In an example, the embedded device and the encapsulated device are is configured to withstand deformation in more than one direction (for example, in x, y and/or z-directions), torsion, compression, expansion, or other change in conformation.

In an example use, the encapsulated structure can be placed on a surface, such as but not limited to skin or other tissue. In an example use, the encapsulated structure can be configured such that it conforms to a contour of the surface.

In various examples, the flexible polymer and/or the encapsulant can be formed from the same polymer or polymeric material or different polymers or polymeric materials. Non-limiting examples of applicable polymers or polymeric materials include, but are not limited to, a polyimide, a polyethylene terephthalate (PET), or a polyurethane. Other non-limiting examples of applicable polymers or polymeric materials include plastics, elastomers, thermoplastic elastomers, elastoplastics, thermostats, thermoplastics, acrylates, acetal polymers, biodegradable polymers, cellulosic polymers, fluoropolymers, nylons, polyacrylonitrile polymers, polyamide-imide polymers, polyarylates, polybenzimidazole, polybutylene, polycarbonate, polyesters, polyetherimide, polyethylene, polyethylene copolymers and modified polyethylenes, polyketones, poly(methyl methacrylate, polymethylpentene, polyphenylene oxides and polyphenylene sulfides, polyphthalamide, polypropylene, polyurethanes, styrenic resins, sulphone based resins, vinyl-based resins, or any combinations of these materials. In an example, a polymer or polymeric material herein can be a DYMAX® polymer (Dymax Corporation, Torrington, Conn.). or other UV curable polymer.

In an example, a method of embedding chips inside rigid or flexible printed circuit boards (flex, PCB) is provided. The method can be used to embed chips and/or other components, including but not limited to light emitting diodes (LEDs) or interconnects, inside polymers or polymeric materials. The embedding process provides for protection of the embedded device against the environment and for connecting them to each other to form larger electronic circuits, including integrated electronic circuits.

The conductive material of any of the examples described herein can be but is not limited to a metal, a metal alloy, or other conductive material. In an example, the metal or metal alloy of the coating may include but is not limited to aluminum or a transition metal (including copper, silver, gold, platinum, zinc, nickel, titanium, chromium, or palladium, or any combination thereof) and any applicable metal alloy, including alloys with carbon. In other non-limiting example, suitable conductive materials may include a semiconductor-based conductive material, including a silicon-based conductive material, indium tin oxide or other transparent conductive oxide, or Group III-IV conductor (including GaAs).

In any example herein, the layer of flexible polymer can have a thickness of about 8 µm, about 10 µm, about 15 µm, about 25 µm, about 35 µm, about 50 µm, about 60 µm, about 75 µm, or about 85 µm.

In any example herein, the layer of conductive material can have a thickness of about 2 µm, about 5 µm, about 8 µm, about 12 µm, about 15 µm, about 25 µm, about 35 µm, about 50 µm, about 60 µm, or about 70 µm.

In any example herein, the thin chip can have a thickness of about 2 µm, about 5 µm, about 8 µm, about 12 µm, about 15 µm, about 25 µm, about 35 µm, about 50 µm, about 60 µm, or about 70 µm In any example herein, the adhesive material can have a thickness of about 8 µm, about 10 µm, about 12 µm, about 15 µm, about 20 µm, about 25 µm, or about 30 µm.

FIG. 1 is a cross sectional view of an example apparatus 100 that is formed from a thin chip 101 embedded in a well region 102. In this and any other example herein, the thin chip 101 can be a thinned chip. The well region 102 is formed from standoffs 103 bordering exposed portions of a flexible polymer 104. The standoff 103 forms a wall of the well region 102, thereby providing a standoff well region. In this example, the thin chip 101 is disposed on the exposed portions of the flexible polymer 104 proximate to a standoff 103. The standoff 103 can have a height 105 that is comparable to the height of the thin chip 101.

In the example systems, apparatus and methods described herein, the thin chip 101 can be one or more passive electronic components and/or active electronic components. Non-limiting examples of components that can be embedded according to any of the principles described herein include a transistor, an amplifier, a photodetector, a photodiode array, a display, a light-emitting device, a photovoltaic device, a sensor, a LED, a semiconductor laser array, an optical imaging system, a large-area electronic device, a logic gate array, a microprocessor, an integrated circuit, an electronic device, an optical device, an opto-electronic device, a mechanical device, a microelectromechanical device, a nanoelectromechanical device, a microfluidic device, a thermal device, or other device structures.

In an example, embedded devices according to the principles described herein can be formed by embedding a plurality of chips (or other device islands) and/or a plurality of the interconnects in the flexible polymer according to the principles herein. In an example, the embedded device (e.g., thin chip 101) can be formed from an integrated device, or formed from a plurality of chips (or other device islands) interconnected by a plurality of interconnects, that is embedded according to the principles herein.

The thin chip 101 (including an integrated device or device island as described herein) can be made thinner than the thickness of the conductive coating on the flexible polymer layer 104 from which the standoffs 103 of the standoff well region 102 is created. The conductive material coating can include, but is not limited to, metal traces or other metal coatings. The standoff well region 102 can be formed in the conductive coating through, e.g., patterning the conductive material coating on a flexible polymer and etching through to the surface of the flexible polymer 104. The etch process might include to the removal of some surface portion of the flexible polymer 104 as well. In another examples, the patterning may be performed with laser ablation or similar patterning process. After the conductive material coating on the polymer layer has been patterned and the standoff well region formed, the chip (including any device island) can be disposed and fixed between walls of the conductive coating "well," creating features above the polymer that are roughly the same height as the walls of the standoff well region. In other examples, the height of the standoff 105 can be greater than or less than the height of the thin chip 101.

In various examples, the standoff well 102 can be formed such that the positioned chip or other device island is shorter than or approximately equal to the well height 104. In other examples, the well 102 can be formed such that the positioned the thin chip 101 (including a device island and/or an interconnect) is taller than the height of the walls of the well. The standoffs 103 of the standoff well region 103 can be about 80%, about 90%, about, 100%, about 110%, about 120%, about 140%, or about 150% of the thickness of the thin chip 101 (including a device island and/or interconnect). In other examples, the standoffs 103 of the standoff well region 103 can be about twice the thickness of the thin chip 101 or other device island and/or interconnect.

FIGS. 2A-2E show non-limiting examples of different conformations of the standoff well region. As illustrated, the standoff well region 102 (including the standoffs 103) can have a square shape, a rectangular shape, a rounded or other donut shape, or any other polygonal shape, such that a chip or other device island and/or interconnect can be disposed therein.

FIG. 2D shows a non-limiting example standoff well region (including the standoffs) that is fabricated to not completely surround the thin chip (including a device island and/or the interconnect). In this example, the standoff well region 102 borders three sides of the thin chip 101. In the non-limiting example of FIG. 2E, the standoff well region (including the standoffs) is fabricated to border portions of the sides of the thin chip 101 (including a device island and/or the interconnect, with some gaps in portions of the standoffs of the standoff well regions.

Figure 3:
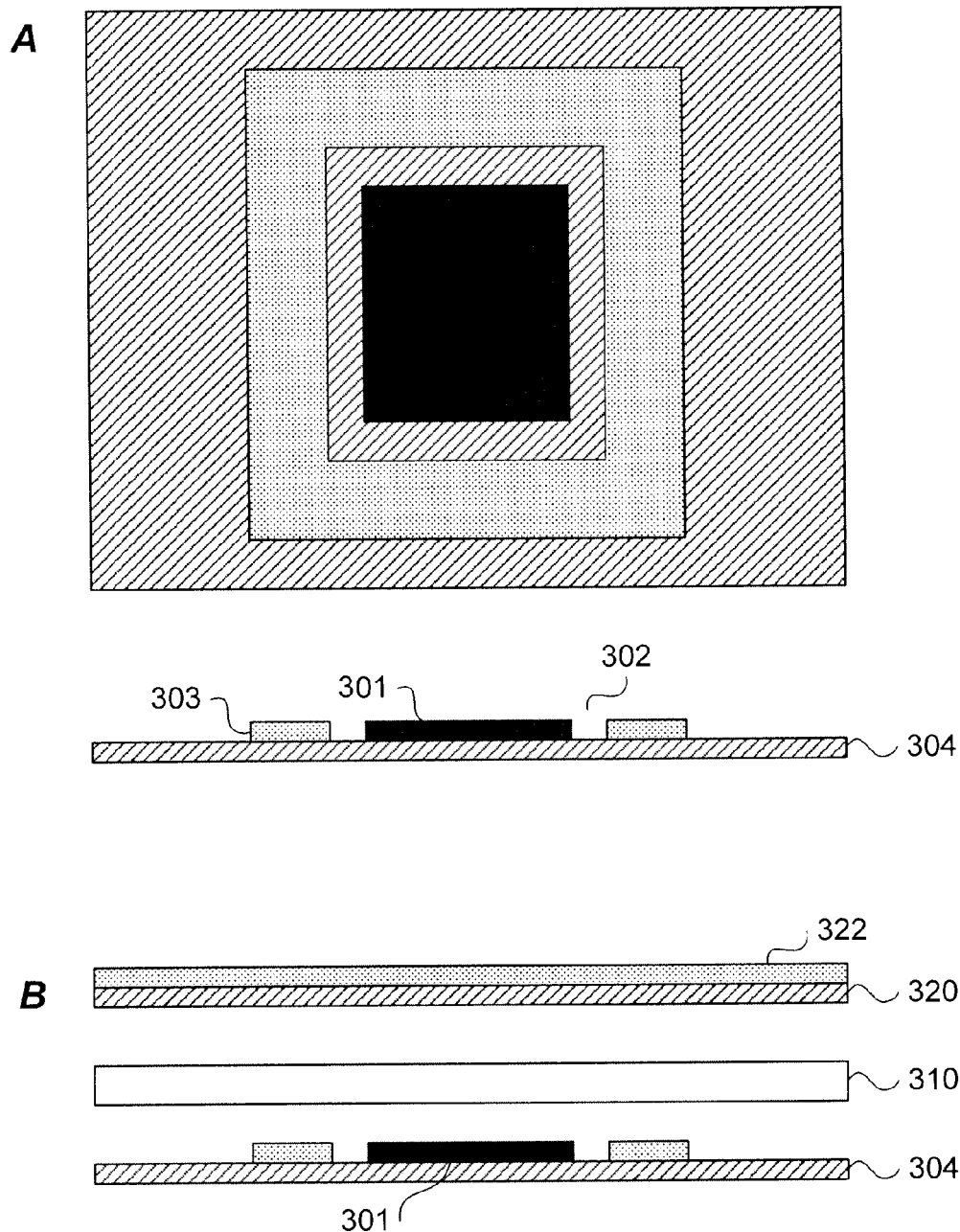
FIGS. 3A-3E illustrate an example manufacturing process for embedding a thin chip in standoff well region formed in an conductive layer, according to the principles described herein.]
Figure 3:
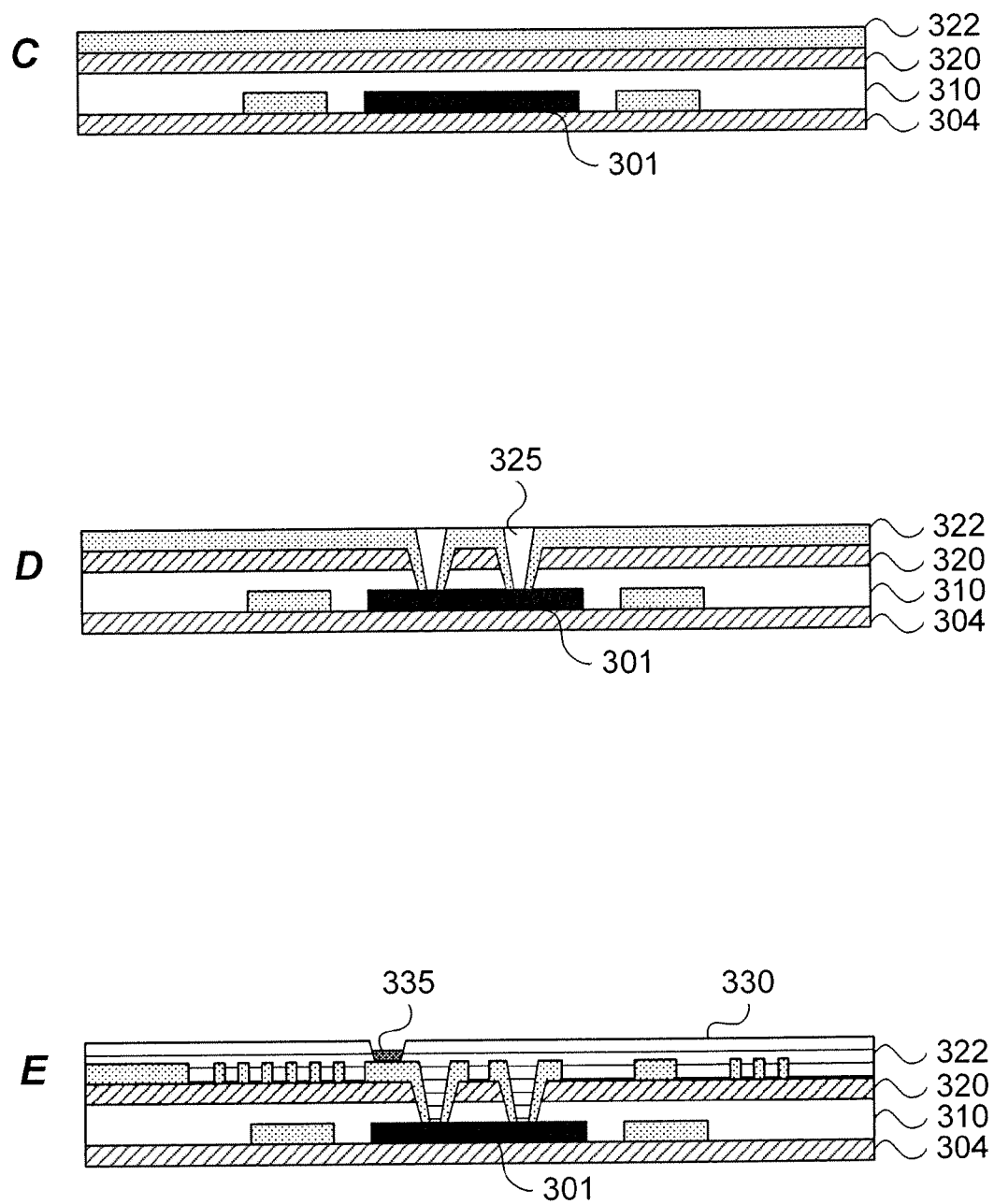

In some examples, and as described further in connection with FIG. 3, an adhesive can be caused to flow around the thin chip 101 (including any other device island and/or interconnect). For example, the adhesive can be caused to flow using a heat-treatment process. In an example, the heat-treatment process can be carried out at temperatures that vary from about 60° C. to about 250° C. The stacked layers, including the device islands and/or interconnects and any adhesive layer between the flexible polymer sheets, can be positioned between two metal plates and brought up to temperature to cause the adhesive to flow around the device islands and/or interconnects.

In an example, the embedded device is configured such that an embedded serpentine interconnect retains substantial range of motion and stretchability within the plane of the embedded device. In an example, the embedded device is configured such that an embedded serpentine interconnect retains substantial range of motion such that portions of it can rotate out of the plane to provide increased stretchability.

In an example process, metal traces, and accordingly the well wall height 105, can be typically 35 μm ("1 oz. copper"), 17.5 μm ("½ oz. copper"), 9 μm ("¼ oz. copper") or 5 μm. Printed circuit boards specify copper thickness in ounces. This represents the thickness of 1 ounce of copper rolled out to an area of 1 square foot. The thickness of 1 oz. of copper is 1.4 mils or 35.56 microns.

In an example, the thin chips 101 (including any other device islands and/or interconnects) can be thinned to about 25 μm to be more suitable for 1 oz. copper traces (which determines the height of the standoff s). In an example, the thin chips 101 (including any other device islands and/or interconnects) can be thinned to 10 μm to be suitable for ½ oz. copper traces (which determines the well wall or standoff height).

In an example, some margin can be left between the thin chip and the standoff for disposing an adhesion layer, which is either dispensed on the flexible polymer layer 104 prior to placement of the thin chip 101 (including any other device island and/or interconnects)), or which is pre-adhered to the thin chips (including any other device islands and/or interconnects) prior to being disposed in the standoff well region 102.

In an example, an additional layer of conductive material may be added to the metallization on the chip or other device island. Some amount of metallization is generally provided at selected portions of the thin chip 101 (including any other device island and/or interconnects) to facilitate creating an electrical contact to the functional capability of the thin chip (including any other device island and/or interconnects). This metallization can be about 1 μm to about 2 μm thick. In some examples, the metallization is made of aluminum. However, other materials can be used for the metallization, such as any other metal or metal alloy described hereinabove in connection with the conductive material. Laser drilling may be used to create channels through the flexible polymer and the adhesive material to create access to the metallization of the thin chip 101 or other device island within the embedded device structure. It can be difficult to control the laser drilling so that it stops at the metallization and does not remove the metallization or puncture the thin chip 101 or other device island. For example, about 5 μm thickness of copper may be needed to terminate the laser drilling without the risk of removing the metallization or puncture. Other techniques for creating the through channels, including etching, can present similar risks of damage to the thin chip 101 or other device island. The additional layer of conductive material added to the metallization on the thin chip 101 or other device island in this example provides extra thickness that can help to withstand the laser drilling. In an example, the additional layer of conductive material (such as but not limited to added metal or metal stacks) is selected to have properties such as but not limited to adherence to the metallization of the chip or other device island; possible to be added to a thickness of about 2 μm to about 7 μm; and/or the ability to support, and form an electrical communication with, the material that is electroplated into via, such as but not limited to a metal or metal alloy electroplating (including Cu electroplating). The additional layer of conductive material (such as but not limited to the added metal) can be patterned and etched to form the standoffs 103.

The additional layer of conductive material may be added to the metallization on the chip or other device island in a variety of ways. For example, an under-bump metallization (UBM) suitable for copper micro-pillars could be carried out, without following through with the usual bumps that would be added, to generate the additional layer of conductive material on the metallization. The UBM can be carried out based on, e.g., a multilayer chromium-copper system (Cr:Cr—Cu: Cu), titanium-nickel-vanadium system (Ti—Ni—V), titanium-copper system (Ti—Cu), titanium-tungsten-gold system (Ti—W—Au), or a nickel-gold system (Ni—Au). In another example, the additional layer of conductive material may be added using electroplating on to the chip (or other device island) pads, after deposition of one or more suitable seed layers. The electroplating can be caused to deposit only on the regions of the chip (or other device island) where the metallization exists. In another example, conductive material can be added to larger portions of the chip (or other device island) and can be patterned and selectively removed (e.g., by etching) to be present only in the regions of the thin chip 101 (or other device island) with the original metallization to provide the additional layer of conductive material.

In an example, an embedded device formed according to the principles herein can be patterned or sliced to remove a portion of the flexible polymer that does not enclose a portion of the chip (or other device island) and/or the interconnect. For example, the embedded device can be patterned along the outline and/or contour of the device structure that is embedded within the flexible polymer. According to any of these examples, the embedded device can be patterned along the outline and/or contour of a serpentine interconnect of the embedded device.

The example systems, apparatus and methods described herein exploit chips or other device islands that are thinner than the surrounding standoffs or well walls to embed the chips or other device islands between flex board layers. In a non-limiting example, the surrounding standoffs or well walls are formed from metal traces.

In an non-limiting example, the surrounding standoffs or well walls are formed from a process of writing an "ink" of conductive material, rather than from patterning and etching a coating layer. In an non-limiting example, the "ink" of conductive material can be written using an inkjet printer device or other device.

The example systems, apparatus and methods described herein provide for good adhesion of layers, conformability of embedding material around the chip or other device islands, elimination of air pockets, and prevention of ingress of liquids from the outside.

The example systems, apparatus and methods described herein provide for embedding thin chips or other device islands and/or stretchable interconnects to provide entire assemblies that are flexible. In an example, the embedded device formed in the flexible polymer can be cut or otherwise formed into serpentine traces that can cause the entire assembly circuit to become even become stretchable, and not merely just flexible.

The example embedded devices according to the systems, apparatus and methods described herein present little or no possibility that a device component will "pop off" or be otherwise detached, if the embedded structure is bent, or otherwise deformed.

In a non-limiting example, the chip or other device island and/or the interconnect is disposed close to the neutral mechanical plane of the overall embedded device. Through choice of suitable flexible polymer layers above and/or below the chips or other device islands and/or stretchable interconnects, the strain on the functional layer of the embedded device can be minimized. A functional layer herein can include the chips or other device islands and/or stretchable interconnects. In an example, the flexible polymer can be formed of a material having a Young's modulus of about 3 GPa. Non-limiting examples of such flexible polymers include a polyimide, such as but not limited to KAPTON® (available from DuPont, Del.).

In an example, any of the systems or apparatus according to the principles herein, the chips 101 or other device islands and/or stretchable interconnects can be positioned such that the functional layer of the embedded device lies at a neutral mechanical plane (NMP) or neutral mechanical surface (NMS) of the system or apparatus. The NMP or NMS lies at the position through the thickness of the device layers for the system or apparatus where any applied strains are minimized or substantially zero. In an example, the functional layer of a system or apparatus according to the principles described herein includes a plurality of chips or other device islands and/or stretchable interconnects.

The location of the NMP or NMS can be changed relative to the layer structure of the system or apparatus through introduction of materials that aid in strain isolation in various layers of the system or apparatus. In various examples, polymer materials described herein can be introduced to serve as strain isolation materials. For example, the encapsulating material described hereinabove also can be used to position the NMP or NMS, e.g., by varying the encapsulating material type and/or layer thickness. For example, the thickness of encapsulating material disposed over the functional layers described herein may be modified (i.e., decreased or increased) to depress the functional layer relative to the overall system or apparatus thickness, which can vary the position of the NMP or NMS relative to the functional layer. In another example, the type of encapsulating, including any differences in the elastic (Young's) modulus of the encapsulating material.

In another example, at least a partial intermediate layer of a material capable of providing strain isolation can be disposed between the functional layer and the flexible substrate to position the NMP or NMS relative to the functional layer. In an example, the intermediate layer can be formed from any of the polymer materials described herein, aerogel materials or any other material with applicable elastic mechanical properties.

Based on the principles described herein, the NMP or NMS can be positioned proximate to, coincident with or adjacent to a layer of the system or apparatus that includes the strain-sensitive component, such as but not limited to the functional layer. The layer can be considered "strain-sensitive" if it is prone to fractures or its performance can be otherwise impaired in response to a level of applied strain. In an example where the NMP or NMS is proximate to a strain-sensitive component rather than coincident with it, the position of the NMP or NMS may still provide a mechanical benefit to the strain-sensitive component, such as substantially lowering the strain that would otherwise be exerted on the strain-sensitive component in the absence of strain isolation layers. In various examples, the NMS or NMP layer is considered proximate to the strain-sensitive component that provides at least 10%, 20%, 50% or 75% reduction in strain in the strain-sensitive component for a given applied strain, e.g., where the embedded device is deformed.

In various examples, the encapsulating material and/or the intermediate layer material may be disposed at positions relative to the embedded device that are coincident with the strain-sensitive component. For example, portions of the encapsulating material and/or the intermediate layer material may be interspersed with portions of the strain-sensitive component, through the embedding layer, including at positions within the functional layer.

FIGS. 3A-3E show an example method for embedding a thinned chip in a standoff well region created in an conductive layer. FIG. 3A provides a top view and cross-sectional view of a thin chip 301 disposed on a flexible polymer 304 and within a standoff well region 302 defined by standoffs 303. As described above, the process can begin with a substrate formed as a metal coated flexible polymer sheet. The metal-coating can then be pattered to create the standoffs 303. In another example, alignment marks can be formed in the metal layer during the pattering process to create the standoffs. The alignment marks can assist in properly registering the thin chip 101 within the standoff well region 302.

As illustrated in FIG. 3B, additional processing can be performed on the apparatus including the standoffs 303 and the thin chip 301 disposed within the standoff well region 302. For example, as illustrated in FIG. 3B, an adhesive 310 can be disposed over the thin chip. As described above, the adhesive 310 can be caused to flow within the standoff well region and around the thin chip 301 as a result of a temperature treatment. As also illustrated in FIG. 3B, an additional polymer sheet 320 can be disposed over the apparatus including the thin chip 301. As described above, and as in this example, the second flexible polymer 320 can be coupled with a second conductive layer 322. In one examples, the layers 320 and 322 are the same as the respective polymer layer 304 and conductive material layer 303 used in forming the standoff well region 302. In another example, the polymer layer 320 and conductive material layer 303 can be different from polymer layer 304 and conductive material layer 303. For example, the respective layers can comprise different materials and/or have different thicknesses. In an example, the adhesive polymer layer 310 can be DuPont™ PYRALUX® Bond-Ply. In another example, the material of adhesive polymer layer 310 can be selected such that it is non-conductive (a dielectric) and capable of adhering flexible polymer layers.

As illustrated in FIG. 3C, the layered structure of FIG. 3B can be, heat treated and cured such that the adhesive layer 310 is caused to flow around the thin chip 301 and within the standoff well region 302. In some examples, standoffs 303 can be taller than the thin chip 301, and the second polymer layer 320 is not in contact with the thin chip 301 when the curing process is completed.

As illustrated in FIG. 3D, vias can be generated as channels through the top conductive layer 322, the top flexible polymer sheet 320, and the adhesive layer 310 to the thin chip 301. Once the vias have been created, the vias can be electroplated or filled through sputtering to create electrical vias 325 from the top conductive layer 322 to the electrical contact pad of the thin chip 301.

As illustrated in FIG. 3E, the conductive layer 322 can then be patterned. An overlay 330 can be applied to the top conductive layer 322. In some implementations, the overlay 330 is non-conductive. The overlay can be patterned to expose the underlying metal and, as in this example, an additional tarnish-resistant metallization 335 can be added to the exposed metal 322, to protect the exposed metal 322 from reacting with oxygen, water and other components of the environment. Such an example device can be between about 10 microns and about 100 microns in height. In another example, as described above, the embedded device also can be encapsulated to increase the overall thickness of the multilayer embedded device. For example, subsequent encapsulation steps can increase the multilayer embedded device thickness to about 70 microns, about 80 microns, or to about 100 microns. Encapsulation can increase the durability of the multilayer embedded device. Further, the encapsulation can be used to place the functional layer of the multilayer embedded device at the NMS of the structure.

Figure 4:
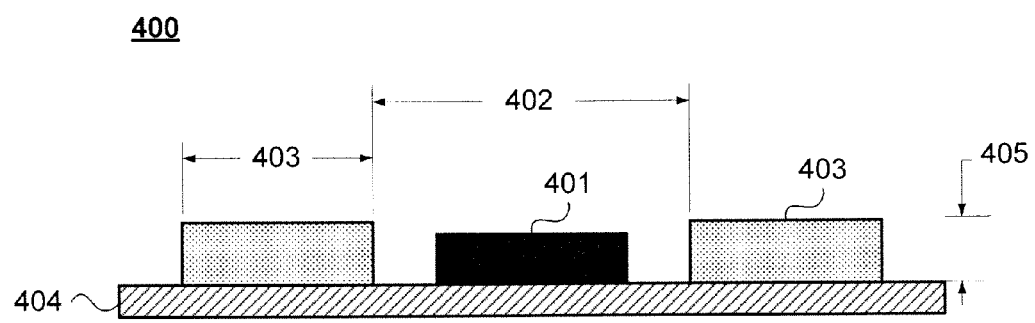
FIG. 4 shows a cross sectional view of an example apparatus that includes a thin chip disposed in a well region, according to the principles described herein.
Figure 5:
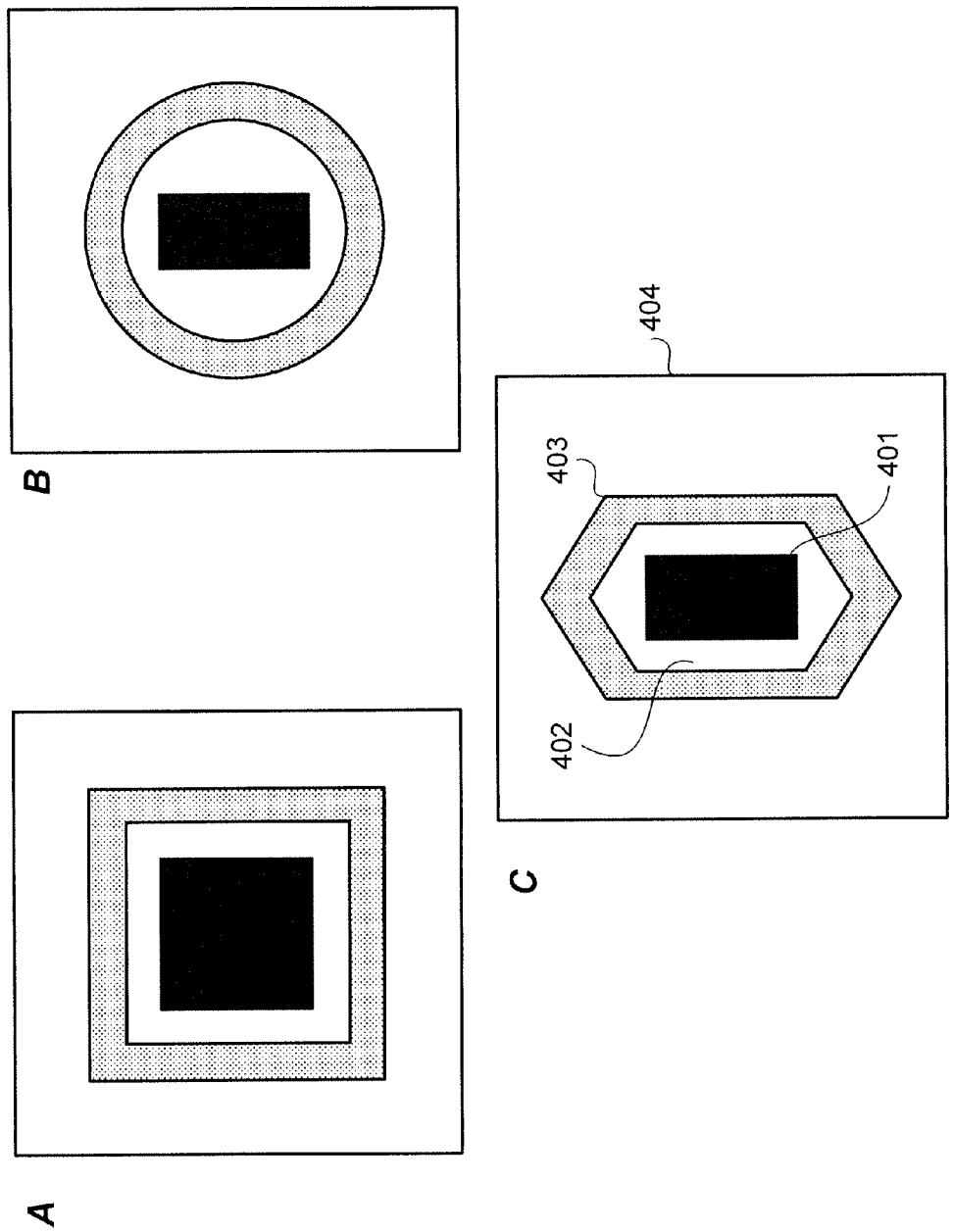
FIGS. 5A-5E show example configurations of well regions, according to the principles described herein.
Figure 5:
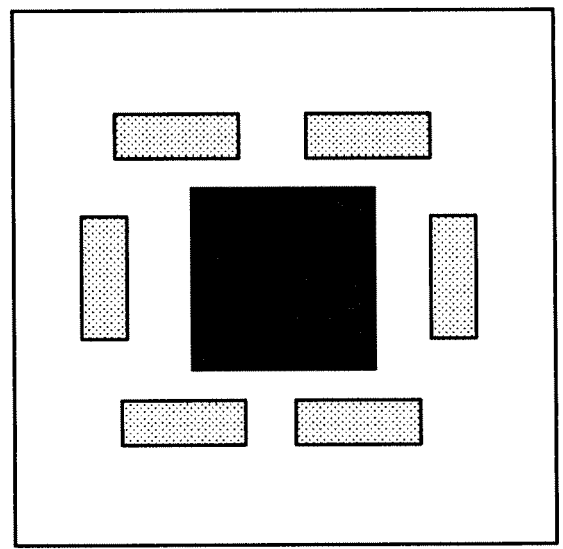
Figure 5:
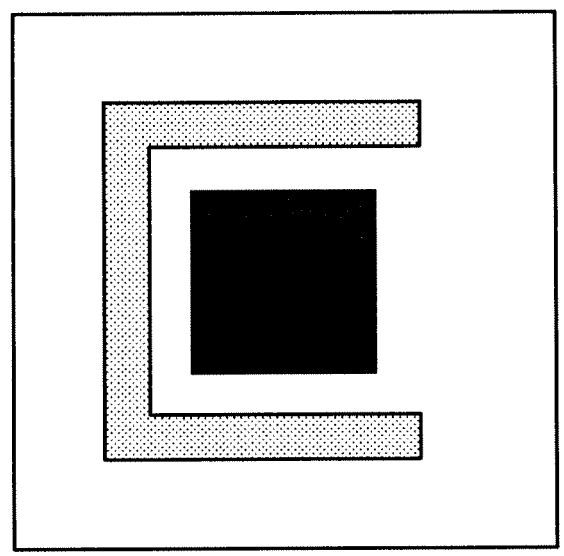
Figure 6:
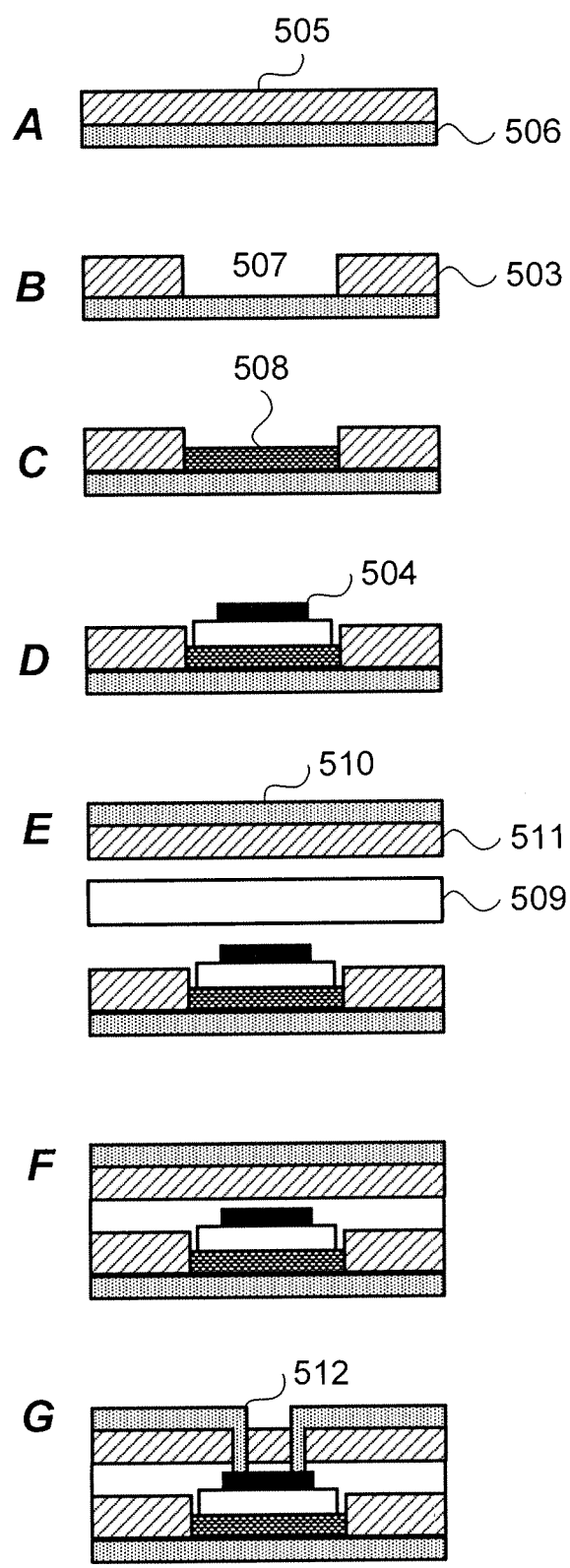
FIGS. 6A-6G illustrate an example manufacturing process based on a thin chip embedded in a polymer well region, according to the principles described herein.

FIG. 4 shows a cross sectional view of another example apparatus 400 that is formed from a thin chip 401 embedded in a polymer well region 402 according to the principles described herein. In this example, as with any other example herein, the thin chip 401 can be a thinned chip. The polymer well region 402 is formed from at least one polymer wall 403 bordering exposed portions of a layer of conductive material 404. The polymer wall 403 forms a wall of the polymer well region 402, thereby providing the polymer well region. In this example, the thin chip 401 is disposed on the exposed portions of the conductive material 404 proximate to a polymer wall 403. The polymer wall 403 can have a height 405 that is comparable to the height of the thin chip 401. In other examples, polymer wall 403 can have a height 405 that is greater than or less than the height of the thin chip 401.

In the example systems, apparatus and methods described herein, the thin chip 401 can be one or more passive electronic components and/or active electronic components. Non-limiting examples of components that can be embedded according to any of the principles described herein include a transistor, an amplifier, a photodetector, a photodiode array, a display, a light-emitting device, a photovoltaic device, a sensor, a LED, a semiconductor laser array, an optical imaging system, a large-area electronic device, a logic gate array, a microprocessor, an integrated circuit, an electronic device, an optical device, an opto-electronic device, a mechanical device, a microelectromechanical device, a nanoelectromechanical device, a microfluidic device, a thermal device, or other device structures.

In an example, embedded devices according to the principles described herein can be formed by embedding a plurality of chips (or other device islands) and/or a plurality of the interconnects in the polymer well region formed in the flexible polymer according to the principles herein. In an example, the embedded device (e.g., thin chip 401) can be formed from an integrated device, or formed from a plurality of chips (or other device islands) interconnected by a plurality of interconnects, that is embedded according to the principles herein.

The thin chip 401 (including an integrated device or device island as described herein) can be made thinner than the thickness of the flexible polymer layer 404 from which the polymer walls 403 of the polymer well region 402 is created. The conductive material coating can include, but is not limited to, metal traces or other metal coatings. The polymer well region 402 can be formed in the flexible polymer through, e.g., etching through to the surface of the conductive material 404, drilling, or laser ablation of the flexible polymer. After the conductive material coating on the polymer layer has been patterned and the polymer well region formed, the chip (including any device island) can be disposed and fixed between walls of the polymer "well," creating features above the polymer that are roughly the same height as the walls of the polymer well region. In other examples, the height 405 of the polymer wall 403 can be greater than or less than the height of the thin chip 401.

In various examples, the polymer well region 402 can be formed such that the positioned chip or other device island is shorter than or approximately equal to the well height 405. In other examples, the polymer well region 402 can be formed such that the positioned thin chip 401 (including a device island and/or an interconnect) is taller than the height of the walls of the well. The polymer walls 403 of the polymer well region 403 can be about 80%, about 90%, about, 100%, about 110%, about 120%, about 140%, or about 150% of the thickness of the thin chip 401 (including a device island and/or interconnect). In other examples, the polymer walls 403 of the polymer well region 403 can be about twice the thickness of the thin chip 401 or other device island and/or interconnect.

Similarly to the example structures in FIGS. 5A-5E, the polymer well region can have different conformations. FIGS. 5A-5E show non-limiting examples of different conformations of the polymer well region. As illustrated, the polymer well region 402 (including the polymer walls 403) can have a square shape, a rectangular shape, a rounded or other donut shape, or any other polygonal shape, such that a chip or other device island and/or interconnect can be disposed therein.

FIG. 5D shows a non-limiting example polymer well region (including the polymer walls) that is fabricated to not completely surround the thin chip (including a device island and/or the interconnect). In this example, the polymer well region 402 borders three sides of the thin chip 401. In the non-limiting example of FIG. 5E, the polymer well region (including the polymer walls) is fabricated to border portions of the sides of the thin chip 401 (including a device island and/or the interconnect), with some gaps in portions of the polymers of the polymer well regions.

In some examples, and similarly to as described in connection with FIG. 3 above, an adhesive can be caused to flow around the thin chip 401 (including any other device island and/or interconnect). For example, the adhesive can be caused to flow using a heat-treatment process. In an example, the heat-treatment process can be carried out at temperatures that vary from about 60° C. to about 250° C. The stacked layers, including the device islands and/or interconnects and adhesive layer between the flexible polymer walls 103 can be positioned between two metal plates and brought up to temperature to cause the adhesive to flow around the device islands and/or interconnects.

FIGS. 6A-6G illustrates an example process to fabricate an apparatus having a thin chip embedded within a polymer well region. In the example of FIGS. 6A-6G, a cavity is generated in the flexible polymer layer down to a portion of the metal layer to create a polymer well region. The thin chip is disposed within the polymer well region on a portion of the exposed conductive material. In this example, an electrical communication can be established between the thin chip 401 and the conductive material of the substrate without use of vias if, for example, a conductive adhesive is disposed between the thin chip and the conductive material. In an example, several of the apparatus according to this example can be stacked to create a multilayered device.

FIG. 6A shows a substrate that includes a flexible polymer layer 505 disposed on a layer of conductive material 506. The polymer layer 505 can include, as non-limiting examples, a polyimide film such as but not limited to a DuPont™KAPTON® film), or a liquid crystal polymer, with a thickness of about 20 µm, about 30 µm, about 35 µm, about 45 µm, about 55 µm, about 66 µm, or about 75 µm. The conductive material layer 506 can be a copper layer, and can be about 5 µm, about 8 µm, about 15 µm, about 20 µm, or about 30 µm thick.

As illustrated in FIG. 5B, a cavity can be formed in the polymer layer 505 to generate a polymer well region. For example, the polymer layer 505 can be etched to expose the conductive material layer 506. The cavity forms a polymer well region 507 including at least one polymer wall 504. In another example, the polymer well region 507 can be generated by a cavity formed from laser ablation, drilling, patterning, and/or die cutting. As illustrated in FIG. 5C, an adhesive 508 can be placed in the polymer well region 507 on a portion of the conductive material 506 prior to placement of the thin chip. In some examples, the adhesive 508 has low stress properties after being cured, so as to avoid cracking the die during the curing step. In this example, the adhesive 508 can be a thermoset adhesive that can withstand the temperatures of later processing without re-flowing. The adhesive 508 can be thermally and/or electrically conductive, or non-conductive (dielectric). For example, an electrically conductive adhesive can be used to establish an electrical connection between the die chip and a portion of the conductive material layer 506. In one example, this electrically conductive adhesive material can be employed to establish a ground plane connection for the completed device between the underside of the thin chip and the conductive material layer 506.

In another example, the polymer layer 505 does not include a base conductive material layer 506. In this example, the cavity generated to create the polymer wall 503 and the polymer well region 507 does not extend completely through the polymer layer 505. Rather, the cavity is created through a portion of the thickness of the polymer layer 505, into which the die 504 is later embedded. This example can be used to provide embedded thin chips based on commercially-available polyimides or liquid crystal polymers, including the polymers of PCB boards, without need for the more expensive processing of a photo-definable spin-on polyimide.

As illustrated in FIG. 6D, the thin chip die 504 is placed into the polymer well region 507. In some implementations, at this step, the adhesive 507 can be cured, securing the thin chip die 504 into the polymer well region 507. As illustrated in FIG. 6E, an adhesive polymer layer 509 can be disposed over the thin chip die in the polymer well region 507, and caused to flow into the area around the thin chip die through thermal processing. In the example of FIG. 6E, the adhesive 509 can be disposed between a polymer sheet 511 that includes a polymer layer 510 and the polymer well region 507. In some examples, the conductive material-clad polymer layer can be a metal-clad polyimide layer. In one examples, the layers 511 and 510 are the same as the respective polymer 505 and conductive material layer 506 used in forming the polymer well region 507. In another example, the polymer layer 511 and conductive material layer 510 can be different from polymer layer 505 and conductive material layer 506. For example, the respective layers can comprise different materials and/or have different thicknesses. In an example, the adhesive polymer layer 509 can be DuPont™ PYRALUX® Bond-Ply. In another example, the material of adhesive polymer layer 509 can be selected such that it is non-conductive (a dielectric) and capable of adhering flexible polymer layers.

As illustrated in FIG. 6F, the adhesive polymer layer 509, polymer layer 511, and conductive material layer 510 can be pressed onto the polymer well region and die layer. In this example, the layers can be coupled using vacuum lamination while being heated to a processing temperature. The vacuum lamination process can cause the adhesive polymer 509 to flow around the thin chip die 504, filling the polymer well region 507.

As illustrated in FIG. 56, the top metal layer 510 and/or the bottom conductive material layer 506 can be patterned and additional circuitry applied. In some examples, such as the example of FIG. 5G, channels can be created through at least one of the polymer layers and conductive material layers. For example, channels can be created by laser ablation or reactive ion etching to form vias 512 from the top surface of the embedded system to the electrical contact pads of the thin chip die. The channels can then be metalized, e.g., by electroplating, evaporation, and/or sputtering, to create electrical communication to circuitry within the thin chips of the embedded device. For example, metalized vias 512 can facilitate electrical communication with the thin chip die's bond-pads or other such electrical contacts. In some implementations, the through channel can be created without previously adding additional conductive material to the die's bond-pads (a process referred to in the industry as bumping the die). As non-limiting examples, metals such as copper, titanium, titanium-tungsten alloy, gold, nickel, and chromium can be used to metalize the vias.

Figure 7:
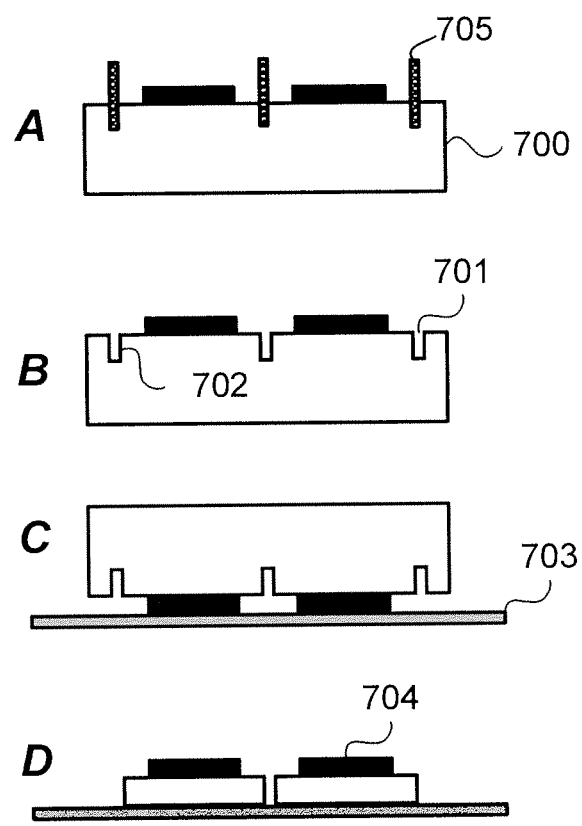
FIG. 7A-7D show an example thinning of a chip to generate a thinned chip, according to the principles described herein.

FIGS. 7A-7D show an example process that can be used to generate a thinned chip. In this example, a chip having a thicker substrate is thinned prior to being embedded according to any of the systems, methods and apparatus described herein. In this example, the chip dies can be thinned using a dicing before grinding (DBG) technique. In some examples, the DBG technique allows the thinning of chips to about 5 µm, about 8 µm, about 10 µm, about 15 µm, about 25 µm, about 35 µm or about 50 µm thickness. The DBG technique also can reduce the risk of wafer bowing that can be seen in other grinding techniques. As illustrated in FIG. 7A, the process can begin with the initial half die cut of the die with a dicing saw 705 or other dicing process. As illustrated in FIG. 7B, the channels 701 in the wafer 700 by the die cut are cut to a depth 702 that is used as a guide to the desired thickness of the thinned die. As illustrated in FIG. 7C, the wafer 700 can be turned over, and the dies are applied to a tape 703. The tape 703 can hold the wafer in place as the backside of the wafer is ground to the desired thickness. When the grinding process reaches the channels 701 used to indicate a stop, the thinned chip dies 704 are released from the wafer 700. In an example, a second layer of tape can be applied now-separate backs of the chips. The thin chips can then be released from the tape 703 by exposing tap 703 to ultraviolet light. The thinned chips 740 can be used in any of the processing described herein in connection with a thin chip, including thin chip 101 and thin chip 401.

Figure 8:
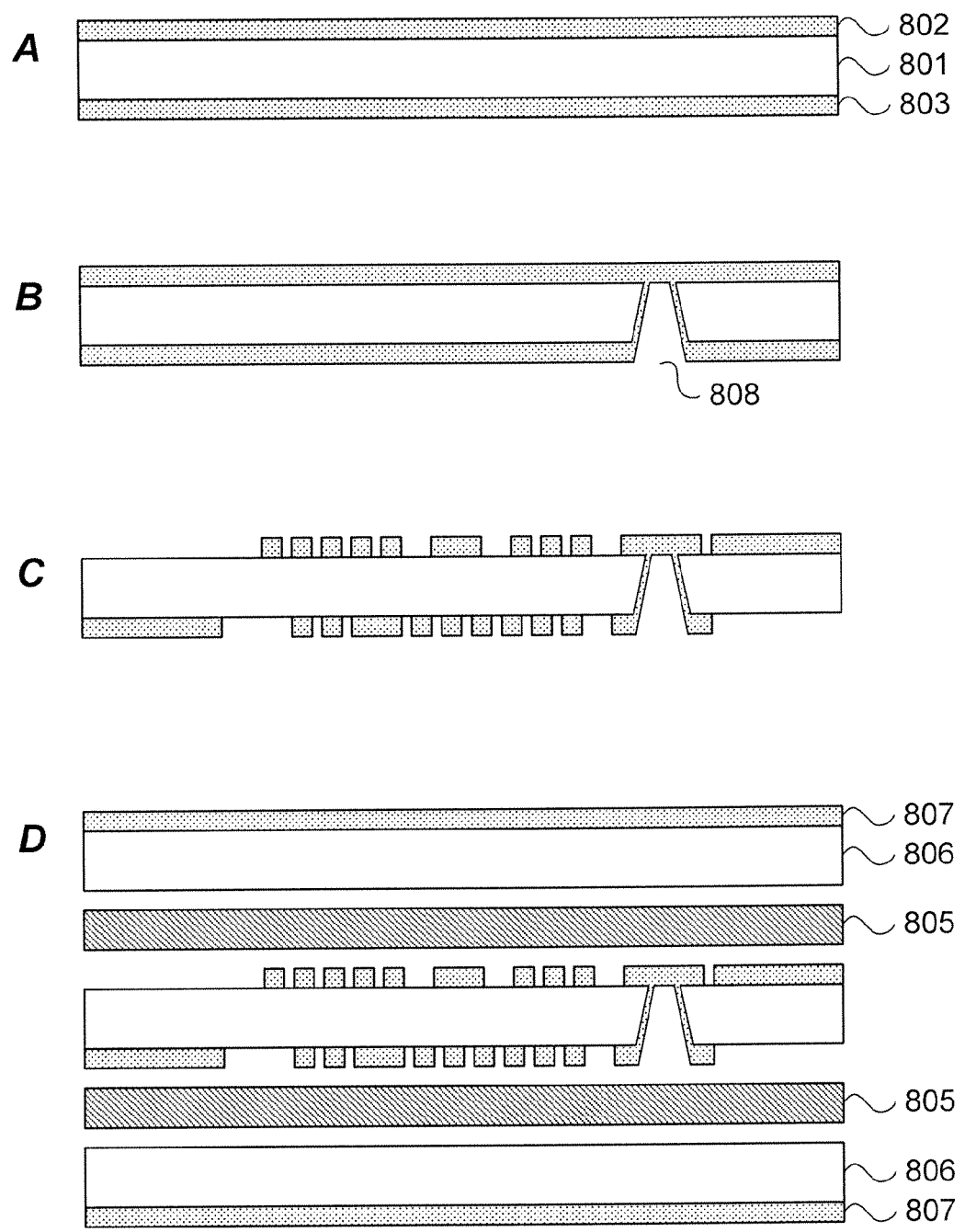
FIGS. 8A-8H illustrate example manufacturing processes that can be performed on an embedded thin chip, according to the principles described herein.
Figure 8:
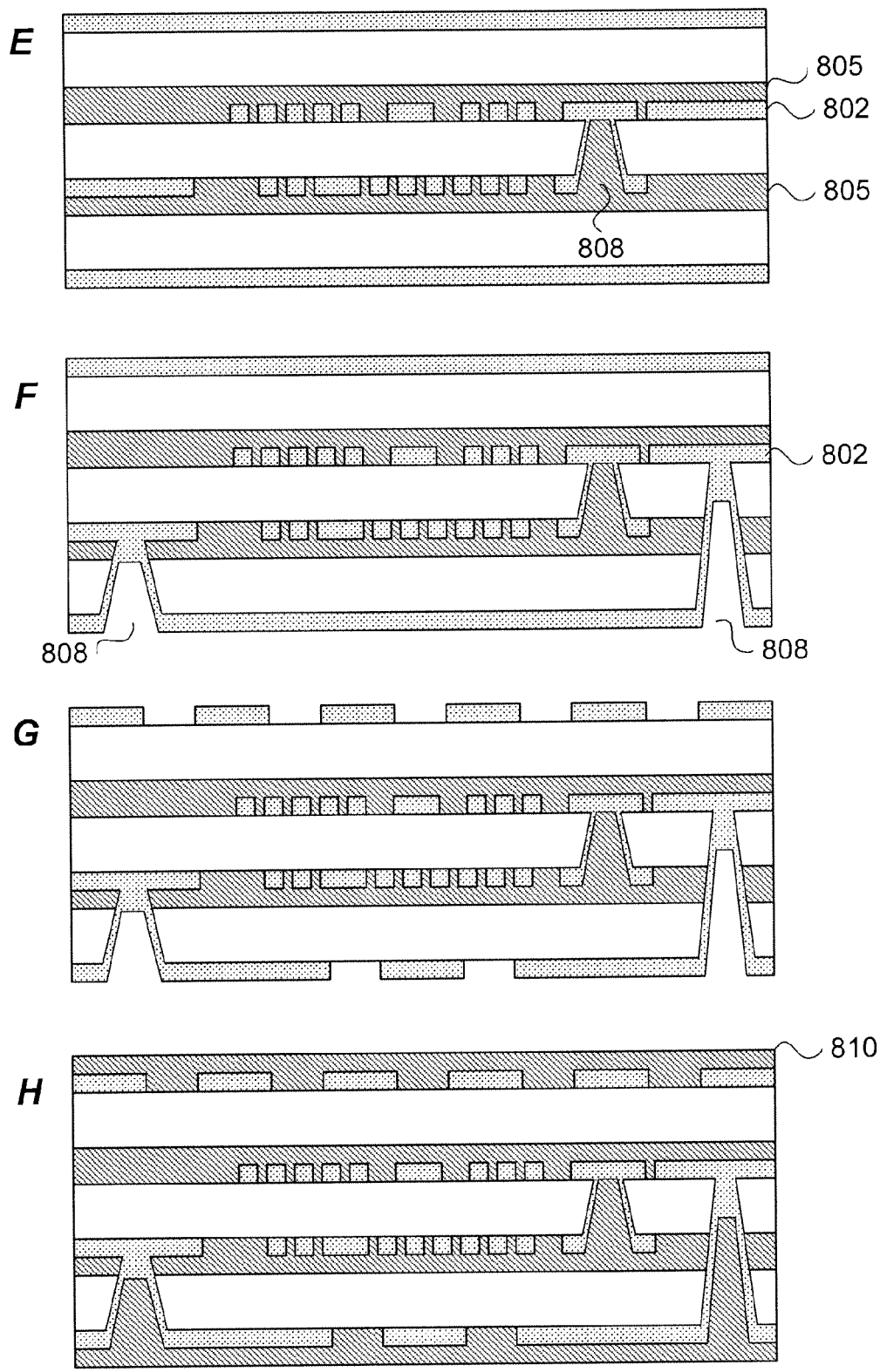

FIGS. 8A-8H show non-limiting examples of manufacturing processes that may be applied to one or more of the methods, apparatus, or systems described herein. For example, the manufacturing processes described in FIGS. 8A-8H can be performed on an embedded thin chip generated according to any of the systems, methods and apparatus described herein, including in FIGS. 1-7D. As illustrated in FIG. 8A, the processing can be applied to a polymer sheet 801 that includes a conductive metal coating on either side. In this example the conductive material layers 802 and 803 are 17.5 µm copper layers on a 75 µm thick KAPTON® substrate.

As illustrated in FIG. 8B, through channels are created from one conductive material layer to the second conductive material layer. The through channels are electroplated to create electrical vias 804. As illustrated in FIG. 8C, one or both of the conductive material layers 802 and 803 can be patterned.

Next, as illustrated in FIG. 8D, an adhesive layer 806 is inserted between the patterned conductive material layers 802 and 803 and additional polymer sheets 806. In this example, each of the polymer sheets 806 are metal-coated to create conductive layers 807. In another example, one or both of the second polymer sheets 806 are not metal-coated.

As illustrated in FIG. 8E, the adhesive layers 805 are subjected to heat and pressure. The heat and pressure cause the adhesive layers 805 to melt and flow into the gaps created by in the vias and the patterned conductive layers 802 and 803. Next, as illustrated in FIG. 8F, additional through channels are created and electroplated to connect the various conductive layers. In this example, the vias one or more layers. For example, via 808 electrically connects the bottom conductive layer 807 to internal conductive layer 802 and via 809 electrically connects bottom conductive layer 807 to internal conducive layer 803.

As illustrated in FIG. 8G, the now external conductive layers 807 can be patterned. In this example, both external conductive layers 807 are patterned, but in another example, one or none of the external layers 807 can be patterned. As illustrated in FIG. 8H, an overlay 810 can be applied to the external conductive layers 807. In another example, the overlay 810 can also be patterned. A corrosion and solder resistant metallization can be electro-deposited on any exposed copper traces.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be examples and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that inventive embodiments may be practiced otherwise than as specifically described. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the invention may be implemented in any of numerous ways. For example, some embodiments may be implemented using hardware, software or a combination thereof. When any aspect of an embodiment is implemented at least in part in software, the software code may be executed on any suitable processor or collection of processors, whether provided in a single device or computer or distributed among multiple devices/computers.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification, unless clearly indicated to the contrary, should be understood to mean "at least one."

The phrase "and/or," as used herein in the specification, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

As used herein in the specification, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc

What is claimed:

1. An apparatus comprising:
A) a substrate comprising a standoff well region, wherein:
the substrate comprises a layer of a first conductive material disposed on a layer of a flexible polymer, wherein the flexible polymer is further stretchable; and
a patterned portion of the first conductive material comprises a standoff bordering a portion of exposed flexible polymer, thereby forming the standoff well region;
B) a thin chip disposed within the standoff well region on a portion of the exposed flexible polymer proximate to the standoff; and
C) an adhesive material disposed within the standoff well region at a portion of the exposed flexible polymer proximate to the standoff, the thin chip being disposed on the adhesive material proximate the standoff, the adhesive material including a conductive adhesive,
wherein a height of the standoff is comparable to a height of the thin chip.

2. The apparatus of claim 1, wherein the adhesive material has a thickness of about 8 μm, about 10 μm, about 12 μm, about 15 μm, about 20 μm, about 25 μm, or about 30 μm.

3. The apparatus of claim 1, wherein the patterned portion of the first conductive material is formed using laser ablation or etching.

4. The apparatus of claim 1, wherein the first conductive material comprises copper, gold, aluminum, or some combination thereof.

5. The apparatus of claim 1, wherein the layer of flexible polymer has a thickness of about 8 μm, about 10 μm, about 15 μm, about 25 μm, about 35 μm, about 50 μm, about 60 μm, about 75 μm, or about 85 μm.

6. The apparatus of claim 1, wherein the layer of first conductive material has a thickness of about 2 μm, about 5 μm, about 8 μm, about 12 μm, about 15 μm, about 25 μm, about 35 μm, about 50 μm, about 60 μm, or about 70 μm.

7. The apparatus of claim 1, wherein the thin chip has a thickness of about 2 μm, about 5 um, about 8 μm, about 12 μm, about 15 μm, about 25 μm, about 35 μm, about 50 μm, about 60 μm, or about 70 μm.

8. The apparatus of claim 1, wherein the thin chip is a thinned chip.

9. The apparatus of claim 8, wherein the thinned chip is formed from a chip that is thinned using an etching process or a grinding process.

10. The apparatus of claim 1, wherein the thin chip is disposed within the standoff well region such that the height of the standoff is greater than or about equal to the height of the thin chip.

11. The apparatus of claim 1, wherein the thin chip is disposed within the standoff well region such that the height of the standoff is less than the height of the thin chip.

12. The apparatus of claim 1, wherein the thin chip includes a layer of first conductive material having a thickness of about 2 μm, about 5 um, about 8 μm, about 12 um, about 15 vim, about 25 um, about 35 pm, about 50 μm, about 60 μm, or about 70 μm.

13. The apparatus of claim 1, further comprising:
a polymer sheet disposed over the substrate;
at least one via formed through the polymer sheet; and
a second conductive material disposed on a portion of the polymer sheet proximate to the at least one via, such that the second conductive material forms an electrical communication with an electrical contact of the thin chip.

14. The apparatus of claim 13, wherein the second conductive material comprises titanium, tungsten, gold, nickel, chromium, or some combination thereof.

15. The apparatus of claim 1, wherein the standoff surrounds a portion of the thin chip.

16. The apparatus of claim 1, wherein the standoff completely surrounds the thin chip.

17. The apparatus of claim 1, wherein a dielectric material is disposed between the standoff and a portion of the thin chip.

18. The apparatus of claim 1, further comprising at least one additional layer disposed on the first conductive material or on the flexible polymer, wherein the at least one additional layer positions the thin chip at a neutral mechanical plane of the apparatus.

19. The apparatus of claim 1, wherein the flexible polymer includes a polyurethane.

20. The apparatus of claim 1, wherein the flexible polymer includes an elastomer or an elastoplastic.

21. The apparatus of claim 20, wherein flexible polymer includes a thermoplastic elastomer.

22. The apparatus of claim 20, wherein the flexible polymer includes a silicone elastomer.

23. The apparatus of claim 1, wherein the standoff includes a plurality of standoffs that define the standoff well region, the standoff configured to border at least three sides of the thin chip.

24. The apparatus of claim 23, wherein the standoff includes at least one gap between the plurality of standoffs that define the standoff well region.

25. The apparatus of claim 1, wherein the standoff includes a plurality of standoffs that define the standoff well region, the standoff being configured to border all sides of the thin chip, the standoff further including at least one gap between the plurality of standoffs that define the standoff well region.

26. A method for embedding thin chips, the method comprising:
A) providing a substrate comprising a standoff well region, wherein:
the substrate comprises a layer of a first conductive material disposed on a layer of a flexible polymer, wherein the flexible polymer is further stretchable; and
at least a portion of the first conductive material is patterned to form a standoff bordering a portion of exposed flexible polymer, thereby forming the standoff well region;
B) disposing a conductive adhesive material within the standoff well region at a portion of the exposed flexible polymer proximate to the standoff; and
C) disposing a thin chip on a portion of the exposed flexible polymer proximate to the standoff such that a height of the standoff is comparable to a height of the thin chip, the thin chip being disposed on the conductive adhesive material proximate to the standoff.

27. The method of claim 26, wherein the height of the standoff is greater than or about equal to a height of a thin chip.

28. The method of claim 26, wherein C) comprises disposing the thin chip on a portion of the flexible polymer proximate to the standoff such that the height of the standoff is greater than or about equal to the height of the thin chip.

29. The method of claim 26, wherein the thin chip is a thinned chip, and wherein C) comprises thinning a chip using an etching process or a grinding process to provide the thinned chip, and disposing the thinned chip on a portion of the exposed flexible polymer proximate to the standoff such that a height of the standoff is comparable to a height of the thinned chip.

30. The method of claim 26, further comprising:
disposing a polymer sheet over the substrate;
forming at least one via through the polymer sheet; and
disposing a conductive material on a portion of the second polymer sheet proximate to the at least one via, such that the conductive material forms an electrical communication with an electrical contact of the thin chip.

31. The method of claim 26, further comprising disposing at least one additional layer on the first conductive material or on the flexible polymer, wherein the at least one additional layer positions the thin chip at a neutral mechanical plane of the apparatus.

32. An apparatus comprising:
A) a substrate comprising a polymer well region, wherein:
the substrate comprises a layer of a flexible polymer disposed on a layer of a first conductive material, wherein the flexible polymer is further stretchable;
a cavity is formed in at least a portion of the flexible polymer to form at least one polymer wall bordering a portion of exposed first conductive material, thereby forming the polymer well region;
B) a thin chip disposed within the polymer well region on at least a portion of the exposed first conductive material proximate to the at least one polymer wall; and
C) an adhesive material disposed within the polymer well region at a portion of the exposed first conductive material proximate to the at least one polymer wall, the adhesive material including a conductive adhesive, the thin chip being disposed on the adhesive material proximate to the at least one polymer wall.

33. The apparatus of claim 32, wherein the adhesive material has a thickness of about 8 μm, about 10 μm, about 12 μm, about 15 μm, about 20 μm, about 25 μm, or about 30 μm.

34. The apparatus of claim 32, wherein the cavity is formed using laser ablation or etching.

35. The apparatus of claim 32, wherein the first conductive material comprises copper, gold, aluminum, or some combination thereof.

36. The apparatus of claim 32, wherein the layer of flexible polymer has a thickness of about 8 μm, about 10 μm, about 15 μm, about 25 μm, about 35 μm, about 50 μm, about 60 μm, about 75 μm, or about 85 μm.

37. The apparatus of claim 32, wherein the layer of first conductive material has a thickness of about 2 μm, about 5 μm, about 8 μm, about 12 μm, about 15 μm, about 25 μm, about 35 μm, about 50 μm, about 60 μm, or about 70 μm.

38. The apparatus of claim 32, wherein the thin chip has a thickness of about 2 μm, about 5 μm, about 8 μm, about 12 μm, about 15 μm, about 25 μm, about 35 μm, about 50 μm, about 60 μm, or about 70 μm.

39. The apparatus of claim 38, wherein the thinned chip is formed from a chip that is thinned using an etching process or a grinding process.

40. The apparatus of claim 32, wherein the thin chip is a thinned chip.

41. The apparatus of claim 32, wherein the thin chip is disposed within the polymer well region such that the height of the at least one polymer wall is greater than or about equal to the height of the thin chip.

42. The apparatus of claim 32, wherein the thin chip is disposed within the polymer well region such that the height of the at least one polymer wall is less than the height of the thin chip.

43. The apparatus of claim 32, wherein the thin chip has a layer of first conductive material has a thickness of about 2 µm, about 5 µm, about 8 µm, about 12 µm, about 15 µm, about 25 µm, about 35 µm, about 50 µm, about 60 µm, or about 70 µm.

44. The apparatus of claim 32, further comprising:
a polymer sheet disposed over the substrate;
at least one via formed through the polymer sheet; and
a second conductive material disposed on a portion of the polymer sheet proximate to the at least one via, such that the second conductive material forms an electrical communication with an electrical contact of the thin chip.

45. The apparatus of claim 44, wherein the second conductive material comprises titanium, tungsten, gold, nickel, chromium, or some combination thereof.

46. The apparatus of claim 32, wherein the at least one polymer wall surrounds a portion of the thin chip.

47. The apparatus of claim 32, wherein the at least one polymer wall completely surrounds the thin chip.

48. The apparatus of claim 32, wherein a dielectric material is disposed between the at least one polymer wall and a portion of the thin chip.

49. The apparatus of claim 32, further comprising at least one additional layer disposed on the first conductive material or on the flexible polymer, wherein the at least one additional layer positions the thin chip at a neutral mechanical plane of the apparatus.

50. The apparatus of claim 32, wherein the thin chip is a thinned chip, and wherein B) comprises thinning a chip using an etching process or a grinding process to provide the thinned chip, and disposing the thinned chip within the polymer well region on at least a portion of the exposed first conductive material proximate to the at least one polymer wall such that a height of the least one wall is comparable to a height of the thinned chip.

51. A method for embedding thin chips, the method comprising:
A) providing a substrate comprising a polymer well region, the substrate comprising a layer of a flexible polymer and a layer of a first conductive material, the flexible polymer further being stretchable, the polymer well region comprising at least one polymer wall formed from a portion of the flexible polymer and a base region formed from at least a portion of the first conductive material;
B) disposing an adhesive material at the portion of the first conductive proximate to the at least one polymer wall, the adhesive material including a conductive adhesive; and
C) disposing the thin chip within the polymer well region on a portion of the first conductive material proximate to the at least one polymer wall, the thin chip being disposed on the adhesive material proximate to the at least one polymer wall.

52. The method of claim 51, wherein the thin chip is disposed within the polymer well region such that the height of the at least one polymer wall is greater than or about equal to the height of the thin chip.

53. The method of claim 51, wherein the thin chip is disposed within the polymer well region such that the height of the at least one polymer wall is less than the height of the thin chip.

54. The method of claim 51, wherein the thin chip is disposed within the polymer well region such that the first conductive material is in physical and electrical communication with the thin chip.

55. The method of claim 51, further comprising:
a polymer sheet disposed over the substrate;
at least one via formed through the polymer sheet; and
a second conductive material disposed on a portion of the polymer sheet proximate to the at least one via, such that the second conductive material forms an electrical communication with an electrical contact of the thin chip.

56. The method of claim 51, further comprising disposing at least one additional layer on the first conductive material or on the flexible polymer, wherein the at least one additional layer positions the thin chip at a neutral mechanical plane of the apparatus.

* * * * *